United States Patent [19]

Saxton et al.

[11] Patent Number: 4,912,657
[45] Date of Patent: Mar. 27, 1990

[54] METHOD AND SYSTEMS FOR GENERATING PARAMETRIC DESIGNS

[75] Inventors: Jay R. Saxton, Bellingham; Andrew J. Sodt, Seattle; Dan J. Suslo, Bellingham, all of Wash.

[73] Assignee: Synthesis, Inc., Bellingham, Wash.

[21] Appl. No.: 135,088

[22] Filed: Dec. 16, 1987

Related U.S. Application Data

[63] Continuation-in-part of Ser. No. 925,278, Oct. 30, 1986.

[51] Int. Cl.⁴ .............................................. G06F 3/14
[52] U.S. Cl. .................................... 364/518; 340/725; 340/726; 340/729; 364/521
[58] Field of Search ....................... 364/518, 521, 512; 340/729; 358/93

[56] References Cited

U.S. PATENT DOCUMENTS

| | | | |
|---|---|---|---|
| 4,275,449 | 6/1981 | Aish | 364/512 |
| 4,475,104 | 10/1984 | Shew | |
| 4,539,585 | 9/1985 | Spackova et al. | 358/93 |
| 4,549,275 | 10/1985 | Zukonick | 364/521 |
| 4,551,810 | 11/1985 | Levine | 364/512 |
| 4,686,580 | 8/1987 | Kato et al. | |

OTHER PUBLICATIONS

Kargas et al, "Interpretation of Engineering Drawings as Solid Models", *Computer-Aided Engineering Journal*, Apr. 1988, pp. 67-78.

*Primary Examiner*—Gary V. Harkcom
*Assistant Examiner*—H. R. Herndon
*Attorney, Agent, or Firm*—Hughes & Multer

[57] ABSTRACT

Systems and processes in which a master drawing is rectified to produce a design in the form of a drawing or instructions for a computer aided manufacturing process. A modular approach is employed. This allows elements to be combined into, or incorporated in, a more complex design. Each product and element is manifested by a design module which has one or more master drawings in which dimensions and text are replaced by variables, and a specsheet which effects the rectification of the master drawing(s). The specsheet can be employed in an editing mode to establish a design or in a run-time mode. In the latter, an end user simply responds to prompts with appropriate information to produce a final design.

22 Claims, 57 Drawing Sheets

| ENTITY | NUMBER OF POINTS | | LOCATION OF REFERENCE POINT(S) WITHIN THE ENTITY |
|---|---|---|---|
| LINEAR DIMENSION | 2 | 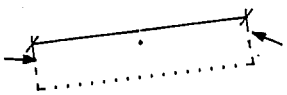 | ENDPOINTS OF THE TWO EXTENSION LINES |
| LINE | 2 |  | THE ENDPOINTS OF THE LINE |
| ARC | 2 |  | THE ENDPOINTS OF THE ARC |
| TRACE | 4 | 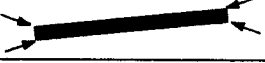 | THE ENDS OF ITS CENTERLINE |
| SOLID | 4 | 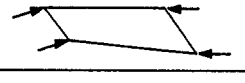 | EACH OF ITS VERTICES |
| RIGHT-ALIGNED TEXT | 1 | RIGHT 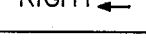 | RIGHT END OF TEXT |
| LEFT-ALIGNED TEXT | 1 | 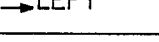 LEFT | LEFT END OF TEXT |
| CENTER-ALIGNED TEXT | 1 | CENTER 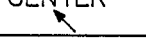 | CENTER OF TEXT |
| ALIGNED TEXT | 2 | 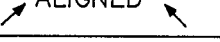 ALIGNED | BOTH ENDS OF TEXT |
| SHAPE | 1 |  (BASE POINT) | INSERTION POINT |
| BLOCK | 1 |  (BASE POINT) | INSERTION POINT |
| CIRCLE | 1 |  | CENTER OF THE CIRCLE |
| POINT | 1 |  | THE POINT ITSELF |

Fig. 6

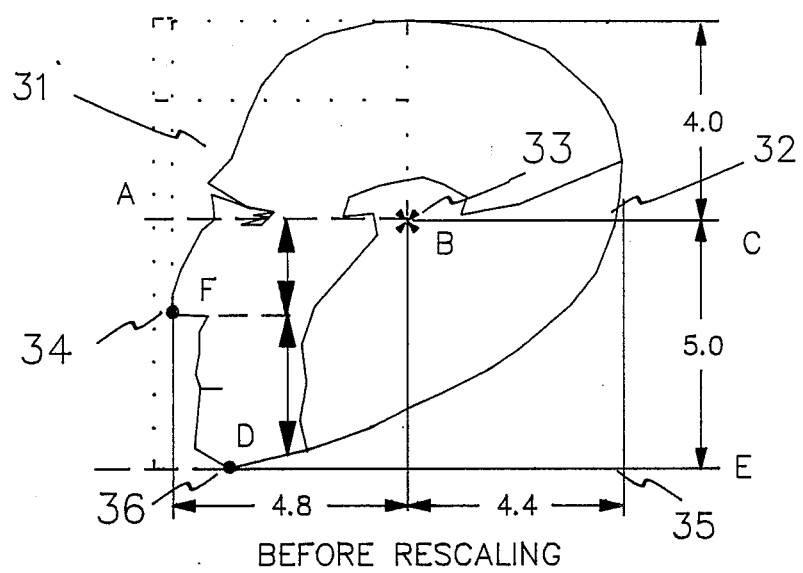
BEFORE RESCALING
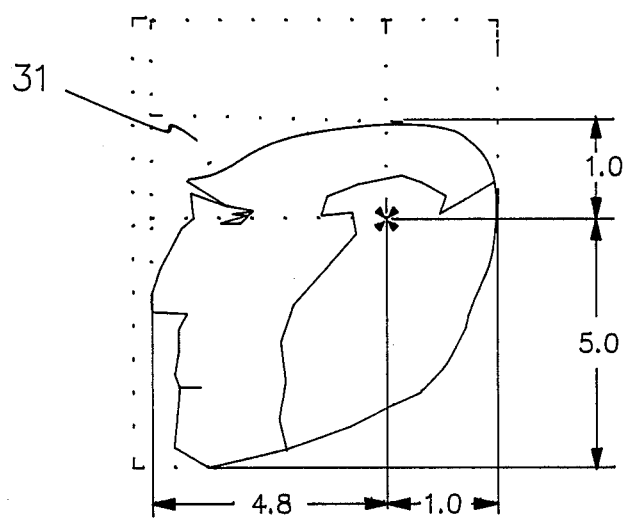
AFTER PROPORTIONAL RESCALING
FIG. 9

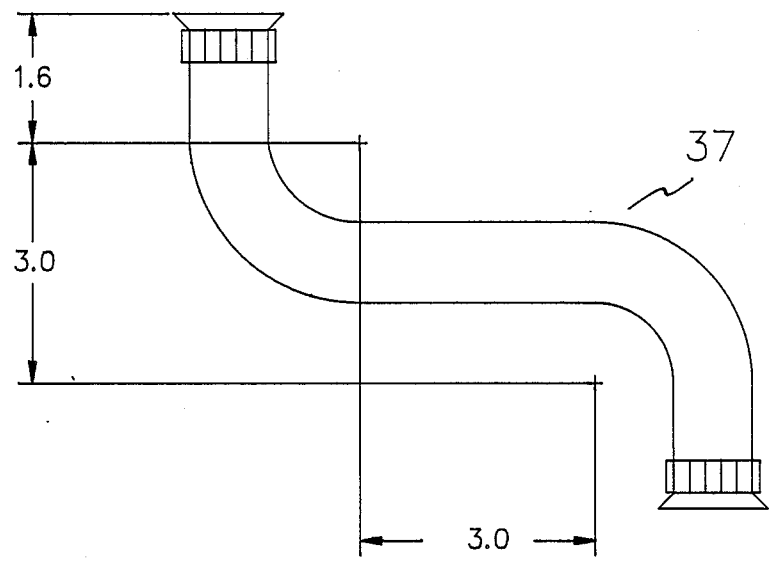
BEFORE RESCALING
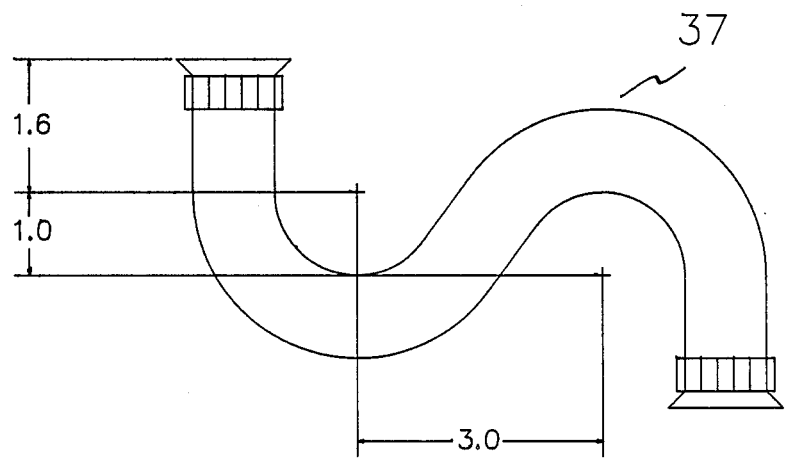
AFTER FIXED RESCALING
Fig. 10

CONSTRAINT SYMBOLS

CC — CONCENTRIC
T — TANGENT
V — VERTICAL
H — HORIZONTAL

DETERMINES PLACEMENT, SCALE, AND
ORIENTATION OF IMAGES INTO OUTPUT DRAWING

| SPECSHEET$ | MASTER$ | OUTFILE$ | XINSERT# | YINSERT# | SCALE# | ROTATE# |
|---|---|---|---|---|---|---|
| WINDOW | WINDOW | | 0.0000 | 0.0000 | 20.0000 | 0.0000 |

AUTO-ON

ROW 0 ==>

Fig. 18

```
VARIABLE    MEASUREMENT    TEXT  VER. 095-087  SYNTHESIS™
                    WINDOW DESIGN
CHOOSE THE STYLE OF WINDOW YOU WISH TO DESIGN:
   1.  COLONIAL              (W/ 8"-CAPITOL & BASE)
   2.  ORNATE                (W/ 12"-CAPITOL & BASE)
   3.  FANCY                 (W/BASE)
   4.  TRADITIONAL           (NO BASE OR CAPITOL)

SETHELP$ ("WINDOW.HLP")
STYLE_NUMBER                 1.0000    1
STYLE                                  COLONIAL
DOES_IT_HAVE_CAPITOL                   YES
DOES_IT_HAVE_BASE                      YES
HEIGHT_OF_CAPITOL                      8"
HEIGHT_OF_BASE                         8"

SPECSHEET$ MASTER$ OUTFILE$  XINSERT# YINSERT#  SCALE#  ROTATE#
 WINDOW   WINDOW SYNTHTMP    36.7232  32.7232  13.0893  0.0000
⇩ AUTO-ON
ROW 9 ==> SETHELP$ ("WINDOW.HLP")
```

Fig. 21

HOUSE IS LOCATED AT XINSERT#, YINSERT# AND ORIENTED AT ROTATE# = SUPERV-ANG RELATIVE TO FIXED REFERENCE FRAME.

WINDOW IS LOCATED AT XINS, YINS, REL_ANG WITH RESPECT TO HOUSE MODULE, AND AT XINSERT# + DX, YINSERT# + DY, REF_ANG = SUPERV_ANG + REL_ANG WITH RESPECT TO FIXED REFERENCE FRAME.

| VARIABLE | MEASUREMENT | TEXT | VER. 093-087 SYNTHESIS™ |

THIS IS A DESIGN PROGRAM THAT GENERATES A WINDOW.
SETHELP$("WINDOW.HLP")
DOES_IT_HAVE_CAPITOL                TRADITIONAL
DOES_IT_HAVE_BASE                   NO
HEIGHT_OF_CAPITOL                   NO
HEIGHT_OF_BASE                      0
                                    0

PROVIDE THE WINDOW'S DIMENSIONS, IN ARCHITECTURAL
INCHES (FOR EXAMPLE, 55 1/2"):

W1    36.00    3' 0"
H1     0.      0' 0"
H2    45.00    3' 9"
H3     0.      0' 0"
FILE_BOM$ (STYLE="WINDOW", W1$, H2$, "")

SPECSHEET$  MASTER$  OUTFILE$   XINSERT#  YINSERT#  SCALE#    ROTATE#
WINDOW      WINDOW   SYNTHTMP   32.1429   32.1429   12.8571   0.0000
AUTO-ON
PRINT$("THIS IS A DESIGN PROGRAM THAT GENERATES A WINDOW.")

Fig. 25

HOUSE DESIGN

THIS SPECSHEET DESIGNS A SIMPLE HOUSE, AS FOLLOWS:
- THE FRONT OF THE HOUSE HAS 1 DOOR AND 1 WINDOW
- THE SIDE OF THE HOUSE HAS 1 WINDOW

YOU WILL DESIGN TWO DIFFERENT WINDOWS, A DOOR, AND PROVIDE THE HOUSE'S OVERALL PROPORTIONS.

THROUGHOUT THE DESIGN YOU WILL BE ASKED FOR ANSWERS IN ARCHITECTURAL FEET
(FOR EXAMPLE, 22'-11 1/2"), OR IN ARCHITECTURAL INCHES
(FOR EXAMPLE, 34 1/2"). BE SURE TO RESPOND WITH THE PROPER FORMAT.

THE FOLLOWING DIMENSIONS ARE WIDTHS RELATED TO THE FRONT OF THE HOUSE:
DOOR'S WIDTH (IN ARCHITECTURAL INCHES) <36">
WINDOW'S WIDTH (IN ARCHITECTURAL INCHES) <45">
OVERALL HOUSE WIDTH (IN ARCHITECTURAL FEET) <18'-0">

THE FOLLOWING DIMENSIONS ARE FOR WIDTHS RELATED TO THE SIDE OF THE HOUSE:
WINDOW'S WIDTH (IN ARCHITECTURAL INCHES) <60">
OVERALL HOUSE WIDTH (IN ARCHITECTURAL FEET) <18'-0">

THE FOLLOWING DIMENSIONS ARE FOR WIDTHS RELATED TO THE SIDE OF THE HOUSE:
WINDOW'S WIDTH (IN ARCHITECTURAL INCHES) <60">
OVERALL HOUSE WIDTH (IN ARCHITECTURAL FEET) <15'-0">

149

| FIG. 28A |
| FIG. 28B |
| FIG. 28C |
| FIG. 28D |

FIG. 28A TO/FROM FIG. 28B

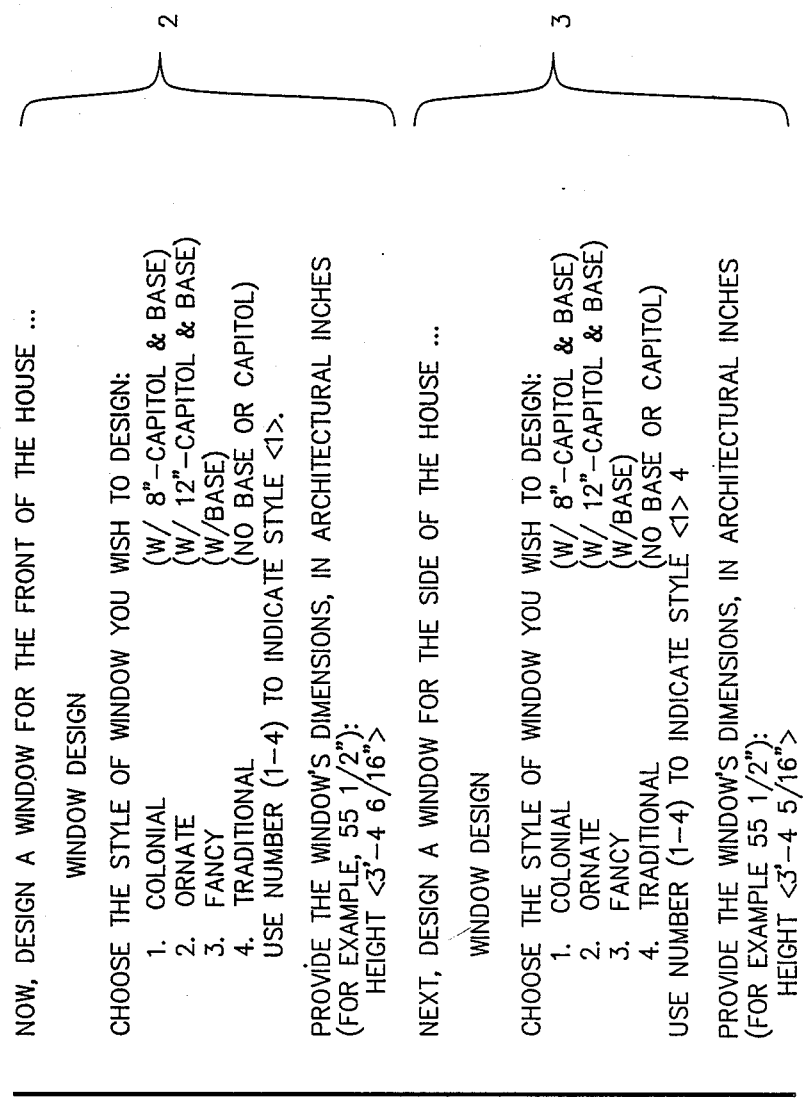

NOW, DESIGN A WINDOW FOR THE FRONT OF THE HOUSE ...

WINDOW DESIGN

CHOOSE THE STYLE OF WINDOW YOU WISH TO DESIGN:
  1. COLONIAL      (W/ 8"-CAPITOL & BASE)
  2. ORNATE        (W/ 12"-CAPITOL & BASE)
  3. FANCY         (W/BASE)
  4. TRADITIONAL   (NO BASE OR CAPITOL)
  USE NUMBER (1-4) TO INDICATE STYLE <1>.

PROVIDE THE WINDOW'S DIMENSIONS, IN ARCHITECTURAL INCHES
(FOR EXAMPLE, 55 1/2"):
   HEIGHT <3'-4 6/16">

NEXT, DESIGN A WINDOW FOR THE SIDE OF THE HOUSE ...

WINDOW DESIGN

CHOOSE THE STYLE OF WINDOW YOU WISH TO DESIGN:
  1. COLONIAL      (W/ 8"-CAPITOL & BASE)
  2. ORNATE        (W/ 12"-CAPITOL & BASE)
  3. FANCY         (W/BASE)
  4. TRADITIONAL   (NO BASE OR CAPITOL)
  USE NUMBER (1-4) TO INDICATE STYLE <1> 4

PROVIDE THE WINDOW'S DIMENSIONS, IN ARCHITECTURAL INCHES
(FOR EXAMPLE 55 1/2"):
   HEIGHT <3'-4 5/16">

FIG. 28B TO/FROM FIG. 28A TO/FROM FIG. 28C

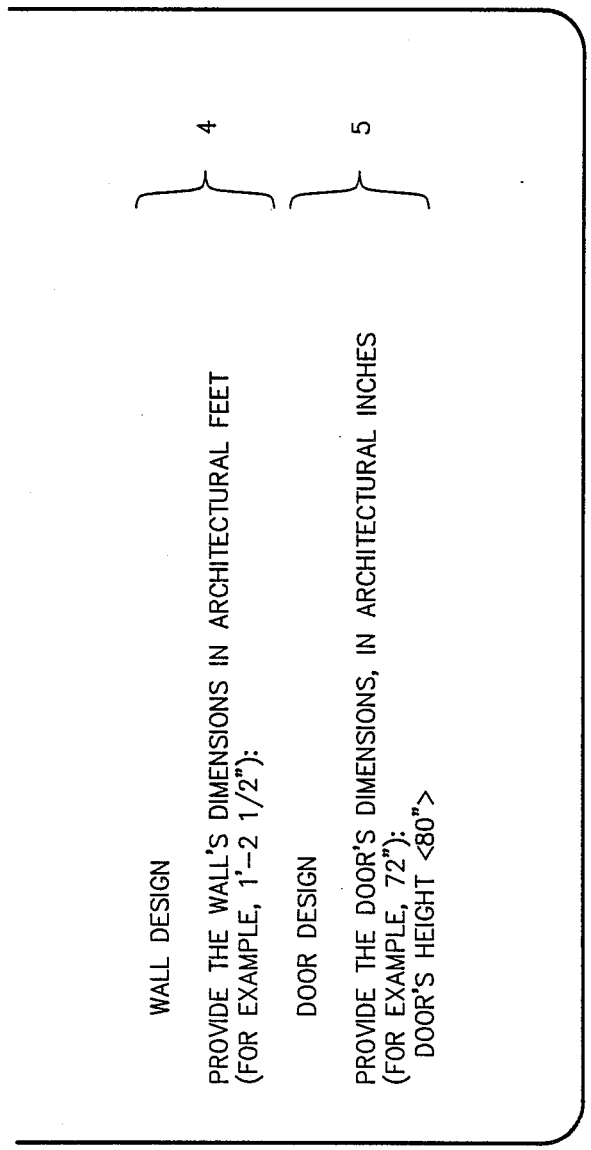
FIG. 28C TO/FROM FIG. 28B

156 ⟍

| VARIABLE | MEASUREMENT | TEXT | VER. 093-087 | SYNTHESIS™ |

WALL DESIGN

PROVIDE THE WALL'S DIMENSIONS IN ARCHITECTURAL
FEET (FOR EXAMPLE, 1'-2 1/2"):

W1 —— 192 —— 11.0000  11'-0"
W2 —— 194 —— 7.0000  7'-0"
W3 —— 195 —— 17.0000  17'-0"
H1 —— 197 —— 8.0000  8'-0"

158 ⟋

| SPECSHEET$ | MASTER$ | OUTFILE$ | XINSERT# | YINSERT# | SCALE# | ROTATE# |
| WALL | WALL | JAY | 0.0000 | 0.0000 | 10.0000 | 0.0000 |

AUTO-ON
ROW 0  ==>PRINT$ (" ")

Fig. 29

| VARIABLE | MEASUREMENT | TEXT | VER. 093-087 | SYNTHESIS™ |
|---|---|---|---|---|

ROOF DESIGN

PROVIDE THE ROOF'S DIMENSIONS IN ARCHITECTURAL
FEET (FOR EXAMPLE, 1'-3 1/2"):

```
W1    22.0000   22'-0"
W2     3.0000    3'-0"
W3    19.0000   19'-0"
H1    10.0000   10'-0"
```

FILE_BOM$ ("ROOF SHINGLES", "25-SQUARES", "", "")

| SPECSHEET$ | MASTER$ | OUTFILE$ | XINSERT# | YINSERT# | SCALE# | ROTATE# |
|---|---|---|---|---|---|---|
| ROOF | ROOF | JAY | -24.0000 | 120.0000 | 10.0000 | 0.0000 |

AUTO-ON
ROW 0 ===>PRINT$ (" ")

Fig. 30

| VARIABLE | MEASUREMENT | TEXT | VER. 093-087 | SYNTHESIS™ |

DOOR DESIGN

PROVIDE THE DOOR'S DIMENSIONS IN ARCHITECTURAL
INCHES (FOR EXAMPLE 72"):
W1    3.5000  42"
H1    6.6667  80"

FILE_BOM$ ("FRONT DOOR", H1$, W1$, """)

| SPECSHEET$ | MASTER$ | OUTFILE$ | XINSERT# | YINSERT# | SCALE# | ROTATE# |
| DOOR | DOOR | JAY | 67.5000 | 0.0000 | 10.0000 | 0.0000 |

AUTO-ON
ROW 0 ==>PRINT$ (" ")

Fig. 32

| VARIABLE | MEASUREMENT | TEXT | VER. 093-087 | SYNTHESIS™ |
|---|---|---|---|---|

```
SETHELP$("WINDOW.HLP")
DOES_IT_HAVE_CAPITOL        TRADITIONAL
DOES_IT_HAVE_BASE           YES
HEIGHT_OF_CAPITOL           YES
HEIGHT_OF_BASE              0
                            0

PROVIDE THE WINDOW'S DIMENSIONS IN ARCHITECTURAL
INCHES (FOR EXAMPLE, 55 1/2"):

W1    6.00    6'-0"
H1    1.00    1'-0"   } 182
H2    4.33    4'-4"
H3    1.00    1'-0"
FILE_BOM$ (STYLE="WINDOW", W1$, H2$, "")
```

| SPECSHEET$ | MASTER$ | OUTFILE$ | XINSERT# | YINSERT# | SCALE# | ROTATE# |
|---|---|---|---|---|---|---|
| WINDOW | WINDOW | SYNTHTMP | 5.0000 | 15.0000 | 7.0000 | 0.0000 |

AUTO-ON
ROW 21  ==>H3

Fig. 34

| VARIABLE | MEASUREMENT | TEXT | VER. 093-087 | SYNTHESIS™ |
|---|---|---|---|---|
| SETHELP$("WINDOW.HLP") | | | | |
| DOES_IT_HAVE_CAPITOL | | NO | | |
| DOES_IT_HAVE_BASE | | NO | | |
| HEIGHT_OF_CAPITOL | | 0 | | |
| HEIGHT_OF_BASE | | 0 | | |

PROVIDE THE WINDOW'S DIMENSIONS IN ARCHITECTURAL
INCHES (FOR EXAMPLE, 55 1/2"):

| W1 | 3.00 | 36" |
| H1 | 0.00 | 0" |
| H2 | 40.3125 | 40 5/16" |
| H3 | 0.00 | 0" |

FILE_BOM$ (STYLE="WINDOW", W1$, H2$, "")

| SPECSHEET$ | MASTER$ | OUTFILE$ | XINSERT# | YINSERT# | SCALE# | ROTATE# |
|---|---|---|---|---|---|---|
| WINDOW | WINDOW | SYNTHTMP | 5.0000 | 15.0000 | 7.0000 | 0.0000 |

AUTO-ON
ROW 21 ===>H3

Fig. 35

| FIG. 36A |
|---|
| FIG. 36B |
| FIG. 36C |

```
VARIABLE        MEASUREMENT    TEXT        VER. 093-087    SYNTHESIS™

HOUSE DESIGN

THIS SPECSHEET DESIGNS A SIMPLE HOUSE, AS FOLLOWS:
   o THE FRONT OF HOUSE HAS 1 DOOR AND 1 WINDOW
   o THE SIDE OF THE HOUSE HAS 1 WINDOW
YOU WILL DESIGN TWO DIFFERENT WINDOWS, A DOOR, AND PROVIDE
THE HOUSE'S OVERALL PROPORTIONS.

THROUGHOUT THE DESIGN YOU WILL BE ASKED FOR ANSWERS IN
ARCHITECTURAL FEET (FOR EXAMPLE, 22'-11 1/2"), OR IN ARCHITECTURAL
INCHES (FOR EXAMPLE, 24 1/2").  BE SURE TO RESPOND WITH THE
PROPER FORMAT.
THE FOLLOWING DIMENSIONS ARE WIDTHS RELATED TO THE FRONT
OF THE HOUSE:                                           ⎫
DOOR_WIDTH                     3.0000  36"              ⎪
WINDOW_WIDTH                   3.7500  45"              ⎬ PART 1
FRONT_WIDTH_OF_HOUSE          18.0000  18'-0"           ⎭

THE FOLLOWING DIMENSIONS ARE FOR WIDTHS RELATED TO
THE SIDE OF THE HOUSE:                                  ⎫
SIDE_WINDOW_WIDTH              5.0000  60"              ⎬ 2
SIDE_WIDTH_OF_HOUSE           15.0000  15'-0"           ⎭

#------DESIGN THE FRONT WINDOW------
NOW, DESIGN A WINDOW FOR THE FRONT OF THE HOUSE ...
X_WINDOW_POS                  13.2500  13'-3"
SP_EXPORTSTR$ ("WINDOW", "W1$", WINDOW_WIDTH$)
SP_INSERT_CALC_OUTPUT$ ("WINDOW", X_WINDOW_JPOS#*12,
3.0 * 12, 0.0)
```

```
#------DESIGN THE SIDE WINDOW------
NEXT, DESIGN A WINDOW FOR THE SIDE OF THE HOUSE ...
X_WINDOW_POS_SIDE        30.0000  30'-0"
SP_EXPORTSTR$ ("WINDOW", "W1$", SIDE_WINDOW_WIDTH$)
SP_INSERT_CALC_OUTPUT$ ("WINDOW", X_WINDOW_POS_SIDE#*12, 3*12, 0)

#------DESIGN THE WALL------
SP_EXPORT$ ("WALL", "W1#", FRONT_WIDTH_OF_HOUSE#)
SP_EXPORT$ ("WALL", "W2#", 7)
SP_EXPORT$ ("WALL", "W3#", SIDE_WIDTH_OF_HOUSE#)
SP_EXPORT$ ("WALL", "H1#", 10.0)
SP_INSERT_CALC_OUTPUT$ ("WALL", 0, 0, 0)

#------DESIGN THE DOOR------
DOOR'S_X_COORDINATE     5.6250  5'7 1/2"
SP_EXPORTSTR$ ("DOOR", "W1$", DOOR_WIDTH$)
SP_INSERT_CALC_OUTPUT$ ("DOOR", 12 * DOOR'S_X_COORDINATE#, 0, 0)

#------DESIGN THE ROOF------
SP_EXPORT$ ("ROOF", "W1#", FRONT_WIDTH_OF_HOUSE# + 4)
SP_EXPORT$ ("ROOF", "W2#", 3)
SP_EXPORT$ ("ROOF", "W3#", SIDE_WIDTH_OF_HOUSE# + 4)
SP_EXPORT$ ("ROOF", "H1#", 10)
SP_INSERT_CALC_OUTPUT$ ("ROOF", -24, 120, 0)

SPECSHEET$  MASTER$  OUTFILE$  XINSERT#  YINSERT#  SCALE#   ROTATE#
HOUSE       NONE     JAY        0.0000    0.0000  10.0000   0.0000
   AUTO-ON
row 52 ==>
```

Fig. 36B

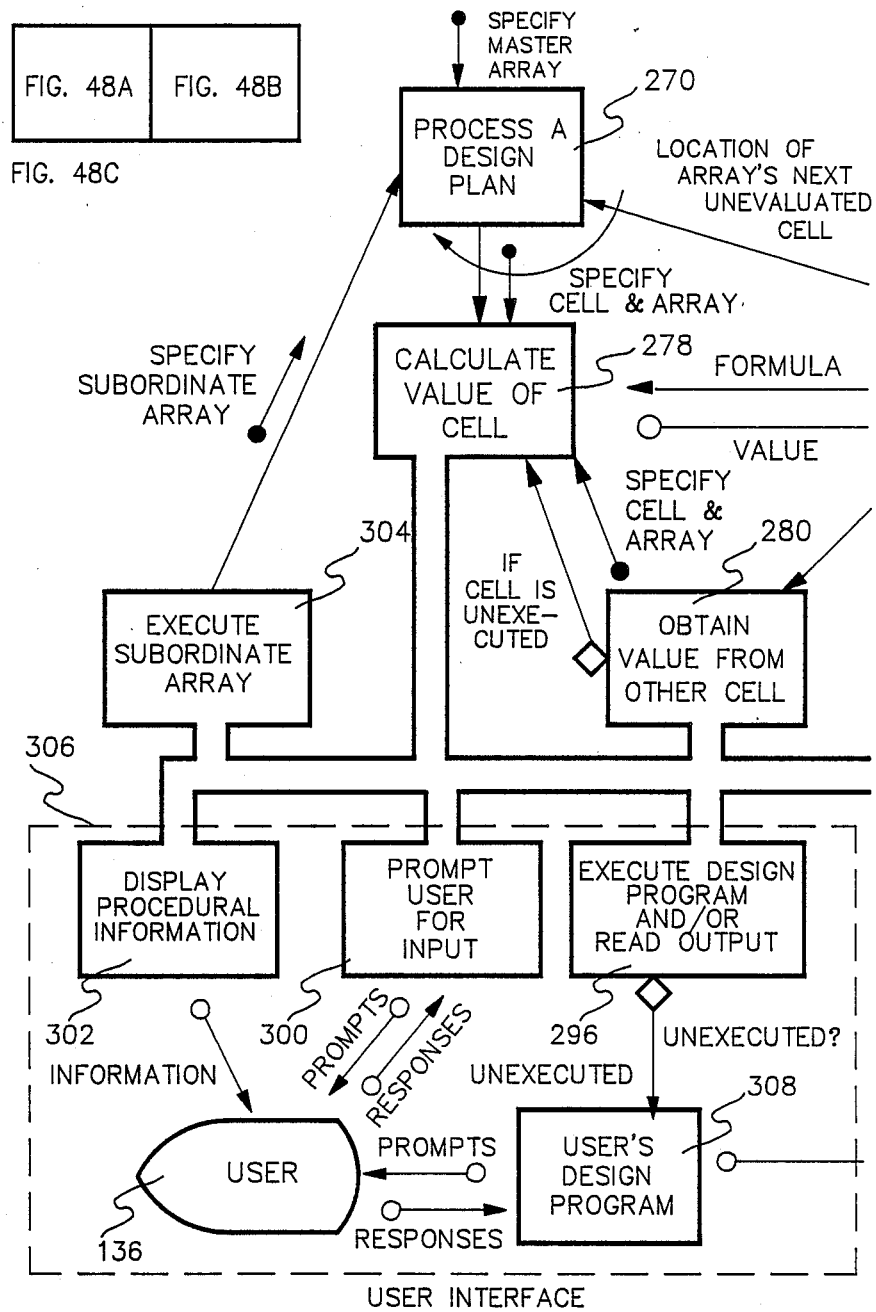
Fig. 48A TO/FROM Fig. 48B

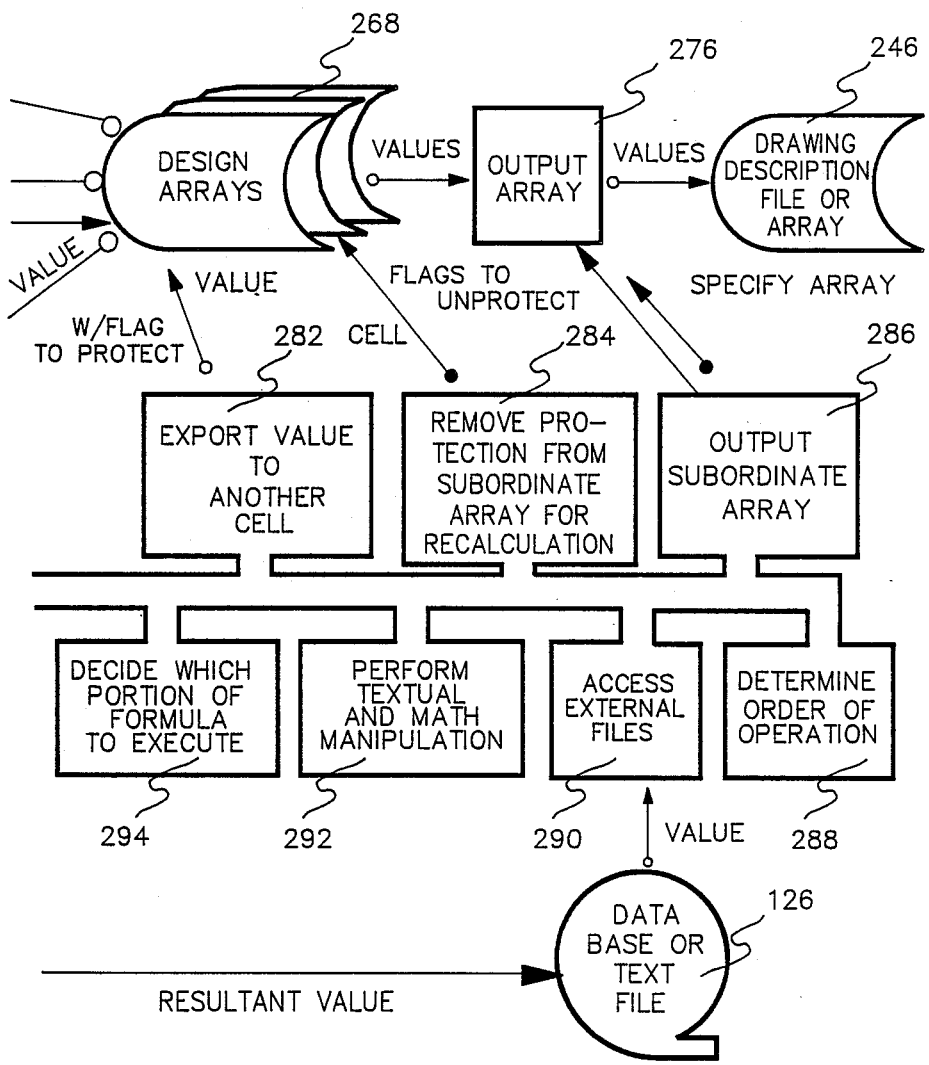
Fig. 48B TO/FROM Fig. 48A

METHOD AND SYSTEMS FOR GENERATING PARAMETRIC DESIGNS

CROSS REFERENCE TO A RELATED APPLICATION

This application is a continuation in part of application No. 925,278 filed Oct. 30, 1986, by Jay R. Saxton et al. for METHODS AND SYSTEM FOR GENERATING PARAMETRIC DESIGNS.

TECHNICAL FIELD OF THE INVENTION

The present invention relates to computer-aided design (CAD) and computer-aided manufacturing (CAM) by a technique termed modular parametric design.

Modular parametric design refers to a system or process that enables a computer to create, interpret, and relate modules which are capable of both designing and directing the production of a manufactured part.

As used herein, the term "design" has two meanings. They are:

Engineering design which can be described as a series of steps, beginning with first principles and concepts, and ultimately resulting in the creation of a workable product, subject to whatever constraints are present. Traditionally, engineering design is a manual process. The computer aids, if at all, mainly in calculating values; and

Parametric design which is the automatic implementation of an engineering design resulting in the creation of either a drawing or a computer image of the product, depending respectively on whether the design actuates a manual process (drawing) or an automated production line (manufacturing). The user's role is relegated to that of providing information to prompts set by the design. Parametric design therefore affords the capability to automatically design and draw a complete artifact, such as a solar dwelling, so as to reflect the design parameters (such as new dimensions) given by the design's user.

BACKGROUND OF THE INVENTION

Parametric design is a process in which a few "outer" parameters (supplied by the design's end user) control the parameters set within the design. An algorithm is set up where the user is prompted for the outer parameters (such as new dimension values) or is otherwise asked to supply them. The computer then automatically designs the part after these values supplant the inner parameters (such as the variables labeling the master drawing). An electronic image of the part is stored in memory. And, this image can be used to produce either a drawing of the part (CAD) or to orchestrate the actual production of the part itself (computer-aided manufacturing, or CAM).

Heretofore available packages that offer parametric design capabilities to at least a limited extent include:
  programming languages
  macros
  spreadsheet-format databases
  geometric rectification
  tabularized rectification
  nontabularized rectification
  spreadsheet rectification Of these approaches, only the first three directly employ parametric design. The only comprehensive approach to computer aided parametric design heretofore available involves the use of a programming language to write a special purpose program which could do the design and output a drawing. The other methods lack sufficient power to establish a comprehensive design or are used in products that have a completely different objective and lend themselves to different goals. However, establishing a parametric design with a programming language is a laborious, time-consuming process that necessitates having the skills of a programmer.

As will become apparent hereinafter, applicants have invented a new and vastly improved method of generating parametric designs which involves a spreadsheet-driven rectification of a master drawing.

Rectification, by applicants' definition, is the subsequent modification that a drawing undergoes to conform with its new dimension text when the text is altered; it is a dimension-driven modification.

Tabularized and nontabularized rectification are used in some of the above-identified prior art approaches to the generation of parametric designs. The real purpose of tabularized rectification in the approaches is to save space within the computer. Spreadsheet rectification is used mainly for analysis. And, nontabularized rectification is used to enhance the editing process; it allows the user to insert a part as to position and angle, but it can only handle one part at a time.

The rectification capabilities listed above are in reality only editing tools and do not lend themselves to parametric design.

SUMMARY OF THE INVENTION

Applicants have now invented, and disclosed herein, certain novel and improved methods and systems for generating parametric designs which are powerful enough to allow design and drafting functions to be fully automated, yet do not require programming skills or the usual time or labor involved in creating engineering designs and drawings. Applicants' novel approach to the generation of such designs and drawings is particularly useful in circumstances such as those involving the design of products that are similar, but with a large number of variations. Such design and manufacturing processes are necessarily concerned with a great deal of repetitive work.

As discussed above, applicants' user-friendly approach to the generation of parametric designs involves the rectification of a master drawing. It also employs a CAD-spreadsheet (also referred to herein as a specsheet or a design plan) and modularity. The CAD-spreadsheet is a design editor. The Master drawing serves as a template for the electronic image that represents the design. And rectification drives the design changes. The objective of the specsheet and master drawing is to establish a design program identical in look and capability to that established by a programming language, but without requiring the heretofore necessary programming expertise of a user.

Modularity makes it practical to establish complex parametric designs. Large designs can be assembled out of simpler ones rather than having to tackle them all at once, as is the case with a programming language.

In the novel approach to the generation of parametric designs described herein, one or more design modules are created and stored. Each module is composed of two types of information: a CAD-spreadsheet and one or more master drawings. Once the modules have been set up and the design process invoked, the modules control the design process, synthesizing the final design by modification (or rectification) of a computer-selected master drawing and/or by merging all or selected portions of two or more master drawings. The end user's role is limited to responding to simple prompts, usually requesting dimensions, that were defined within the module.

Thus the user is not required to have any programming skills. Furthermore, our straightforward approach for both editing and executing a design is less likely to result in the introduction of an error. This makes our approach vastly superior both in terms of speed and in terms of establishing and executing a design.

The invention disclosed herein can also be employed to generate nonmodular parametric designs. This is important because our approach provides a way of establishing and executing a nonmodular parametric design which is superior to all other methods. With our system, a stand-alone module can be set up in about the time it takes to instruct a draftsman in traditional methods. Thereafter, designs (including drawings depicting the design) that might otherwise require engineers and designers hours or days to complete can be completed in minutes.

Yet another important advantage of our invention is that it is capable of generating designs in a manner such that the outputted information can be used with equal facility to produce a drawing or to control a manufacturing process.

OBJECTS OF THE INVENTION

From the foregoing, it will be apparent to the reader that one primary and important object of our invention resides in the provision of novel, improved methods of, and apparatus for, generating parametric designs.

Other also important but more specific objects of the invention reside in the provision of methods and systems as defined in the preceding object:

which can be utilized to particular advantage in the generation of drawings and products of the same general character but differing in dimensions and/or other respects;

which are user friendly;

which do not require programming skill or the knowledge of any programming language to use and do not require the time or labor needed to write a design or manufacturing program;

which are capable of generating both nonmodular and modular designs; i.e., respectively, designs derived from rectification of a single master drawing, and designs generated by merging related or unrelated master drawings and/or portions of such drawings;

which allow designs to be generated with greater speed than has heretofore been possible in applications of the character for which the present invention is intended;

which are capable of generating designs in a format apropos to the control of manufacturing processes and to the production of engineering, architectural, or other drawings.

Still other important objects and features and additional advantages of the invention will be apparent to the reader from the foregoing and the appended claims and as the ensuing detailed description and discussion of the invention proceeds in conjunction with the accompanying drawings.

BRIEF DESCRIPTION OF THE DRAWINGS

In the drawings:

FIG. 6 is a chart depicting representative entities and the control points employed in rectifying those entities in accord with the principles of our invention;

FIG. 9 shows a profile of a human head, before and after proportional rescaling; it also illustrates the definition of closest extension line;

FIG. 10 shows a side view of a pipe, before and after fixed rescaling;

FIG. 18 depicts in detail the master region of a CAD-spreadsheet depicted by FIG. 1; i.e., that region of the CAD-spreadsheet with cells having contents which control the placement, scale, and orientation of a master drawing image in a modular parametric design generated by the novel techniques disclosed herein;

FIG. 21 depicts a representative design screen which can be provided and employed in accord with the principles of the invention to provide a simple-to-use design system for the end use;

FIG. 25 depicts a window specsheet of FIG. 14 shown entering a string of text;

FIG. 28 shows a representative screen seen by an end user wishing to design a representative, but very simple, house by the novel techniques disclosed herein;

FIG. 29 shows the specsheet of a subordinate module used to design the walls of the house;

FIG. 30 shows the specsheet of a subordinate module used to design the roof of the house;

FIG. 32 shows the specsheet of a subordinate module employed to design the door of the house;

FIGS. 34 and 35 depict the specsheet of the window module, respectively edited so that the specsheet can be employed by a user to design a front window or a side window for the house, by rectifying the master drawing depicted in FIG. 27;

FIG. 36 depicts part of the specsheet established by the designer for the supervising (house) design module; it is the basis for the design screen shown by FIG. 28;

FIG. 56 is a block diagram of a system for generating parametric designs in accord with the principles of the present invention.

DETAILED DESCRIPTION OF THE INVENTION

Figure 1:
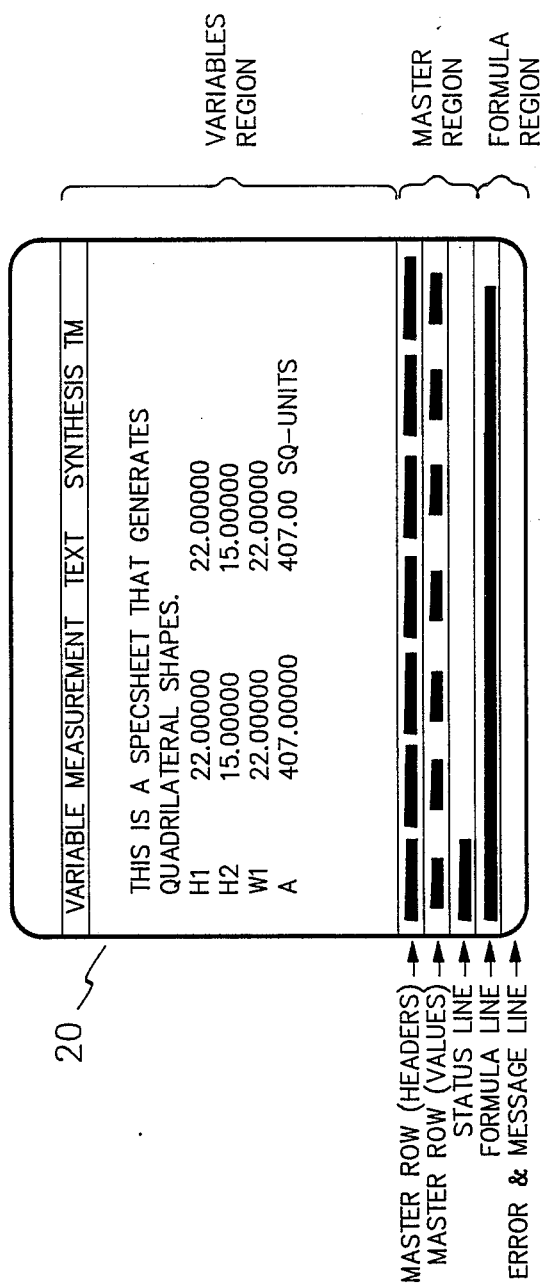
FIG. 1 is a pictorial representation of a CAD-spreadsheet or design plan which is associated with one or more rectifiable master drawings in a design module and which is employed in creating a parametric design in accord with the principles of the present invention.

The hardware employed to practice the present invention may include any one of several types of commercially available main-frame computers, minicomputers, or microcomputers with various operating In one implementation (see FIG. 56), we use a PC-AT 130 with the usual keyboard 132 and PC-DOS, an AUTO-CAD ® drawing processor shown in a block 134 and stored as usual on a hard disc 136, a Kurto Series I digitizing tablet 138, a Hewlett-Packard Laser Jet graphics plotter 140, a video monitor 142, a conversion program for translating drawing images into numerical control code such as AUTOCAD's NC Programmer ™ (see block 134) and also stored on hard disc 136, a numerical milling machine 144 capable of accepting NC code, and 640K of RAM with two megabytes of extended memory (the memory components are collectively identified by reference character 146). Other suitable types of input-output devices can be used instead.

The generation of parametric designs by the novel parametric design process described hereinbelow also involves the use of a proprietary computer program entitled SYNTHESIS ™. A copy of that program, in hexadecimal code, is attached as Appendix G.

A copy of a user's manual, which explains some, but not all of the capabilities of the SYNTHESIS ™ program, version 3.0, is attached as Appendix F.

§1 The integral parts of the invention

Figure 2:
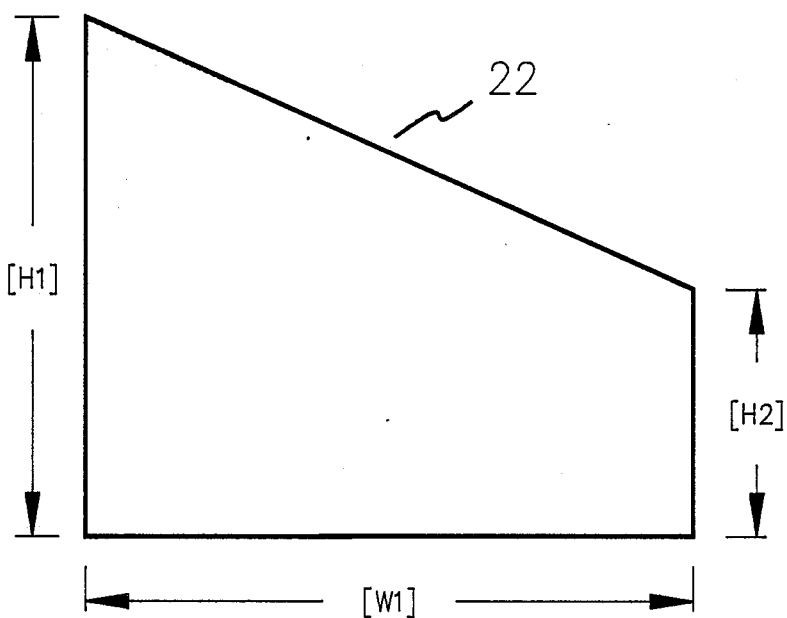
FIG. 2 is a pictorial representation of a master drawing which can be rectified by the design plan shown in FIG. 1 to create the parametric design.

As discussed above, the invention uniquely approaches parametric design through the use of a CAD-spreadsheet 20 (FIG. 1) and a Master Drawing 22 (FIG. 2). A CAD-spreadsheet 20 (also referred to herein as a "specsheet" and as a "design plan" and one or more rectifiable master drawings 22 combine to form what we term a design module. Thus, our novel technique for generating parametric designs is modular in concept and employs rectification as an integral part of the design process.

§1.1 Rectification

Figure 3:
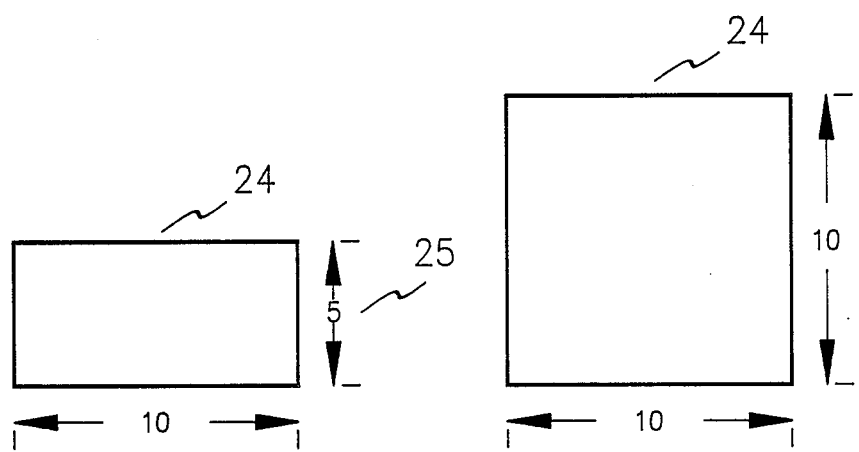
FIG. 3 depicts a geometric figure before and after rectification in accord with the principles of our invention.
Figure 4:
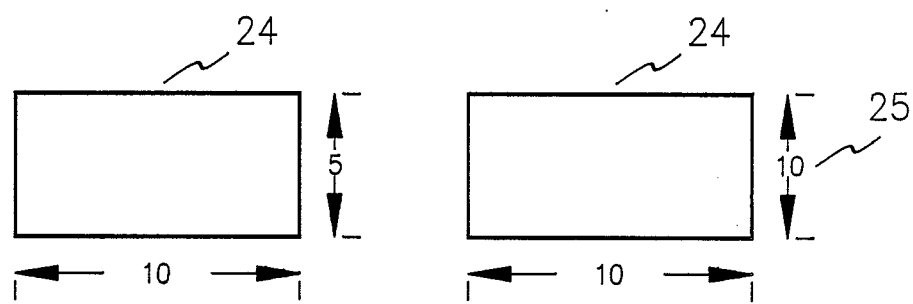
FIG. 4 is a view similar to FIG. 3 but showing the disparity that can arise in generating a computer-aided design if a drawing is incapable of being rectified to conform to altered dimension text as is often the case in prior art approaches to computer-aided design.

Rectification, by our definition, is the subsequent modification that a drawing undergoes to conform with its new dimension text when the text is altered; it is a dimension-driven modification. For example, in the case of the rectangle 24 in FIG. 3, if its vertical dimension text 25 is changed from "5" to "10," and rectification is implemented, the drawing is transformed as shown. Note that without rectification, no subsequent redrawing is done, and the graphic entity (in this case, rectangle 24) does not conform with its altered dimension text 25 (FIG. 4).

Figure 5:
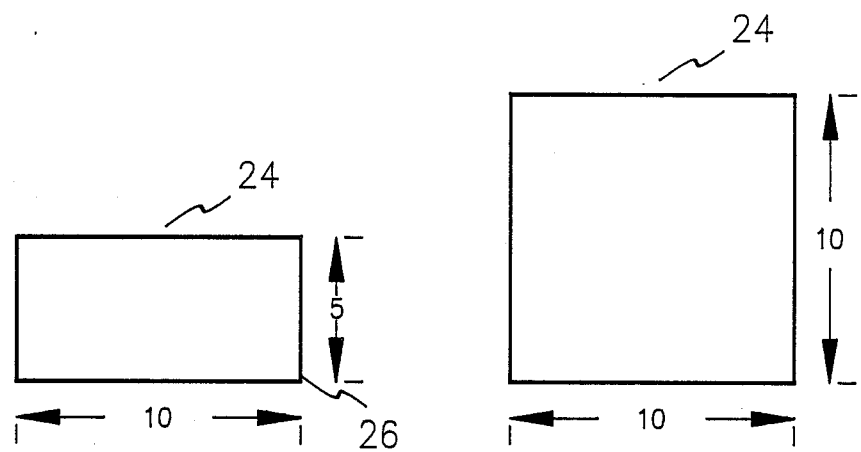
FIG. 5 is a view similar to FIGS. 3 and 4 depicting the prior art process of associative dimensioning.

Rectification should not be confused with associative dimensioning. In the latter, the dimension's position, length, and text change to comply with the part to which it is associated whenever that part is stretched or moved in editing. For example, in FIG. 5, the vertical dimension is associated with the line 26 that forms the right side of rectangle 24. When the line 26 is stretched during editing, the dimension stretches with it. The dimension's text reflects its new length. It is not a dimension-driven modification but is rather the opposite; i.e., it is entity-driven. Changing the entity (in this case a line) drives modification to the associated dimension.

Our novel technique for rectifying drawings has the following unique rectification related capabilities:

(1) Fixed, proportional, and stylized rescaling of the drawing during rectification.

Figure 7:
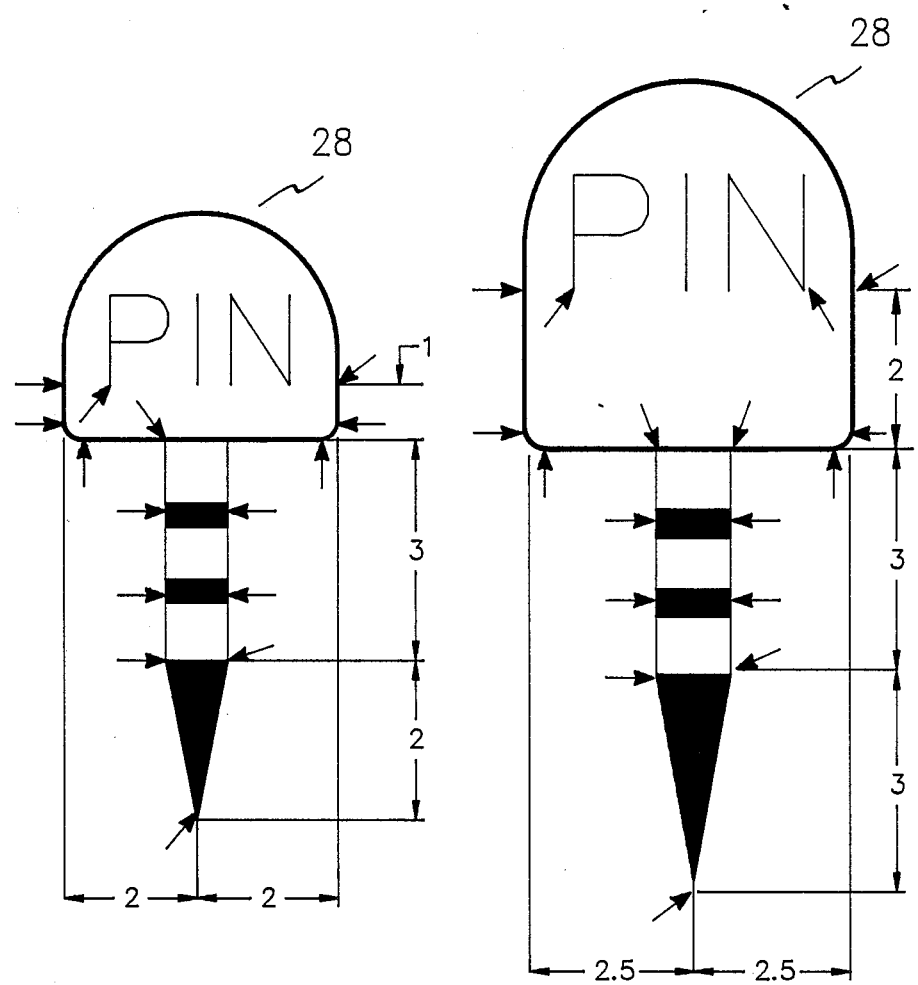
FIG. 7 illustrates the use of control points in rectifying a drawing of a representative artifact by the novel techniques described herein.

SYNTHESIS uniquely defines fixed, proportional, or stylized rescaling of parts of a drawing in rectification. Because of this capability, the underlying methodology for rectifying can be simplified. Control points can be associated with each type of entity. FIG. 6 lists the control points for most of the entities that our product supports. When a drawing is rectified, the control points are relocated by the dimensions. For instance, a line is controlled by its two endpoints. When the line is rectified, the endpoints are set the appropriate distance apart by the dimension. With fixed rescaling, control points remain a constant distance from the nearest dimension's extension lines. With proportional rescaling, the distance between the control points and the nearest extension line increases or decreases in proportion to the change in the affected dimension. The entity is then redrawn to conform to the position of its control points. In stylized rescaling, the entities do not move. This allows one element of a drawing to remain unchanged, for example, while other elements are rectified by proportional or fixed rescaling. FIG. 7 shows a pin 28 before and after rectification. Note the positions of its control points as well as their movement with different dimension values. (The pin is composed of the head, shaft, and tip. Its head is composed of three arcs and three lines and one aligned text entity.)

Figure 8:
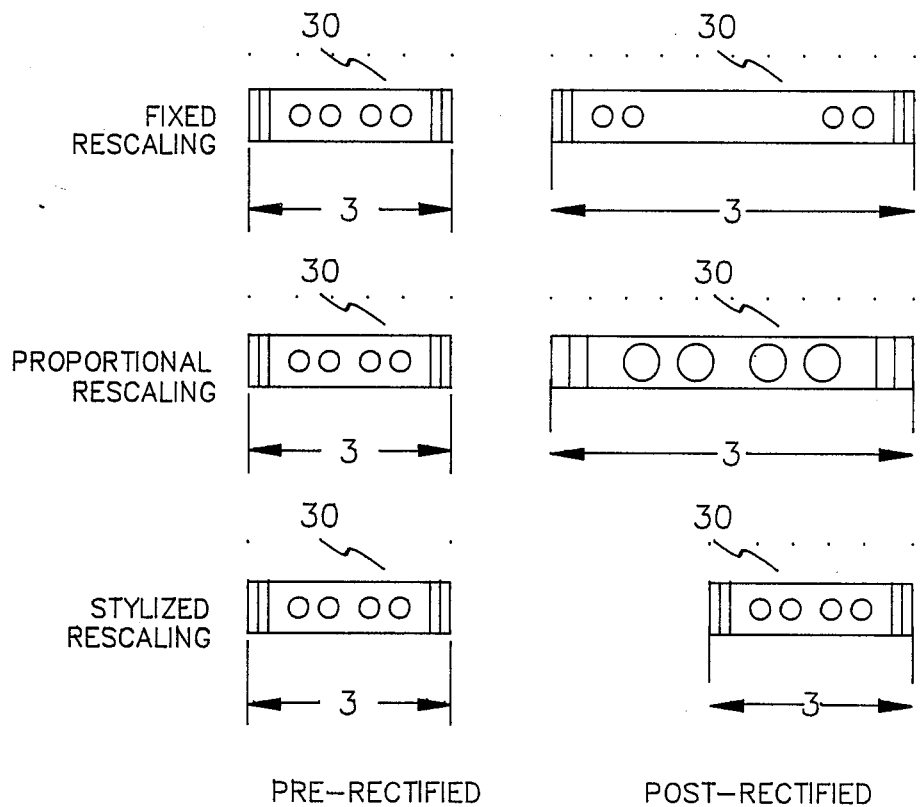
FIG. 8 depicts three types of rectification that can be employed in generating parametric designs in accord with the principles of our invention; viz., fixed, proportional, and stylized rescaling.

FIG. 8 shows the different effect each of the three styles of rescaling has in rectifying three identical beams 30.

The nearest extension line is defined as that line whose distance to the control point is the least, even if the extension line has to be extended past its endpoint. By definition, the shortest distance from a point to a line is an orthogonal distance. In FIG. 9, the head 31 has a dimension extension line BC (32) that is extended past its endpoint B (33) to form the line ABC. The control point F (34) is closer to line ABC than it is to line DE (35), even though point F (34) is closer to endpoint D (36) than it is to endpoint B (33).

Figure 11:
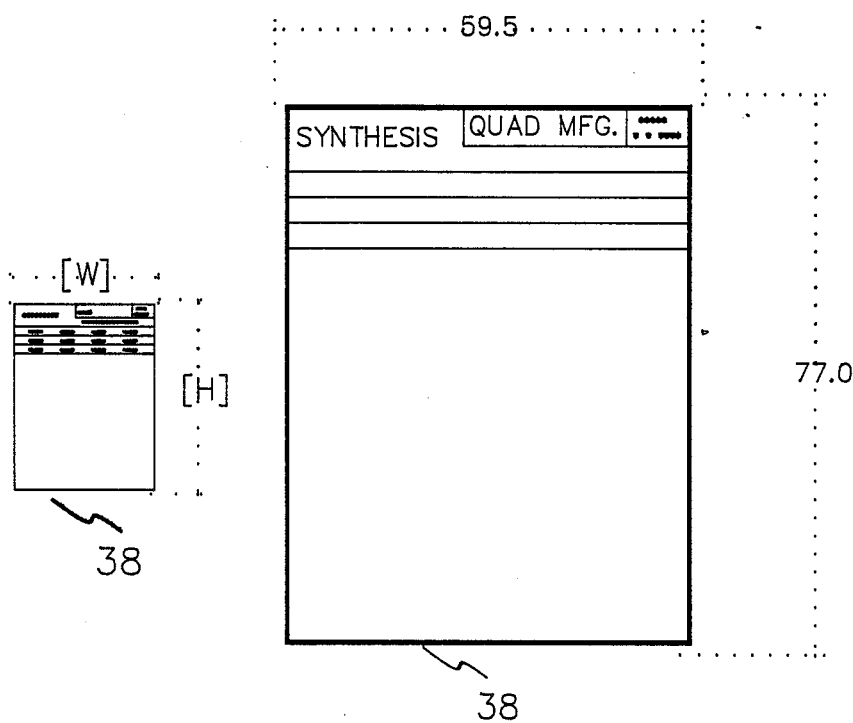
FIG. 11 shows how a drawing can be rectified in accord with the principles of our invention by employing proportional rescaling and changing the scale factor.

The capability of choosing between fixed and proportional rescaling makes the designer's work far easier in establishing a rectifiable drawing. The designer can control the outcome by choosing the appropriate style. The rectified head 31, shown in FIG. 9, demonstrates the utility of proportional rescaling. The head is composed of 67 lines which are accurately controlled by just 4 dimensions. Fixed rescaling enables just three dimensions to control the pipe 37 shown in FIG. 10. Proportional rescaling combined with the effect of changing the scale factor allow just two dimensions to control the Bill of Materials drawing 38 (FIG. 11).

Figure 12:
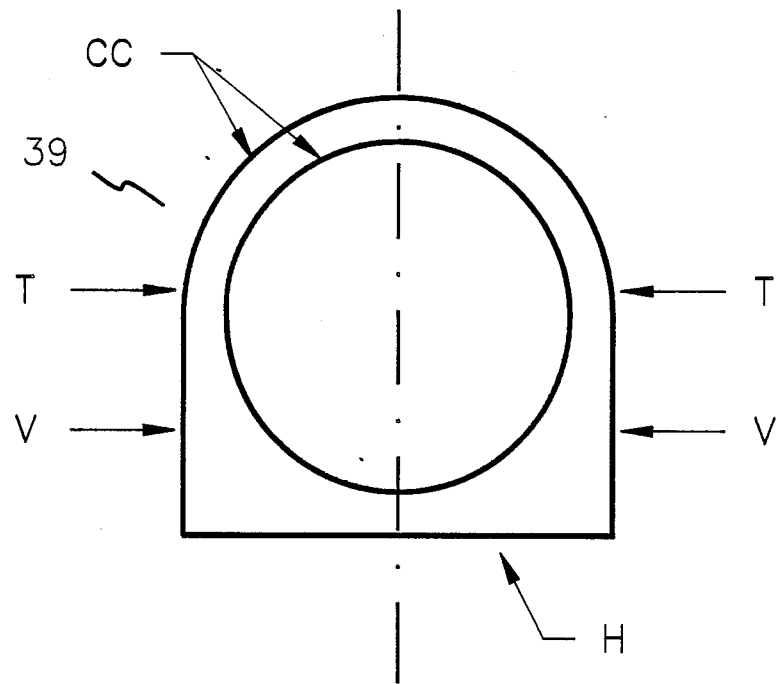
FIG. 12 depicts a prior art technique for rectifying a drawing.

With all other products that include rectification as a part of their process, far more work is required to establish a rectifiable drawing—especially with this degree of control. Either all controlling points (endpoints of line segments, centers of circles, etc.) have to be specifically dimensioned or their relationships to dimensioned-to points have to be constrained in a very specific way. A typical example of this is shown in FIG. 12, which contains a parts drawing 39 similar to a drawing provided in the Metagraphics brochure, *An Introduction to Drawing Rectification*, (Copyright 1984 Metagraphics, Inc.). The circle and arc at the top of the figure must be explictly specified as concentric with their centers positioned along the centerline of the figure before the system can understand how to rectify.

(2) Parametric deletion of parts of the design by dimensioning those parts to zero.

This is a unique feature of SYNTHESIS's rectification capabilities, pertaining especially to linear dimensions. The master drawing is made as general as possible and yet, for specific applications, certain features can be made to vanish by dimensioning those particular features to zero. Moreover, this capability extends to both linear and radial entities. This can be seen in FIGS. 13A, B, and C for linear dimensions and in 13D for a radial dimension.

Figure 13A:
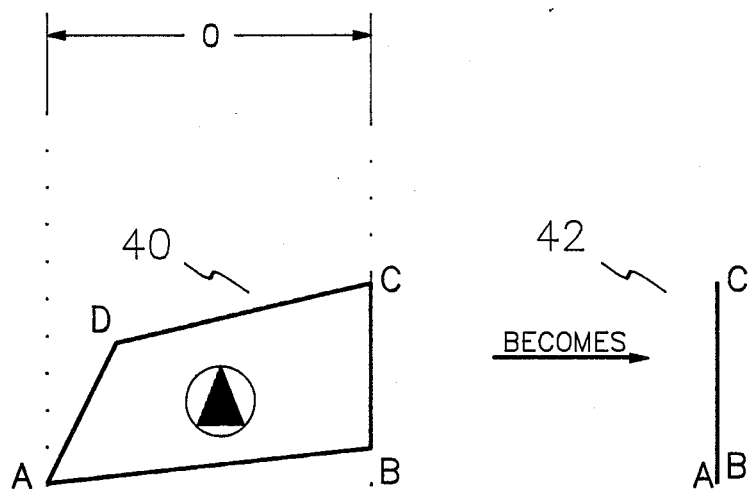
FIGS. 13A-D show how master drawings can be rectified in accord with the principles of our invention by the deletion of parts and graphic entities.
Figure 13B:
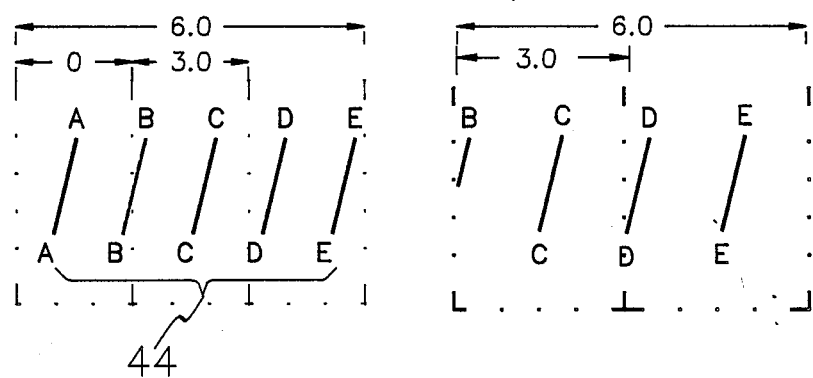
Figure 13C:
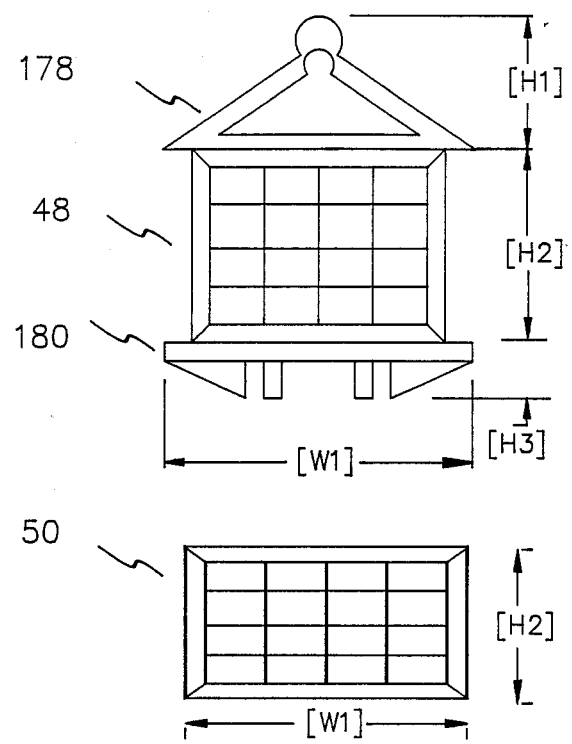
Figure 13D:
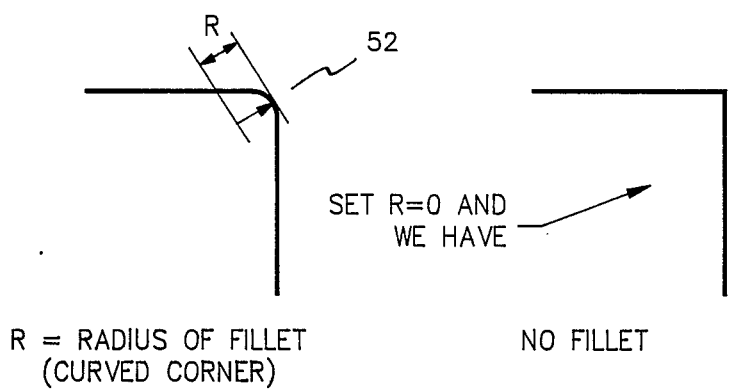

In particular, FIG. 13A shows how dimensioning to zero can be used to collapse a trapezoid 40 to a line 42 while FIG. 13B illustrates the use of that process to delete parts (A and a segment of B) in a set 44 of parts A-E. Similarly, FIG. 13C shows dimensioning to zero can transform a relatively complex window design 48 into a much simpler window design 50, and FIG. 13D shows how this technique can be used to eliminate a fillet 52.

§1.2 The Master drawing

The Master drawing is a specialized rectifiable drawing. A Master drawing contains variables in place of certain dimensions and/or text in the drawing (for example, the drawing 22 in FIG. 2). The variable dimensions are replaced by values acquired and/or calculated by the associated CAD-spreadsheet 20, and the output drawing is rectified to the new values. The Master drawing can contain both unchanging and variable dimensions as well as unchanging and variable text.

As a template, a single Master drawing can be used to represent a wide range of related designs. It can be drawn to allow for the most complicated case. From the original Master drawing, SYNTHESIS can eliminate unnecessary graphic entities in order to produce drawings of varying complexity due to its capability of parametric deletion.

§1.3 Modularity

The invention disclosed herein by applicants employs the concept of modules in the overall design process. Each module is independently designed and capable of standing alone, yet each module is easily incorporated into a larger design module. Consider the window design 48 of FIG. 13C. It is a stand-alone design that can incorporate the more complex features of the upper and lower casements dimensioned by H1 and H3, or it can be made into a simple, rectangular window 50 by setting H1 and H3 to zero. New designs reflect these choices as well as values chosen for dimensions. But the window design may just be one level of a design hierarchy in which the window module is placed within a house module, the house module placed within a subdivision module, and the subdivision module placed within a town module.

The concept of modularity is intimately linked to the concept of the CAD-spreadsheet. Functions and commands that direct communication between modules, placement of modules into other modules, and modification of design values in other levels (modules) of the design hierarchy are defined via the CAD-spreadsheet as will be explained in §2 below.

§1.4 The CAD-spreadsheet

§1.4a Morphology

The CAD-spreadsheet is unique in the majority of processes it employs. It resembles an electronic spreadsheet in appearance (FIG. 1). But it has capabilities, specific to CAD-CAM, that transcend those of traditional spreadsheets. The CAD-spreadsheet is also referred to as a specsheet and as a design plan in applicants' terminology.

Figure 14:
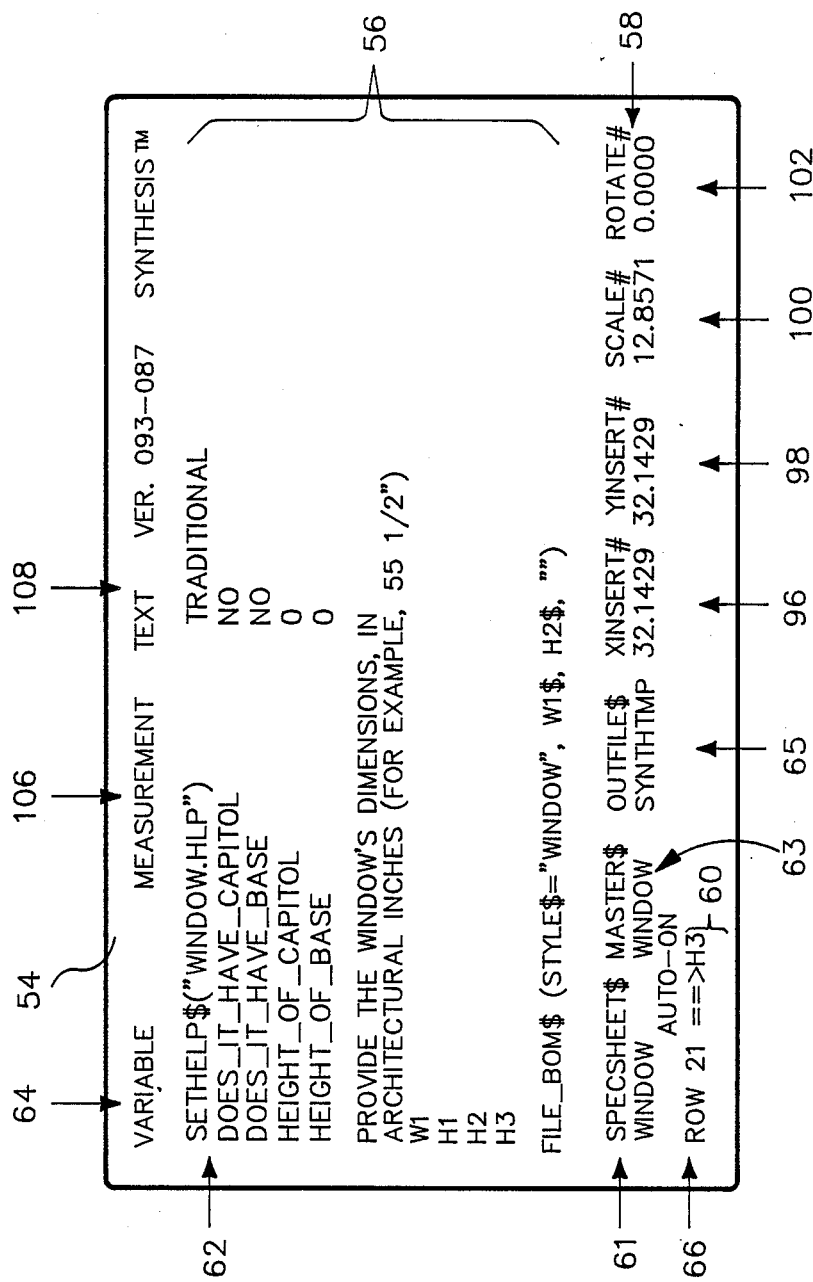
FIG. 14 depicts a CAD-spreadsheet for a window; that specsheet embodies principles of our invention.

The specsheet is composed of three regions: the variables region 56, the master region 58, and the formula region 60 (see FIG. 14).

The variables region has three columns 64, 106, and 108 labeled Variable, Measurement, and Text. A cell of the specsheet is defined by the intersection of a row 62 and a column 64. The row numbers start at 0 and the columns are defined by V for variable, M for measurement, and T for text for cells in the variables region. Thus, the first cell that is usually accessed is V0, the left topmost corner cell.

Cells in the Variable column 64 can contain:
 variables that appear in the master drawing, or master drawings, associated with a specsheet in a given design module; e.g., one for designing a window
 variables local to the specsheet
 messages printed to the end user
 internal comments that document the specsheet
 commands to other specsheets in a multiple design Cells in the Measurement column 106 can contain:
 prompts to the user for design values
 formulas that calculate design values
 table functions to look up values Values computed in the measurement cells govern rectification of similarly-labeled dimensions in the master drawing.

Cells in the Text column 108 can contain:
 formulas that convert design values to dimension text
 formulas that access design tables
 prompts for
 (i) text that will appear in the output designs, or
 (ii) other information necessary to the design Normally, in a stand-alone design module, the variable refers directly to the variable name used in the master drawing. The measurement contains either a number or a formula which can produce a number. The text column contains dimension text which supplants the variable names of the master drawing in the completed drawing.

The designer can: (a) move from cell to cell, editing a cell's formula; (b) execute a specsheet (or group of related specsheets); or (c) edit a different specsheet.

The master region contains three columns 61, 63, and 65 that respectively identify the current specsheet (SPECSHEET$), the master drawing (MASTER$) to which the specsheet is linked, and the output file (OUTFILE$) to which the final drawing is assigned. It also contains the four columns 96 . . . 102 that control the insertion of the master drawing into another design. They determine the x,y-coordinates (XINSERT#, YINSERT#) at which the design is inserted into the supervising design, the scale (SCALE#) used in the supervising engineering design, and the rotation of the current drawing (ROTATION#) when it is placed in the supervising design.

The specsheet utilizes different types of parameters. They are variables, formulas, functions, and commands. Variables are self-explanatory.

Formulas can be either numerical or text expressions that return a value. Numerical formulas are designated with # and text formulas with $. Formulas are defined in a formula line 66. We shall define formulas as anything that computes a value and returns it to a cell. These could be:
 a mathematical expression: width × height
 a prompt: "What is the width of the window?"
 a string concatenation: "John" "Doe"
 a variable Functions also return a value and form a subset of formulas. SIN ($\phi$#) and COS ($\phi$#) are functions, and so is PROMPT, explained below. The trigonometric functions are, of course, numerical functions. PROMPT is a text function which can return a text or numerical value.

Commands, on the other hand, do not return a value. Instead, they direct activity (see Section 1.4b). A command can appear only in the Variable column 64, and it overwrites the other two columns 106 and 108 in the row in which the command is entered. SYNTHESIS executes commands in the order written, just as if they were instructions in a computer program.

§1.4b Capabilities

The CAD-spreadsheet is the engine that drives the design process. Its capabilities include:
 (a) a run-time mode driven by the specsheet The purpose of the specsheet is to establish a design that will be implemented in run-time mode. The designer, in contradistinction to the end user (though the same person may be both), defines prompt functions, PRINT commands, and help screens within the specsheet. This procedure is sometimes referred to herein as the process of editing the specsheet. Once that is established, he/she must leave the specsheet to implement the design in the run-time mode.

Figure 15:
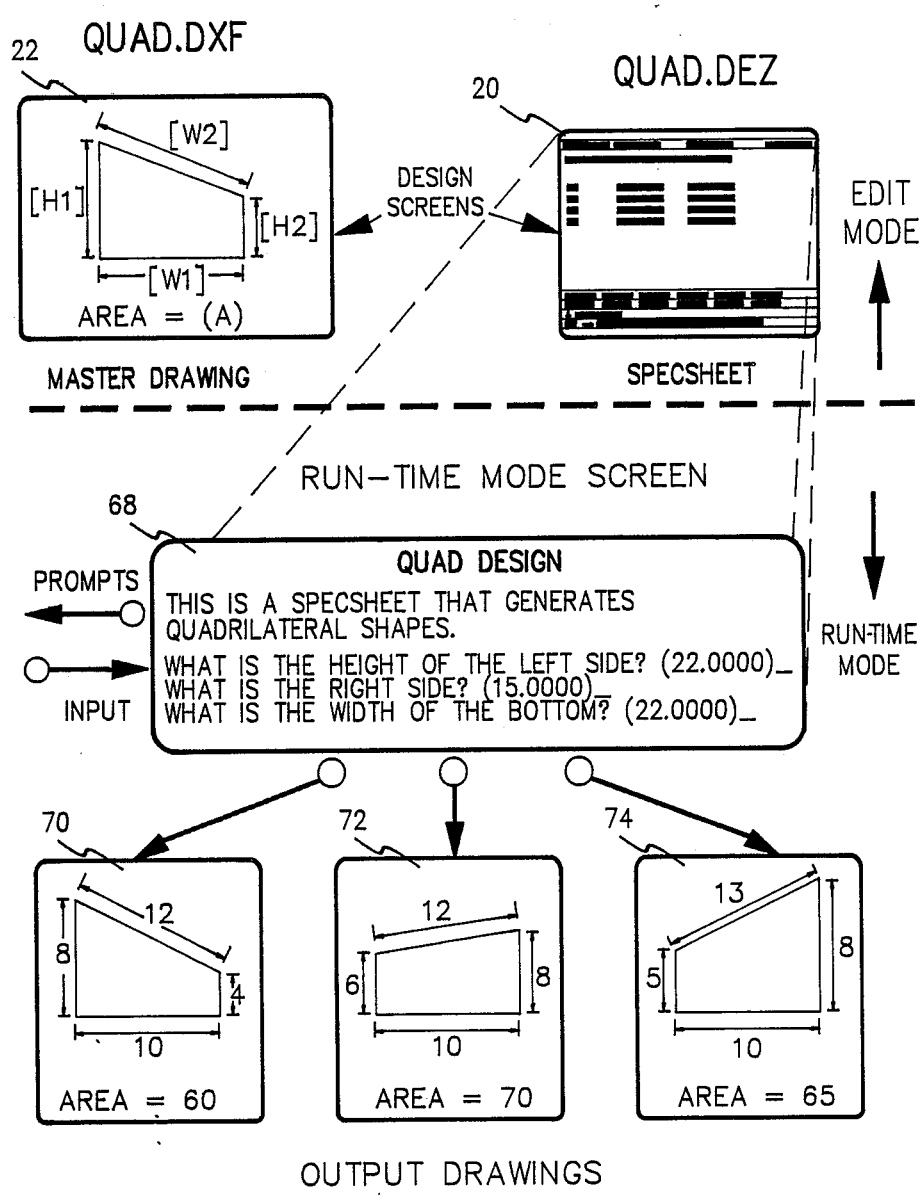
FIG. 15 depicts design (or editing) and run-time modes of operation employed in generating a parametric design in accord with the principles of our invention.

During the design implementation, only the run-time screen 68 (FIG. 15) is evident to the end user. The user sees only a run-time screen of prints and prompts that were defined in the specsheet. The user
   is isolated from the design algorithm
   cannot access the specsheet for editing
   need not possess programming or technical design knowledge
   responds to prompts and provides information FIG. 15 depicts the editing and run-time modes and the constraints on each. Also shown in that figure are three different output designs 70, 72, 74, each generated by using specsheet 20 to rectify master drawing 22.

(1) Prompt functions
defined in the specsheet provide the mode for interaction between the end user and the computer. An example of a prompt is the following; it asks for the width of the quadrilateral:

PROMPT ("What is the width of the quadrilateral?")
to which the user then supplies a value, such as 22. The other prompts provided for in the representative embodiment of our invention defined herein are:

(b) a link to a Master drawing
Values computed in the specsheet automatically replace variables in the Master drawing.

(c) a compiler
that can define and compile functions and commands. Functions are used to compute values within cell formulas. Commands direct activity of the specsheets and are useful in modular design for overwriting rows of formulas in the subordinate specsheet. Examples of functions are SIN (ANGLE#) and COS (ANGLE#), and examples of commands are SP_CALCULATE$ and SP_EXPORT$. Commands will be examined in more detail in (i) and (j) below.

Figure 16:
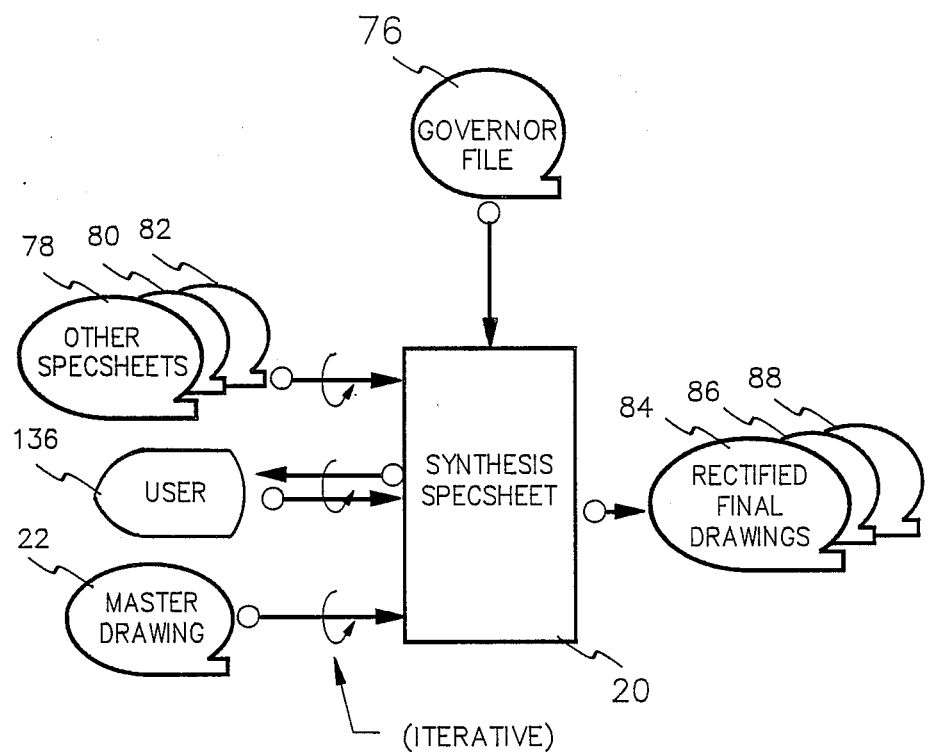
FIG. 16 depicts the function of a novel governor file employed in generating parametric designs in accord with the inventive principles disclosed herein.

(d) a governor file
can pass design parameters to a CAD-spreadsheet and command it to execute the design. When replacement parameters are passed, these override formulas used to compute the normal contents of the specified cells in the CAD-spreadsheet. Thus the governor file can not only issue commands and pass information, but it can also alter the normal design algorithm by overriding cell formulas. FIG. 16 depicts, diagrammatically: a governor file 76; the interaction of the governor file with specsheet 20; the interaction of other specsheets 78, 80, and 82, user 136, and master drawing 22 with specsheet 20; and three different, rectified, final drawings 84, 86, and 88 generated via those interactions.

TABLE 1

| PROMPT FUNCTIONS | |
| --- | --- |
| ERROR(T) | Prints an error message (T) in the same way errors appear in the SpecSheet. |
| PROMPT(T) | Prompts the user for a number. Prints T for the user to read, then waits for input. Returns this input. The default value for a PROMPT( ) is obtained from the Measurement column of the row in which it is used. This function only operates during a full recalculation or during DESIGN mode. |
| PROMPTD(T,N) | Prompts the user for a number with a default. Prints T for the user to read and uses N for a default. If the user inputs nothing, N is returned; otherwise the user input is returned. This function only operates during a full recalculation or during DESIGN mode. |
| PROMPTR(T,N1,N2) | Prompts the user for a number within a range. Prints T for the user to read and waits for input. If the input is less than N1 or greater than N2, an error message is displayed and the function prompts again. The input value is returned. The default value for PROMPTR( ) is obtained from the Measurement column of the row in which it is used. This function only operates during a full recalculation or during DESIGN mode. |
| PROMPTSTR$(T) | Prompts the user for a string. T is printed for the user to read and then the function waits for input. The function returns this input. The default value for PROMPTSTR$( ) is obtained from the Text column of the row in which it is used. This function only operates during a full recalculation or during DESIGN mode. |
| YESNO(T) | Prompts the user with a yes-no question. T is printed for the user to read and then the function waits for either a "y" or an "n". The function returns 1 if "y" was typed or 0 if "n" was typed. This function only operates during a full recalculation or during DESIGN mode. |

(2) a run-time only version
The user, in the run-time mode 68 (FIG. 15), is isolated from the formulas and commands which established the design. SYNTHESIS can be provided separately in the run-time only version by various designers (second parties) as a design program without editing capabilities.

Figure 17A:
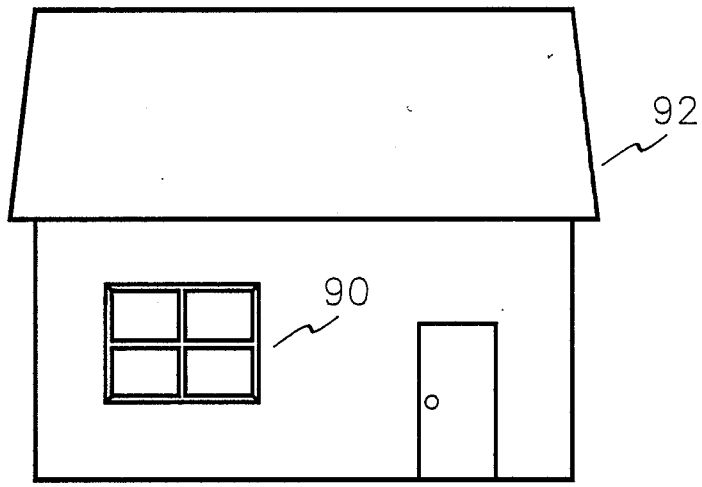
FIGS. 17A and 17B illustrates how the master drawing of a subordinate design module can be incorporated into the master drawing of a higher level design module to generate a parametric design in accord with the principles of our invention; these figures also show how the master drawing of the higher level design module can generate different parametric designs by incorporating therein the master drawings of different subordinate design modules.
Figure 17B:
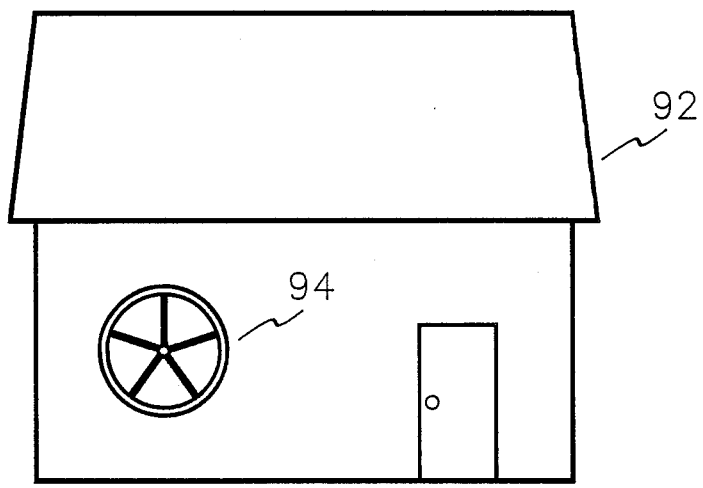

(e) availability of multiple Master drawings
The CAD-spreadsheet can choose which Master drawing to use as a prototype for portraying a design. It has a special cell for the purpose of choosing the particular Master drawing (out of a possible number of Master drawings) to use as a basis for representing its design. For example, FIG. 17A shows a rectangular window 90 employed in a house design 92. A circular window 94 from a different Master drawing is shown in FIG. 17B for the same house. Specsheet 20, in these examples, selected two different master drawings as the bases for windows 90 and 94, respectively.

(f) specific placement (insertion)

The CAD-spreadsheet 20 has other cells 96 . . . 102 (FIG. 18) located in the Master Region 58. Formulas in these cells place, orient, and scale the image of the Master drawing into the output drawing [point of insertion (XINSERT#, YINSERT#), scale factor (SCALE#), and rotation (ROTATE#)].

(g) explicit variable definition

Figure 19:
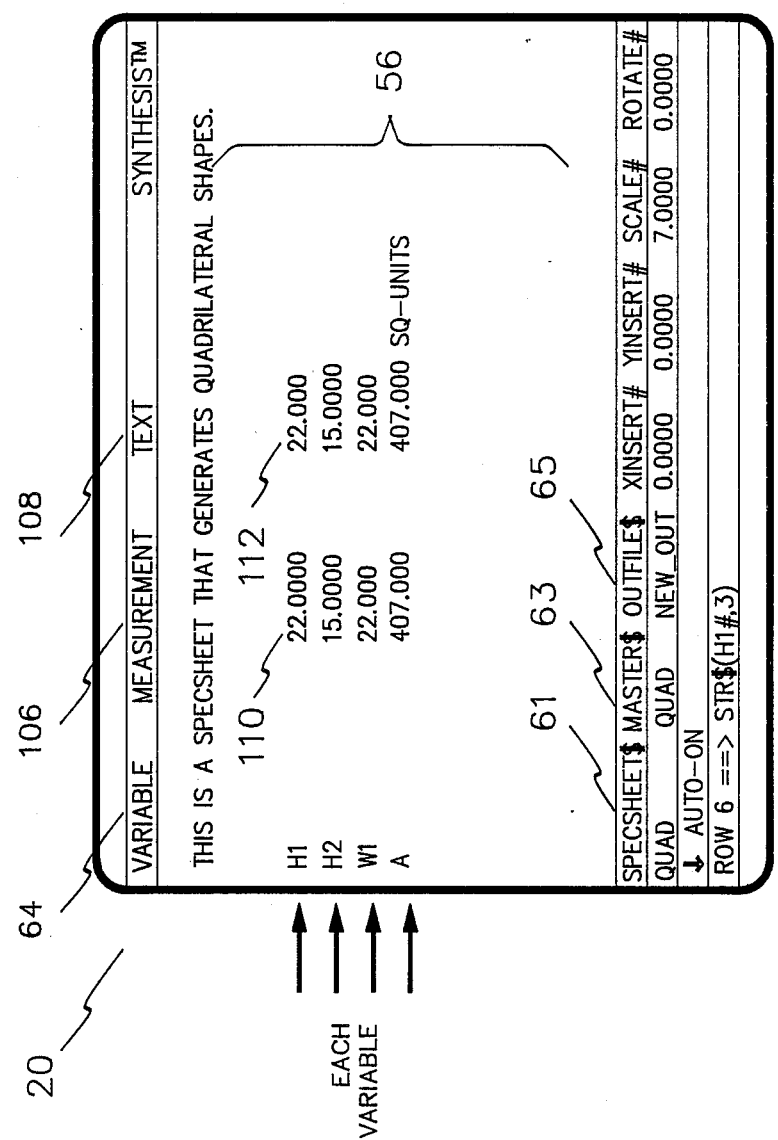
FIG. 19 depicts in more detail the variables region of the CAD-spreadsheet shown in FIG. 1; i.e., that region of the CAD-spreadsheet linked to the associated master drawing; the variables region contains: (a) cells in which values for particulr variables are acquired or calculated, and (b) cells which contain the text placed in a particular parametric design.

Each variable in the Master drawing 22 corresponds to a row of three cells in the Variable Region 62 of the CAD-spreadsheet 20. This region has three columns 64, 106, 108, but it is not limited in concept to such a number, or to the order of the cells described herein. The first column 64 contains the variable name, the second (106) contains its numerical value, and the third (108) contains its text value (FIG. 19). When a Measurement cell (for example, 110 in column 106) is edited before its corresponding text, a formula that converts measurement to text is automatically placed in the corresponding Text cell 112 (column 108). Moreover, this automatic formula is chosen according to the way in which the specsheet is configured. For example, 22.000 in Measurement cell 110 can yield 22.000, 22'-0", or 22" according to the respective formulas in the Text cell 112: STR$(), ARCH$(), or ARCHI$().

A Measurement cell drives measurement changes to the master drawing used to represent the design. A Text cell replaces text in the master drawing used to represent the design.

(h) modularity

The CAD-spreadsheet 20 can direct the activity of other CAD-spreadsheets subordinate to it by altering their normal algorithms. It does so by passing values from the current CAD-spreadsheet to a cell in its subordinate. The formula in the subordinate's cell is overridden in favor of the values passed, just as it is with a governor file.

(i) multiple specsheet commands

Applicants' invention provides the capability of interactions between a supervising module and a subordinate module via the CAD-spreadsheets through the use of the following commands (called multiple specsheet commands because they involve the use of more than one specsheet):

(1) EXPORT
(2) CLEAR
(3) CALC
(4) OUTPUT
(5) INSERT
(6) INSERT_ABS and the following function which may not be unique per se but is unique as employed by applicants:

(7) IMPORT

Figure 20:
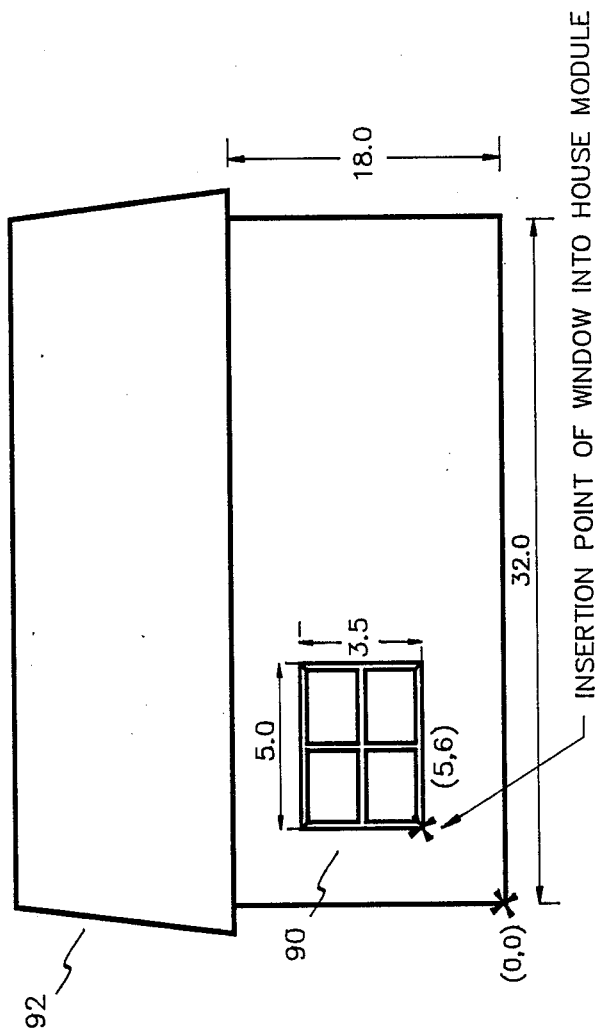
FIG. 20 depicts the insertion of a rectified drawing from one subordinate design module into the rectified master drawing of a higher level design module to generate a parametric design in accord with the principles of the present invention.

These functions are listed in Table 2 below along with a description of what each function accomplishes. But an example of the utility of the INSERT command is given here. A subordinate design module can be placed according to a specific point of insertion defined by the coordinates XINSERT#, YINSERT# and by scale factor and rotation into a principal design module. See FIGS. 20 and 18. This allows for the nesting of parts (or modularity) of the design into other parts. Section 2.2 below contains the explicit procedure for nesting parts of a house into an overall house design.

TABLE 2

FUNDAMENTAL MULTIPLE SPECSHEET COMMAND

SP_EXPORT$(T1,T2,N)
T1: Name of a subordinate SpecSheet.
T2: Name of a measurement cell in the subordinate (for example, "WIDTH#").
N: Number to pass (for example 5.0, or the formula, WIDTH# + 1.5).
Passes a value, N, from the current specsheet to a measurement cell T2 in its subordinate T1. The formula in the cell receiving the value is temporarily overridden in favor of the value passed. Its formula is not lost. A call to SP_CLEAR$ reinstates the original formula in T2 as the means of computing its value.
Ex: SP_EXPORT$("house", "width#", 23.00) sets the variable WIDTH# in SpecSheet "house" to 23.00.
SP_EXPORTSTR$(T1,T2,T3)
T1: Name of a subordinate SpecSheet.
T2: Name of a text cell in the subordinate (for example, "PART$").
T3: Text to pass (for example "Part No. 5-a").
Passes a text value, T3, from the current SpecSheet to a text cell T2 in its subordinate T1. The formula in the cell receiving the value is overridden in favor of the values passed. The previous value of this variable is not lost. A call to SP_CLEAR$ reinstates the cell's original formula as the means of computing its value.
Ex: SP_EXPORTSTR$("house", "width$", "ten") sets the variable WIDTH$ in SpecSheet "house" to "ten".
SP_CLEAR$(T1)
T1: Name of a subordinate SpecSheet.
Clears the overrides set by previous SP_EXPORT$ and SP_EXPORTSTR$ commands by reinstating all the cell formulas in T1 that were temporarily suspended by the previous EXPORT commands.
SP_CALC$(T1)
T1: Name of a subordinate SpecSheet.
Causes a subordinate to compute values according to its cell formulas. In addition, it causes the subordinate to execute all commands that supervise the next level of subordination.
Ex: SP_CALC$("HOUSE") commands the subordinate SpecSheet, "HOUSE", to performs a full recalculation.
SP_OUTPUT$(T1)
T1: Name of a subordinate SpecSheet.
Commands the SpecSheet T1 to outtput its image into the drawing. Note that when a SpecSheet's MASTER$ cell has the value "none", no image is output. This includes SpecSheets referred to by this command (be careful, no warning message is displayed). Note that an explicit SP_OUTPUT$ command is required before a SpecSheet will output a design.
Ex: SP_OUTPUT$("HOUSE") compels the subordinate SpecSheet, "HOUSE", to output its image, unless the house's MASTER$ cell has the value "none".
SP_OUTPUT_MASTER$(T1)
T1: Name of a subordinate SpecSheet.
This command tells SYNTHESIS to output an image of the specsheet T1 that is identical to the last one it output. Only the position of the image is different. This command is used in situations where an identical image is used repetitively in a design or drawing, such as an identical window used in more than one location in a building. Using this command speeds up computation of the subsequent images.
Ex: These three commands,
SP_INSERT$ ("window", 0, 0, 1, 0)
SP_OUTPUT$ ("window")
SP_INSERT$ ("window", 5, 0, 1, 0)
SP_OUTPUT_MASTER$ ("window")
will generate two windows, one five feet to the right of the other. This command is most often used in writing array commands which are identified and described below along with the purposes for which they are employed (see especially TABLE 4.)
SP_INSERT$(T1,N1,N2,N3)
T1: Name of a subordinate SpecSheet.
N1: Relative x-coordinate of insertion of the subordinate's image (relative to the position specified by the current SpecSheet's XINSERT#, YINSERT#).

TABLE 2-continued
FUNDAMENTAL MULTIPLE SPECSHEET COMMAND

N2: Relative y-coordinate of insertion.
N3: Relative angle of rotation (relative to that specified by the current SpecSheet's ROTATE# cell).
This command exports values to all four cells 96 . . . 102 (FIG. 18) in the subordinate specsheet's Master Region. The scale factor of the subordinate specsheet is automatically made the same as that of the current specsheet. Using this command is equivalent to using the commands:
SP_EXPORTSTR$ (T1, "OUTFILES", OUTFILES)
SP_EXPORT$ (T1, "SCALE#", SCALE#)
SP_EXPORT$ (T1, "XINSERT#", <absolute X-coordinate>)
SP_EXPORT$ (T1, "YINSERT#", <absolute Y-coordinate>)
SP_EXPORT$ (T1, "ROTATE#", <absolute rotation>)
SYNTHESIS internally handles the trigonometry that converts the relative position and angle to absolute values. This command ensures that the subordinate's image is always positioned relative to the current specsheet, regardless of whether the current specsheet is, in turn, subordinate to another specsheet.
SP_INSERT_ABS$(T1,T2,N1,N2,N3,N4)
T1: Name of a subordinate specsheet.
T2: Output drawing name.
N1: Absolute x-coordinate of insertion of the subordinate's image into the output drawing or design.
N2: Absolute y-coordinate of insertion.
N3: Scale factor.
N4: Angle of rotation.
This command exports values to all five cells 96 . . . 102 and 114 (see FIG. 18) in the subordinate specsheet's Master Region.
It is equivalent to the combination of the following five commands:
SP_EXPORTSTR$ (T1, "OUTFILES",T2)
SP_EXPORT$ (T1, "XINSERT#", N1)
SP_EXPORT$ (T1, "YINSERT#", N2)
SP_EXPORT$ (T1, "SCALE#", N3)
SP_EXPORT$ (T1, "ROTATE#", N4)

(j) CAD composite commands
can be formed with the single commands in (i) above so as to execute several commands sequentially. For example, insertion of a subordinate design (window 90, FIGS. 20 and 18) into the overall image orchestrated by a supervising module (house 92, FIG. 20), in the location and with the orientation shown in FIG. 20, can be effected by calling on the commands
  SP_INSERT(T1,N1,N2,N3)
  SP_CALC(T1)
  SP_OUTPUT(T1)
individually to respectively specify the position of the window 90 in the house design 92, calculate all formulas in the window specsheet, and then output its drawing. Or, the following composite command defined in Table 3
  SP_INSERT_CALC_OUTPUT(T1,N1,N2,N3)
can be used to circumvent the aforesaid single procedures and achieve the same result. The arguments T1 . . . N3 are defined in Table 3 below. Other commands are also listed.

TABLE 3
CAD COMPOSITE COMMANDS

SP_INSERT_CALC$(T1,N1,N2,N3)
T1: Name of a subordinate specsheet.
N1: Absolute x-coordinate of insertion of the subordinate's image into the output design.
N2: Absolute y-coordinate of insertion.
N3: Angle of rotation.
This is a macro command. Using it has the same effect as using the following two commands together:
SP_INSERT$(T1,N1,N2,N3)
SP_CALC$(T1)
SP_INSERT_ABS_CALC$(T1,T2,N1,N2,N3,N4)
T1: Name of a subordinate specsheet.
T2: Output drawing name.

TABLE 3-continued
CAD COMPOSITE COMMANDS

N1: Absolute x-coordinate of insertion of the subordinate's image into the output drawing.
N2: Absolute y-coordinate of insertion.
N3: Scale factor.
N4: Angle of rotation.
This command has the same effect as using the following two commands together:
SP_INSERT_ABS$(T1,T2,N1,N2,N3,N4)
SP_CALC$(T1)
SP_INSERT_CALC_OUTPUT$(T1,N1,N2,N3)
T1: Name of a subordinate specsheet.
N1: Relative x-coordinate of insertion of the subordinate's image [relative to the position specified by the current specsheet's XINSERT# cell (for example, that identified by reference character 96 in FIG. 18)].
N2: Relative y-coordinate of insertion [relative to the position specified by current specsheet's YINSERT# cell. 98 in FIG. 18].
N3: Relative angle of rotation [relative to that specified by the current specsheet's ROTATE# cell 102 in FIG. 18].
This has the same effect as using these three commands together:
SP_INSERT$(T1,N1,N2,N3)
SP_CALC$(T1)
SP_OUTPUT$(T1).
SP_INSERT_ABS_CALC_OUTPUT$(T1,T2,N1,N2,N3,N4)
T1: Name of a subordinate specsheet.
T2: Output drawing name.
N1: Absolute x-coordinate of insertion of the subordinate's image into the output drawing.
N2: Absolute y-coordinate of insertion.
N3: Scale factor.
N4: Angle of rotation.
This has the same effect as using these three commands together:
SP_INSERTABS$(T1,T2,N1,N2,N3,N4)
SP_CALC$(T1)
SP_OUTPUT$(T1)

(k) customized help features
can be accessed by the user at run-time. The object of this capability is to provide additional information beyond what is available in the normal run-time screen. The designer customizes the help feature by creating a set of help screens which can include both text and graphics. Specifications for a set of pull-down menus can be established so that a user can access the various help screens. To tie the screen to the design, the designer uses the SETHELP command in the CAD-spreadsheet.

For example, a designer can establish help screens that provide window design information for end users. The help file is created by using a text editor to establish pull-down menus and related text and graphics.

In the window specsheet, the help file is established with the command (FIG. 21):
  SETHELP$("window.hlp")
where window.hlp is the name of the help file. The help file establishes a comment line, commands, and help screens.

For example and with respect to the exemplary window design discussed herein, the designer first establishes a help file called window.hlp as follows:

---
window.hlp
---
AUTO-HELP FILE V1.0

:;LAST_LINE
Use ↑ and ↓ to scroll. HOME, END, PgUp and PgDn.
ESC and RETURN to quit.

:;MENU
Window Design Help Menu
Exit help menu

```
window Diagram
window Tables
Engineering data

::SCREEN
window Diagram
```

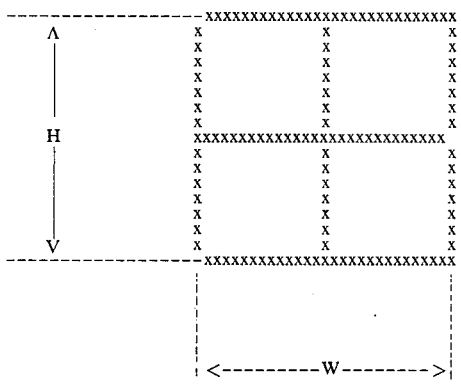

```
::SCREEN
window Table
```

WINDOW DESIGN TABLE

| STYLE | CAPITOL | BASE | HEIGHT OF CAPITOL | HEIGHT OF BASE |
|---|---|---|---|---|
| COLONIAL | YES | YES | 18" | 8" |
| ORNATE | YES | YES | 1'-0" | 1'-0" |
| TRADITIONAL | NO | NO | 0 | 0 |
| FANCY | NO | YES | 0 | 9" |

```
::SCREEN
Engineering data
```

An important factor influencing the life of a window is the preparation of its surface before painting. It is recommended that the surface metal have a surface finish of 8 RMS or better and a minimum surface hardness of RC 40.

Commonly preferred extrusion materials are corrosion resistant anodized aluminum and hard anodized aluminum accepting hard chrome or nickel plate.

The mating componemt should be designed such that there are no sharp edges.

Recommended painting temperature range: −65° F. to 325° F.

Items listed in the HELP menu are either screens or further help menus. If they are screens, they are labeled as such by the screen command
  SCREEN
  <label>
The screen can be graphics or text. The Window diagram is graphics while Window tables and Engineering data are text.

Figure 22:
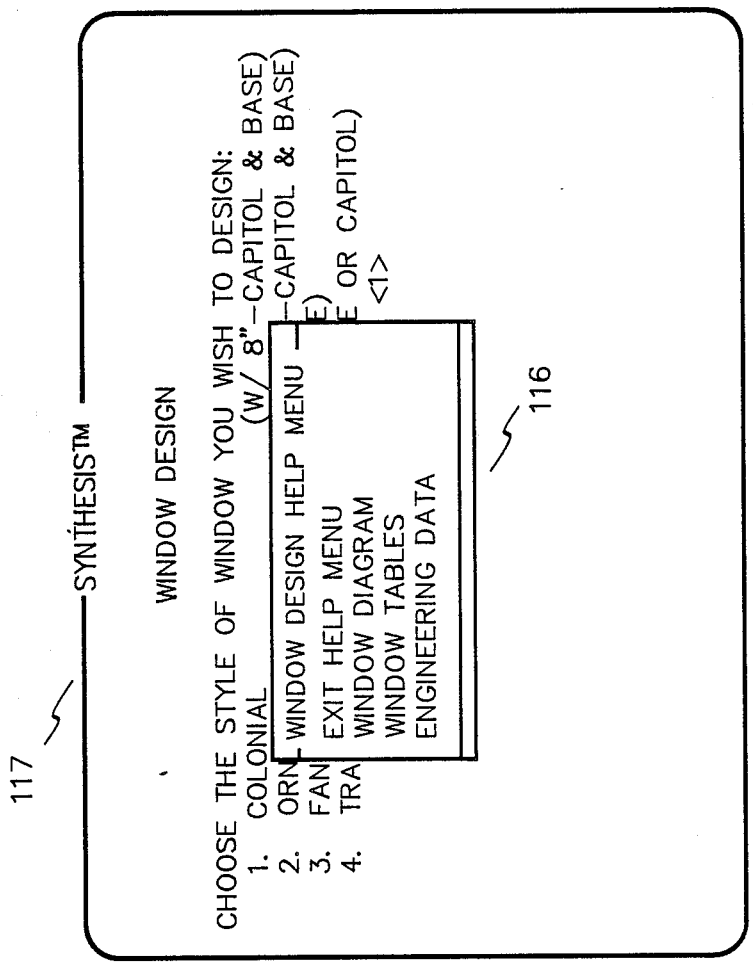
FIG. 22 shows the customized help screen pulled up on the design screen of FIG. 21 to display a customized menu that can be employed by a user to access additional information.

The customized help screen is identified by reference character 116 and shown pulled up atop the window design screen 117 in FIG. 22. The cursor is used to highlight the choice, and then the RETURN key is hit.

Figure 23:
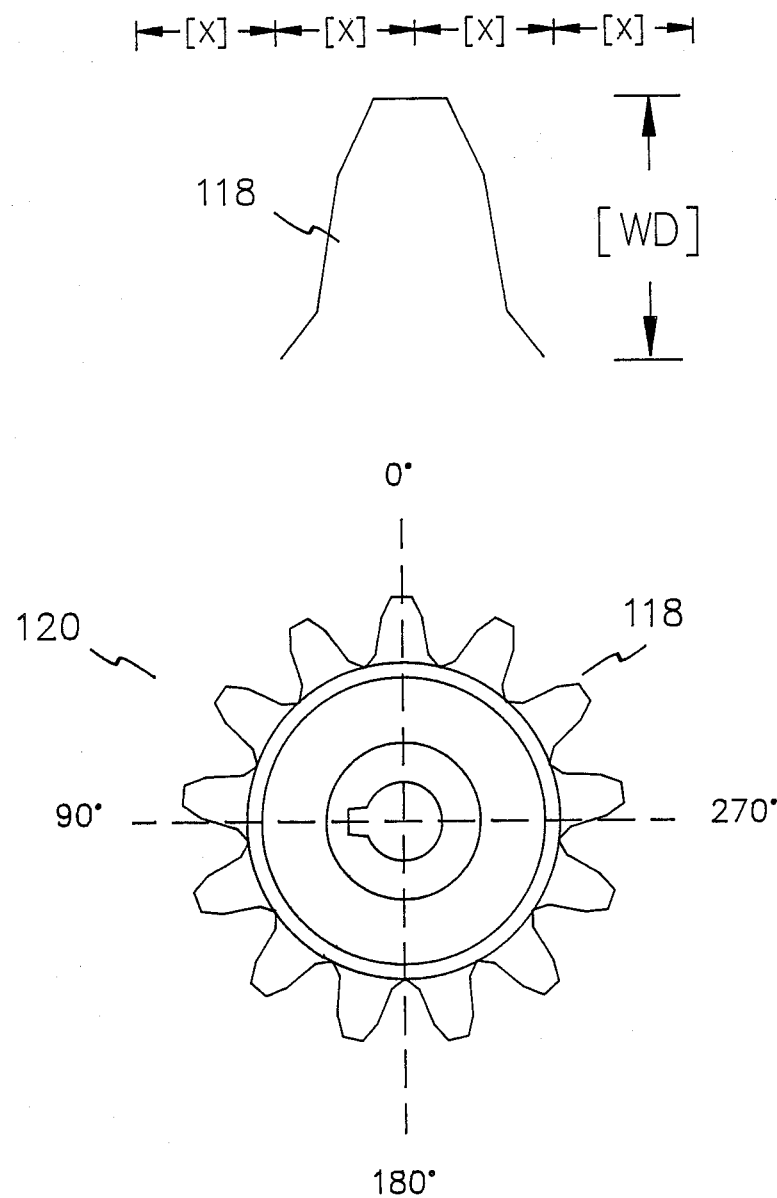
FIG. 23 shows how a rectified image can be repetitively outputted into an array (individual images placed at a different location with a different orientation) to generate a parametric design in accord with the principles disclosed herein.

(l) rectangular and circular arrays
can be designed using two of the various ARRAY commands. As listed in Table 4, these commands, SP_CIRC_ARRAY$(T1 . . . ) and SP_RECT_ARRAY(T1 . . . ), are employed by a supervisory specsheet to cause a subordinate specsheet to execute repeatedly and to respectively output an image into a circular or rectangular array. An example of a circular array is the drawing of a tooth design 118 arrayed into a circle to generate a gear design 120 as shown in FIG. 23. Each gear tooth was output by the same stand-alone tooth design module, the latter being commanded to repetitively output this same design in a circular array by a supervisory (or higher level) gear specsheet.

TABLE 4
ARRAY COMMANDS

SP_CIRC_ARRAY$(T1,N1,N2,N3,N4,N5,N6)
  T1: Name of the specsheet that supplies the elements of the array.
  N1: X-coordinate of the center of the arc.
  N2: Y-coordinate of the center of the arc.
  N3: Radius of the arc.
  N4: Starting angle.
  N5: Number of degrees of arc in the array.
  N6: Number of elements in the array.
Generates a circular array. Each element in the array is rotated to face face the center. The array is defined with 0 degrees at due North and increasing angles counterclockwise.

SP_RECT_ARRAY$(T1,N1,N2,N3,N4,N5,N6)
  T1: Name of the specsheet that supplies the elements of the array.
  N1: X coordinate of the starting point.
  N2: Y coordinate of the starting point.
  N3: Delta-X that defines the distance between columns.
  N4: Delta-Y that defines the distance between rows.
  N5: Number of columns.
  N6: Number of rows.
Generates a rectangular array.

(m) the SYNTHESIS programming language and function/command compiler

Many of the multiple-specsheet functions just listed in (i), (j), and (l) are defined by the SYNTHESIS programming language. Additional functions can be defined for use by designers through the SYNTHESIS language approach. This is a very powerful tool that leads to customized solutions in involved design applications. Such newly defined functions can then be made available to the specsheet editor.

Figure 24:
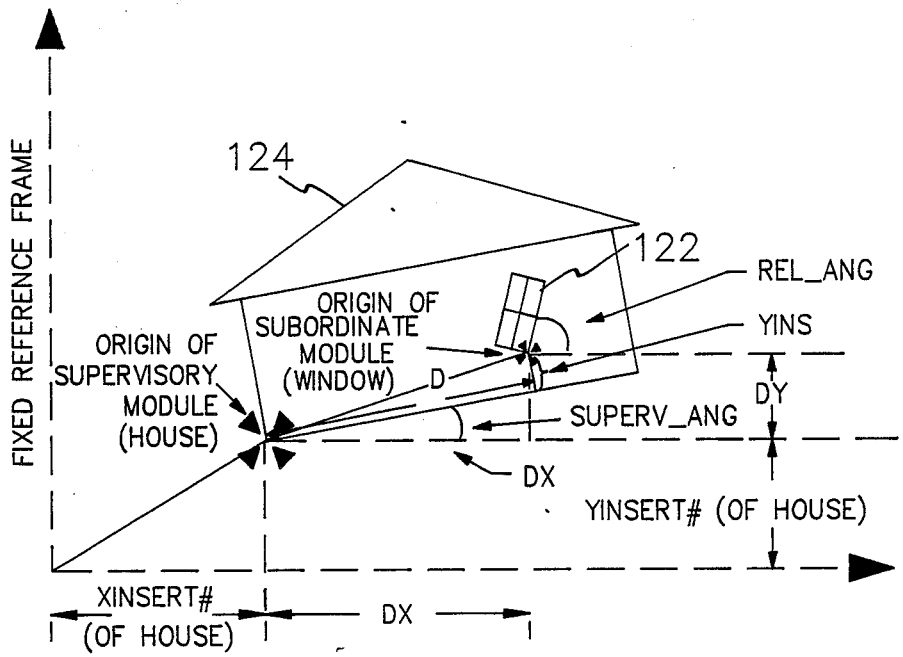
FIG. 24 depicts in more detail the novel, herein disclosed technique for inserting an image from a subordinate module into the image obtained from a higher level module.

The source code for a widely defined and used function of the specsheet editor, SP_INSERT$, accompanied by appropriate comments prefaced by    , follows. Refer to FIG. 24 to see how the Window design 122 is inserted into the House design 124 using SP_INSERT$().

```
FUNCTION PUBLIC
SP_INSERT$(sheet$,xins,yins,rel_ang)
::   xins = the XINSERT# value of the subordinate specsheet,
::   yins = the YINSERT# value of the subordinate specsheet,
::   rel_ang = the ROTATE# value of the subordinate
::   specsheet, relative to the supervising specsheet.
::   sheet$ is the name of the subordinate specsheet.
::   The supervising specsheet calculates the point of insertion of
::   the subordinate module from the origin of a fixed reference
::   frame, i.e., a frame external to the frame of the supervising
::   module. Then the amount of rotation of the subordinate mo-
::   dule is calculated with respect to a reference direction,
::   usually taken to be due east (0°); rotations counterclockwise
::   are positive.
::   The supervising specsheet also exports the MASTERS and
::   SCALES variables.
VARIABLES outname$,scale,theta,d,dx,dy,ref_x,ref_y,
superv_ang,abs-ang;
::   The output file is labeled outname$.
::   Scale is the scale factor of the supervising specsheet.
::   Theta is the angle of insertion of the subordinate module
::   relative to the supervising module.
::   d is the distance from the origin of the supervising module to
::   the point of insertion of the subordinate module.
::   dx is the x-component of d with respect to the fixed reference
::   frame.
::   dy is the y-component of d with respect to the fixed reference
::   frame.
```

```
::  superv_ang is the amount of rotation of the supervising module
::  with respect to the reference direction.
::  ref_ang is the angle the subordinate module has been rotated
::  with respect to the reference direction.
::  superv_ang is given by the GLOBAL command which returns
::  the value held in the current ROTATE# cell of the supervising
::  specsheet.
    superv_ang := GLOBAL("ROTATE#");
::  If the superv_ang is zero, we initialize the following variables.
    ref_ang := rel_ang;
    dx := xins;
    dy := yins;
::  If superv_ang is not zero, then
    IF (superv_ang <> 0) THEN
    ref_ang := rel_ang + superv_ang;
    IF (xins = 0) THEN
        theta := 90;
    ELSE
        theta := ATAN(yins/xins);
    END
    d := SQRT(xins 2 + yins 2);
    dx := d * COS(superv_ang + theta);
    dy := d * SIN(superv_ang + theta);
    END
    ref_x := GLOBAL("XINSERT#") + dx;
    ref_y := GLOBAL("YINSERT#") + dy;
SP_EXPORTSTR$(sheet$, "OUTFILE$",
GLOBALSTR$("OUTFILE$"));
SP_EXPORT$(sheet$, "XINSERT#", ref_x);
SP_EXPORT$(sheet$, "YINSERT#", ref_y);
SP_EXPORT$(sheet$, "SCALE#", GLOBAL("SCALE#"));
SP_EXPORT$(sheet$, "ROTATE#", ref_ang);
RETURN "Specsheet" + sheet$ + "adjusted.";
::  End of program
```

Once the source code for a function is written in the SYNTHESIS language, the function has to be compiled. That is, the source code has to be translated into virtual machine language so that the computer can then act on the commands.

§2 Designing with SYNTHESIS
§2.1 Designing a stand-alone module: the window
§2.1a Establishing the design SYNTHESIS works in conjunction with the AutoCAD tablet and screen menus.

From the main menu of AutoCAD, which follows:
0. Exit AutoCAD
1. Begin a NEW drawing
2. Edit an EXISTING drawing
3. Plot a drawing
4. Printer Plot a drawing
5. Configure AutoCAD
6. File Utilities
7. Compile shape/font description file
8. Convert old drawing file
   Enter selection:___ enter 1, for Begin a NEW drawing. In this example, we call the drawing WINDOW. Using the drawing and editing capabilities of AutoCAD, the designer creates a drawing and dimensions it using variables. The master drawing is shown in FIG. 13C. The drawing is assigned a base point by SYNTHESIS, usually the lower left corner of rectilinear drawings and the lower left corner defined by tangent lines to curvilinear drawings. The base point provides a reference when positioning several images in a composite design [picture]. This procedure is described later. Finally, the designer saves the finished drawing.

As discussed above, the master drawing is the pattern from which eventual images of parametric designs are created. It is modified by the parameters generated by the specsheet. That is, the final design is created through the use of the specsheet. To create a specsheet, SPECSHEET is selected on the tablet menu, (Tablet overlay 224).

Referring back to FIG. 13C, the Window master drawing, the variables H1, H2, H3, and W1 are defined in the Variable column 104 of the Window specsheet 54 (FIG. 25); the same nomenclature thus provides the link between the master drawing and the specsheet.

Each cell of the specsheet in FIG. 25 displays its current value. Each cell also contains a formula, which can be seen by scrolling through the cells to observe the underlying formula in the formula bar at the bottom of the specsheet. Whichever cell is current is highlighted on the specsheet. The formula region 60 contains the numerical and/or text formulas that define the values in the cells. As an example, with the cursor at his terminal in cell V0, the designer types:

PRINT$ ("This is a design program that generates a window.")

which is a text message typed in the formula line 66 and then placed in cell V0. Next, the designer moves the cursor to cells V1-V7 to type the SETHELP$ and prompts for the Window design 126 (FIG. 25). Then he moves the cursor lower to 127 to set up the dimensions of the window, for example:

H1 which is the variable name for the upper casement height of the window. Then, he uses the right arrow key of his keyboard to move the cursor to M12. The measurement column 106 requires a numerical value or a formula that yields a numerical value. Since the value will be input by the end user, a PROMPT function will be used. The designer will type the following into the formula line:

PROMPT ("What is the height of the upper casement?")

and a default value of <0.0000> appears. The designer can enter any number, say 3.0000, and the value will now appear in the M12 cell and the cursor will move to the T12 cell.

The text column produces the actual text as it would appear in the output drawing, usually by converting the numerical value in the measurement column 106 to an appropriate alphanumeric text string such as decimal units, feet and inches, etc. When the cursor is in the T12 cell, the designer may type

STR$(H1#,4)

which is a text conversion formula that defines H1 to 4 decimal places.

SYNTHESIS automatically places a formula in a text cell whenever the corresponding measurement cell is edited. In fact, when either of these cells (measurement or text) is first edited, a formula is automatically placed in its sister cell. The following formulas were automatically placed in text cells corresponding to the variables WIDTH and HEIGHT, when values were placed in the corresponding measurement cells by the designer:

ARCH$(HEIGHT#)
ARCH$(WIDTH#)

These formulas convert between a number's textual representation and its numerical value, and can be overwritten if the user wishes to place another formula in the cell. The choice of formula is user-configurable. The user can choose various types of conversion formulas, or have none at all. For example, a formula can be established that will convert 4'3" into a metric value of 1.3 meters.

In a fashion similar to the procedure discussed above, the variables H2, H3, and W1 can be defined in the specsheet. The design stage of generating a stand-alone parametric design of a window is now completed.

§2.1b Executing the design (the run-time mode)

To execute the design, the designer now becomes an end user. He must exit the specsheet, which is an editing mode, and enter the separate run-time mode. From the SYNTHESIS tablet menu 224 shown in Appendix G, he chooses DESIGN. Thereupon, the designer is asked for the name of the design to execute. In this example, the user chooses to execute the Windows parametric design. He is prompted for dimensions and specific information relating to the Windows design. When the user has finished answering the prompts, the finished drawing, incorporating all the necessary data, will be displayed as an accurate representation of the window (for example, window 50 in FIG. 13C). Note that the user cannot access either the window design specsheet 54 (FIG. 14) or the window master drawing 48 (FIG. 13C) (which are edit-mode capabilities) while he is in the run-time mode. The user can only work in one mode at a time and therefore cannot inadvertently change design formulas in the specsheet file while executing a parametric design.

Figure 26:
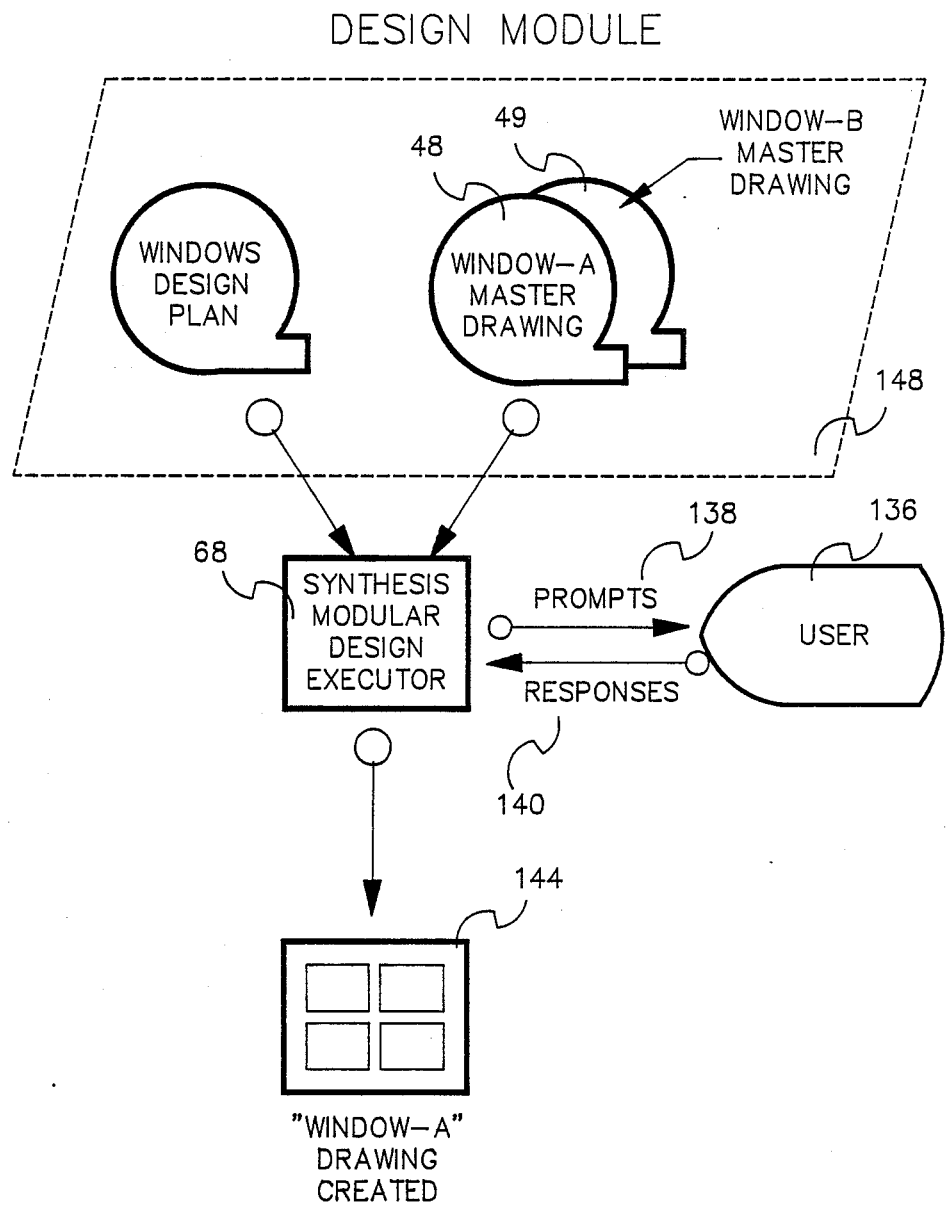
FIG. 26 is a flow diagram of the process employed in designing a window using the master drawing shown in FIG. 13C and the design plan illustrated in FIG. 25.
Figure 45:
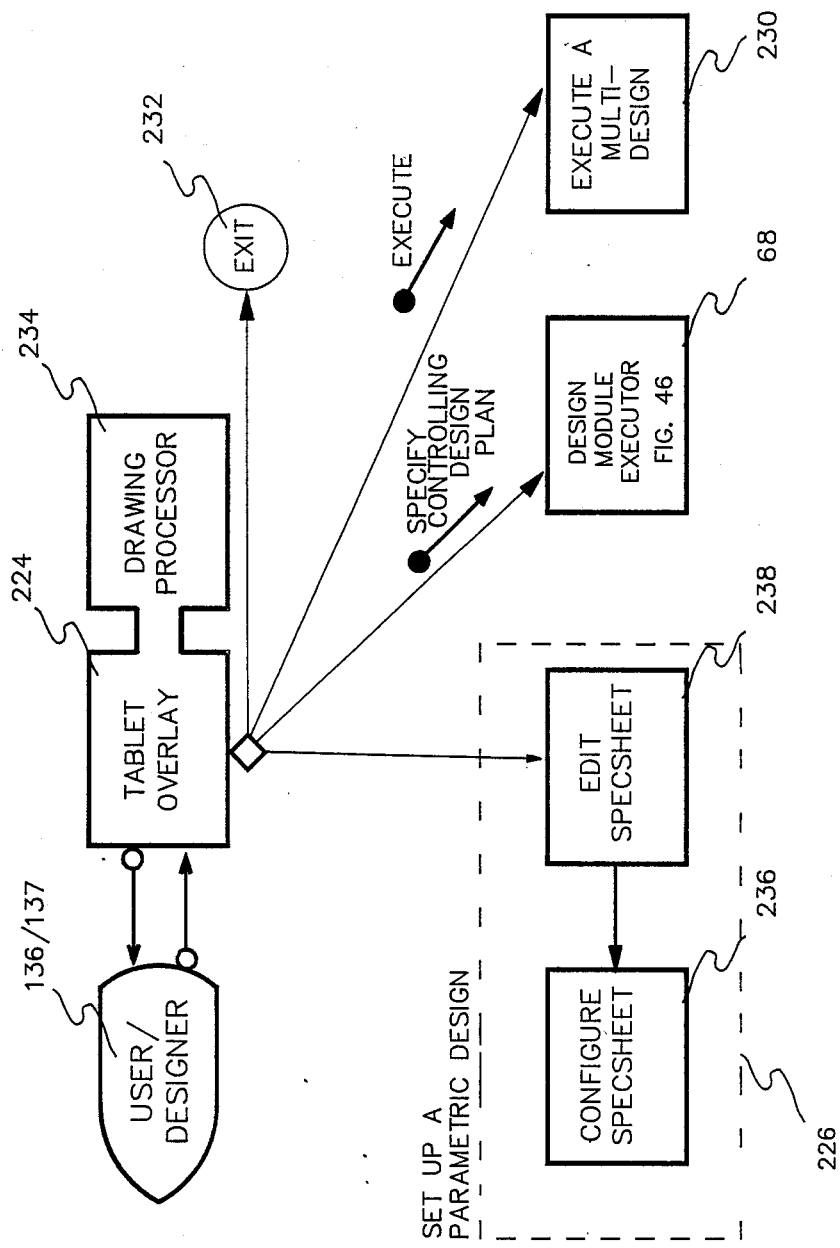
FIG. 45 is a block diagram showing the configuration of capabilities provided in setting up and executing a parametric design.

FIG. 26 is a schematic drawing depicting the general process involved in the execution of the window design. Through prompts to and responses from the user 136 (indicated generally by arrows 138 and 140), the master drawing 48 of the window design is combined with the data from the window specsheet 54 files in the design module executor 68 (FIG. 45) to create a completed drawing 146 (FIG. 27A) or 144 (FIG. 27B) of a window.

Figure 27A:
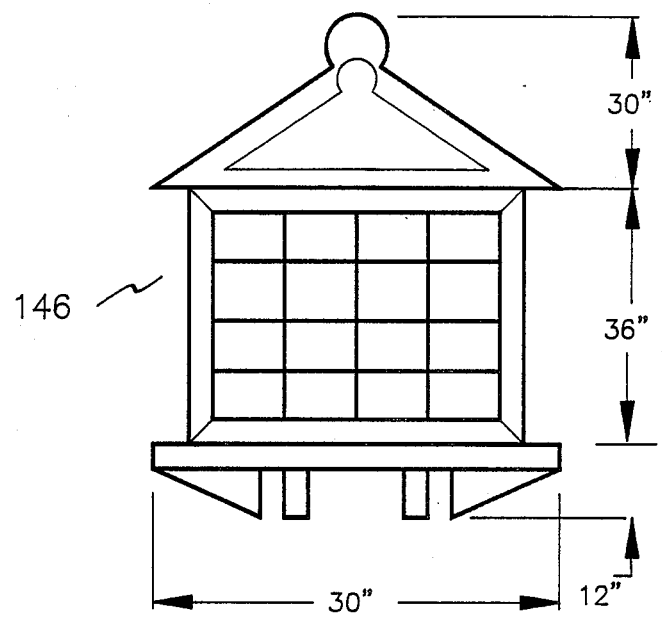
FIGS. 27A and 27B show two different windows designed by the process depicted diagrammatically in FIG. 26.
Figure 27B:
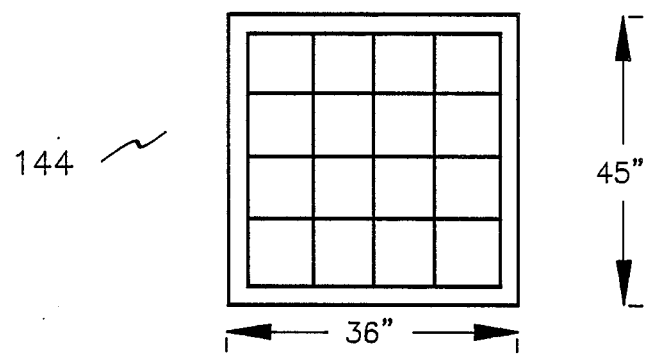

The Windows design module 148 (FIG. 26) is a single module. All single modules have two elements: a specsheet and master drawings. The design module executor 68 chooses between the available master drawings if there is more than one, as in this example where there is a choice of window styles (Window design module 148) and a different master drawing (48 or 150, see FIG. 26) for each window style. The user interacts with the window design module 148 through prompts and responses. Different finalized drawings derived from different master drawings are shown in FIGS. 17A and 17B and identified by reference characters 90 and 94. FIGS. 27a and 27b show window designs 146 and 144 generated from the same master drawing.

The module can stand by itself (§2.1: the window) or be used as part of another module (§2.2a: The House) or as part of a computer program (§2.2b: The governor file). And the transition from being a stand-alone design to being a part of an overall design is easily accomplished because of the inherent modularity of the parametric design scheme SYNTHESIS utilizes.

§2.2 Modular design: the House

§2.2a Using SYNTHESIS's Multiple Specsheet Commands

FIG. 28 shows the design screen 149 that the end user sees when doing the modular house design. It was set up by a House specsheet 150 (FIG. 36). The exemplary house design will be discussed below to illustrate how applicant's novel system and process are employed to generate a more complicated parametric design than that of the just described window. The house will have two different windows respectively located on the front and one side of the house, a door, walls, and a roof. The widths of the door, windows, and overall house width are prompted for in Part 1 of the house specsheet (FIG. 36). The dimensions are in architectural inches or feet and inches.

I. The subordinate modules

The modular house design drawing is established by incorporating rectified images from the roof, wall, door, and window subordinate modules. The house specsheet 150 is defined as a supervisor which directs the placement of the subordinate modules into the house design (the multiple specsheet capability). It does this by using the SP_INSERT$ command. That command tells the Window design where to insert its base point (at the window's lower left corner) with respect to the house's base point (also at the house's lower left corner) as per the two cells, XINSERT#, YINSERT#, within the house specsheet. SP_INSERT$ overrides the scale factor of the Window design, and it determines the rotation of the window relative to the house. The command carries out the same procedure for all of the other subordinate modules (walls, door, and roof).

A. The Wall (FIG. 29)

In the edited Wall specsheet 156, the variables of the Wall master drawing (not shown) have values specific to its stand-alone design of:

W1=11'-0" for the front width of the house
W3=17'-0" for the side width of the house
H1=8'-0" for the height of the walls
W2=7'-0" for a hidden variable that provides space in the Wall master drawing for the roof overhang.

The Text cell values reflect the conversion of the decimal values of the Measurement cells into architectural units (feet-inches).

The cells in the master region 158 of the edited wall specsheet 156 contain the following information which will be used (or replaced by the supervisory specsheet) in drawing the front and side walls 159 and 160 of house 162 (FIG. 37) to the proper scale in generating the front and side views 152 and 154 of the house:

XINSERT#=0.0000

YINSERT#=0.0000

SCALE#=10.0000

ROTATE#=0.0000

Figure 31:
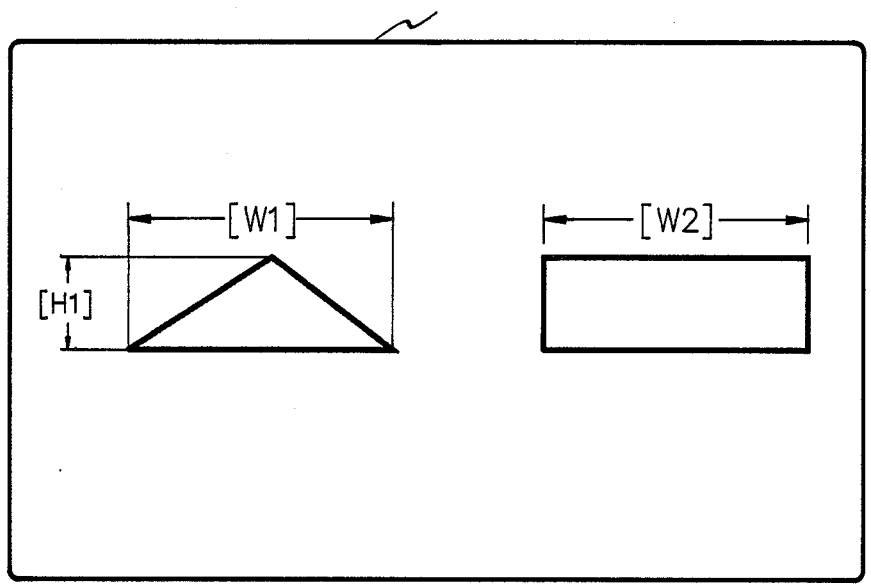
FIG. 31 depicts the master drawing of the roof module.

B. The Roof (FIGS. 30 and 31)

The values of the roof dimensions specific to its stand-alone design are computed by the edited roof specsheet 164 (FIG. 30) as:

W1=22'-0" for the front width of the roof
W3=19'-0" for the side width of the roof
H1=10'-0" for the height of the roof
W2=3'-0" for the hidden variable that separates the two views and the master region 166 for the roof specsheet 164 shows:

XINSERT#=−24.0000

YINSERT#=120.0000

SCALE#=10.0000

ROTATE#=0.0000 given in inches. The Roof master drawing 166 is shown in FIG. 31.

Figure 33:
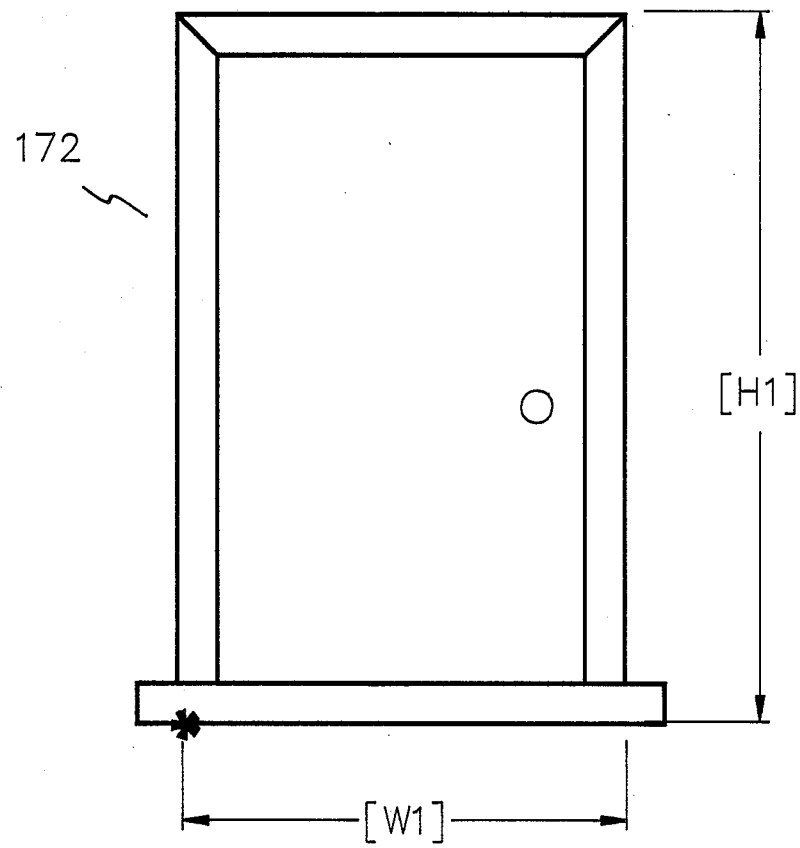
FIG. 33 is the master drawing of the door module.

C. The Door (FIGS. 32 and 33).

The edited door specsheet 168 defines the dimensions of the door specific to its stand-alone design in architectural inches:

W1 = 42" for the width of the door
H1 = 80" for the height of the door and in the master region 170 the door has values:

XINSERT# = 67.5000

YINSERT# = 0.0000

SCALE# = 10.0000

ROTATE# = 0.0000.

The Master drawing 172 for the door is shown in FIG. 33.

D. The Windows (FIGS. 34 and 35)

Normally, the window design module prompts for width, height, and style. When used in a modular design, it is supervised by the house specsheet 150 (FIG. 36). The house specsheet 150 passes to the window specsheet everything but the window's style and height.

Figure 37:
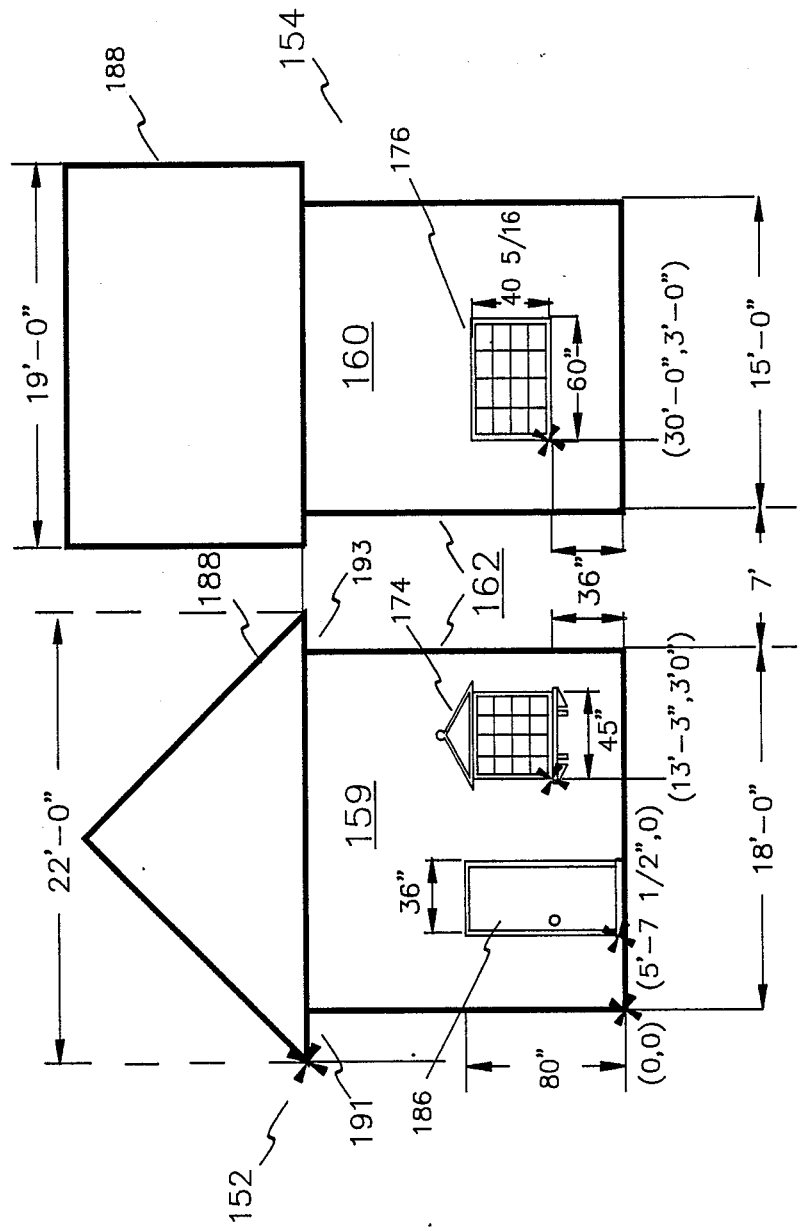
FIG. 37 depicts the final house design generated in accord with the principles of our invention by importing into the master drawing of the house design module images obtained by rectifying the master drawings of the wall, window, roof, and door design modules.

The overall layout of the Window specsheet 54 is the same for both the front and side windows 174 and 176 of house 162 (FIG. 37). (This underscores the versatility and advantages processed by applicants' herein disclosed system and process for generating parametric designs.) To perform a design for either the front window 174 or the side window 176 entails the user answering the prompts as to whether to incorporate the upper and lower casements (or capitol and base) 178 and 180 (see FIG. 13C). The house specsheet 150 (FIG. 36) then calculates the insertion points of the respective windows 174 and 176 into the appropriate walls 159 and 160. FIG. 34 is the Window specsheet 54a showing its specific stand-alone values for the front window 174:

W1 = 6'-0" for the width of the window proper
H1 = 1'-0" for the height of the capitol
H2 = 4'-4" for the height of the window proper
H3 = 1'-0" for the height of the base The master region 182 of the edited specsheet 54a for the front window 174 displays the values:

XINSERT# = 5.0000

YINSERT# = 15.0000     [Eq. 2.2-1]

SCALE# = 7.0000

ROTATE# = 0.0000.

FIG. 35 is the edited specsheet 54b for the side window 176 (no capitol, no base) and shows its specific stand-alone values:

W1 = 36" for the width of the window
H1 = 0" for the height of the capitol
H2 = 40 5/16" for the height of the window proper
H3 = 0" for the height of the base

[Note that the just discussed designing of side window 176 involves applicants' novel technique of deleting parts from a master drawing by dimensioning those parts (here capitol 178 and base 180, FIG. 13C) to zero].

The Master region 184 of specsheet 54b displays:

XINSERT# = 32.1429

YINSERT# = 32.1429     [Eq. 2.2-2]

SCALE# = 12.8571

ROTATE# = 0.0000.

Applicants pointed out above that the Window master drawing 48 is shown in FIG. 13C.

II. The supervising design module: the House (FIG. 36)

The House specsheet 150 leads off with comments on the design of the house 162 (FIG. 37). The front wall 159 of house 162 incorporates the ornate front window 174 and the door 186, both designed as discussed above. The side wall 160 has only a standard window 176, the design of which has also been discussed. Also included, of course, are the walls 159 and 160 and roof 188, again designed by an already discussed technique. The dimensions are in architectural feet or inches.

In this discussion, the house specsheet 150 is divided into parts depending on the specific purpose for which that part of the specsheet is being employed.

Part 1 of the House specsheet, depicted in FIG. 36, sets the widths of the door 186, windows 174 and 176, and the front and side walls 159 and 160 of the house 162 (FIG. 37)

Part 2 of the House specsheet 150, shown in FIG. 36, depicts the supervision of a subordinate design, the front window 174.

The House specsheet 150 defines the x-coordinate of insertion (X_WINDOW_POS#) of the front window design. That is, the bottom left corner of the front window is inserted at the x-position of 13'-3", where the origin is defined as the lower left corner of the front wall 159 of the house 162.

Using the SP_EXPORTSTR$ command, the House specsheet 150 identifies the subordinate specsheet 54a it directs (window), identifies which Text cell it will override (W1$), and passes the value WINDOW_WIDTH$ defined in Part 1 of the House specsheet 150 to the window specsheet 54a. WINDOW_WIDTH$ was defined as 45" and that value supplants the value 6'-0" shown for W1 in FIG. 34.

The SP_INSERT_CALC_OUTPUT$ command causes subordinate specsheet 54a (Window) to calculate formulas within its cells and output an image that is inserted in the house design at the x-coordinate, X_WINDOW_POS#*12 (its position in inches), the y-coordinate, 3.0*12 (in inches), and at zero angle of rotation. The insertion parameters are relative to the values in the master region 190 of the House specsheet 150 (which are XINSERT# = 0.0000, YINSERT# = 0.0000, and ROTATE# = 0.0000.)

The height can be prompted for in the House Design Screen 149 (FIG. 28, region 2), or the design can utilize the value 181 present in the subordinate specsheet 54a (FIG. 34).

Part 3 (FIG. 36) governs the design of the side window 176.

The x-coordinate of insertion of the side window 176 is defined by X_WINDOW_POS_SIDE as 30'-0". In other words, the lower left corner of the side window 176 is placed horizontally to scale 30 feet to the right from the lower left corner of the front wall 159 of house 162 (the origin of the governing design). This can be seen in the final design (FIG. 37).

Analogous to the front window design, the export string command exports to the window specsheet 54b the value of 60" calculated by SIDE_WINDOW_

WIDTH$ to supplant the value 36" in the Text cell of the variable W1.

And as in the front window design, SP_INSERT_CALC_OUTPUT$ directs the Window specsheet 54b as edited to design side window 176 to calculate and output an image that is inserted into the house design at X_WINDOW_POS_SIDE#*12 (in inches), 3*12 (in inches for the y-coordinate), with no rotation, relative to the house design's origin and orientation.

The height can be prompted for in the House Design screen 149 (FIG. 28, region 3), or the design can utilize the value 183 present in the subordinate specsheet 54b (FIG. 35).

Note that 54a and 54b are only different manifestations (i.e., prompt choices) of the window specsheet 54 (FIG. 25).

Part 4 of House specsheet 150 (FIG. 36) dictates the design of the front and side walls 159 and 160. The export commands pass values defined in the House design to the subordinate wall design, overriding the current values in the Measurement cells 192 . . . 198 of the wall specsheet 156 (FIG. 29).

SP_EXPORT$("wall", "W1#", FRONT_WIDTH_OF_HOUSE#) passes the value FRONT_WIDTH_OF_HOUSE=18'-0" defined in Part 1 of the House specsheet 150 to the Wall specsheet 156, overriding the value of W1=11 in the Measurement cell 192 of the latter (FIG. 29).

SP_EXPORT$("wall", "W2#", 7) passes the value 7 for W2 to Measurement cell 194 of the Wall specsheet 156. This is the same value currently residing there.

SP_EXPORT$("wall", "W3#", SIDE_WIDTH_OF_HOUSE#) passes the value SIDE_WIDTH_OF_HOUSE=15'-0" defined in Part 1 of the House specsheet 150 to the Wall specsheet 156, overriding the value of W3=17 in the Measurement cell 196 of the latter.

SP_EXPORT$("wall", "H1#", 10.0) passes the value 10 for H1 to the Wall specsheet 156. It supplants the value of 8.0000 currently residing in the Measurement cell 198 there.

SP_INSERT_CALC_OUTPUT$("wall", 0,0,0) directs the Wall specsheet 150 to calculate its formlas based on the values passed to it by the export commands of the House specsheet and then output an image that is inserted into the House design at XINSERT#=0.0000, YINSERT#=0.0000, and zero rotation.

The foregoing shows how a value can be exported from one specsheet to another in accord with the principles of our invention to override a value (or other contents) of a cell in the subordinate specsheet. This discussion also demonstrates that, while not required, values already residents in the cells of the subordinate specsheet, can also (or instead) be employed in generating the rectified, final design from the master drawing of the subordinate design module.

Part 5 of the House specsheet 150 (FIG. 36) designs the door 186 of house 162.

A variable, DOOR'S_X_COORDINATE#=5'-7½", is defined labeling the lower left hand corner of the door 186.

SP_EXPORTSTR$("door", "W1$", DOOR_WIDTH$) exports the value DOOR_WIDTH$=36" defined in Part 1 to the Door specsheet 168, supplanting the text value of 42" for W1 (FIG. 32).

The SP_INSERT_CALC_OUTPUT$ directs the Door specsheet 168 to calculate and output its image, which is then inserted into the house at position DOOR'S_X_COORDINATE#*12 (in inches), and at values of 0.0000 for the y-coordinate and rotation, with respect to the house origin.

Part 6 of the House specsheet 150 (FIG. 36) oversees the design of the roof 188 of house 162.

SP_EXPORT$("roof", "W1#", FRONT_WIDTH_OF_HOUSE#+4) passes to the Roof specsheet 164 the value 22'-0", which is the sum of the values, 18'-0", for the width of the front wall 159 of the house 162 (defined in Part 1), and 4', the total roof overhang composed of the overhang 192 at the left-hand end of the house (FIG. 37) and the equal overhang 194 at the right-hand end.

The other export commands pass the values for W2, the distance between the front and side views 152 and 154 of FIG. 37; W3, the side width 160 of the house+4', and H1, the height of the roof 188.

All of these values are equal to what was originally set in the Roof specsheet 164. Thus, no values were overridden.

The SP_INSERT_CALC_OUTPUT$ inserts the lower left corner of the roof design at −24" (i.e., 2 feet to the left of the origin of the House design) and 120" (y=10 feet), and no rotation.

Part 7 (FIG. 36) is the master region 190 of the House specsheet 150. Note that

XINSERT#=0.0000

YINSERT#=0.0000     [2.2-3]

SCALE#=10.0000

ROTATE#=0.0000.

All of the insertions of the subordinate specsheets 54a, 54b, 156, 164, and 168 are relative to the values set in the House specsheet 150 in accord with equations [2.2-3]. The scale factor of the House specsheet 150 overrides whatever scale factor the individual specsheets may in fact have.

FIG. 37, as indicated above, shows front and side views of the final house design generated by using the House specsheet, edited in the manner just discussed, to rectify the House master drawings. FIG. 37 depicts the placement of the individual modules with respect to the origin of the supervising design. Each module is marked by spokes to identify its reference point with which it is placed into the overall design. The House module defines the origin for the subordinate modules; note that it is convenient to define the wall module with the same origin. Dimensions are also given to elucidate the placement of the modules.

Figure 38:
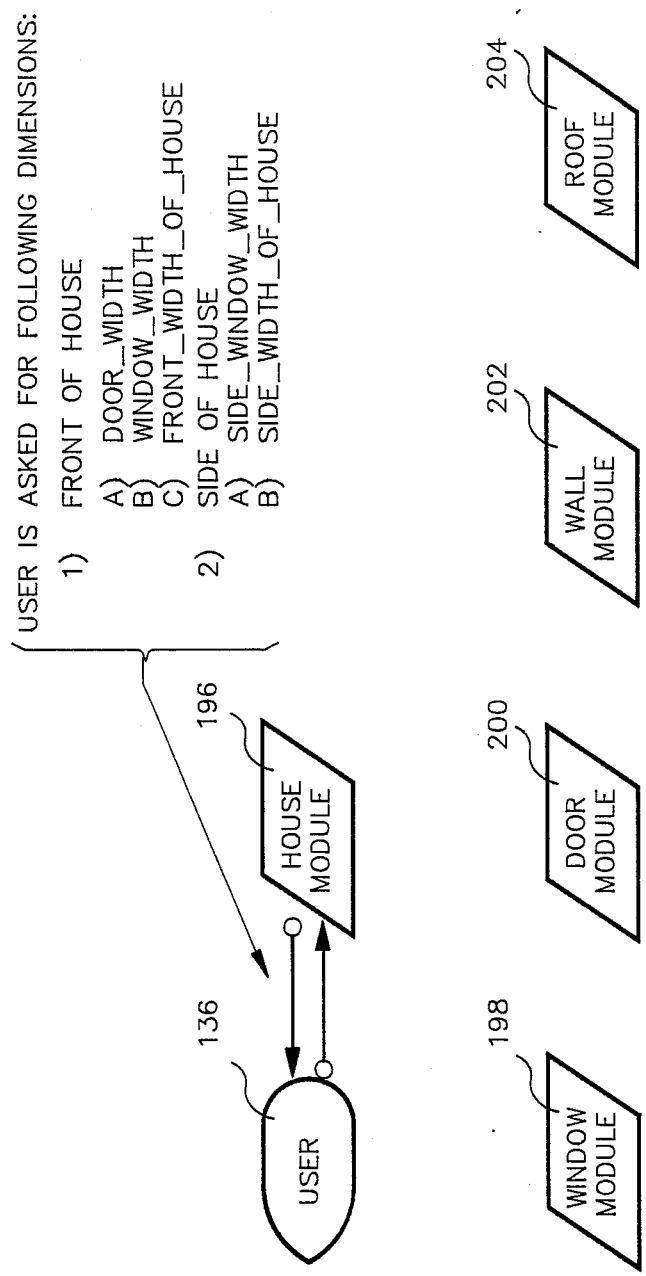
FIG. 38 shows, diagrammatically, the prompts to which the user responds in designing the house illustrated in FIG. 37.
Figure 39:
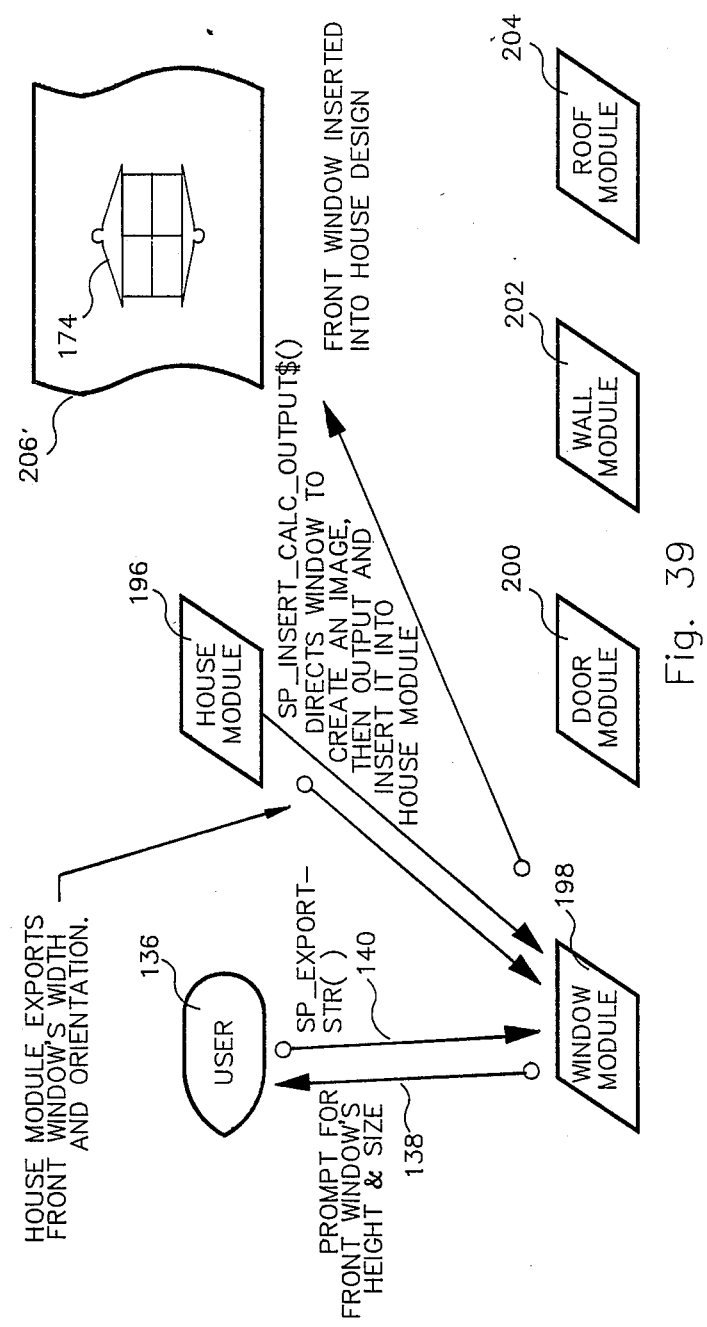
FIG. 39 shows, schematically, the steps employed by the user in designing the front window of the house illustrated in FIG. 37.
Figure 40:
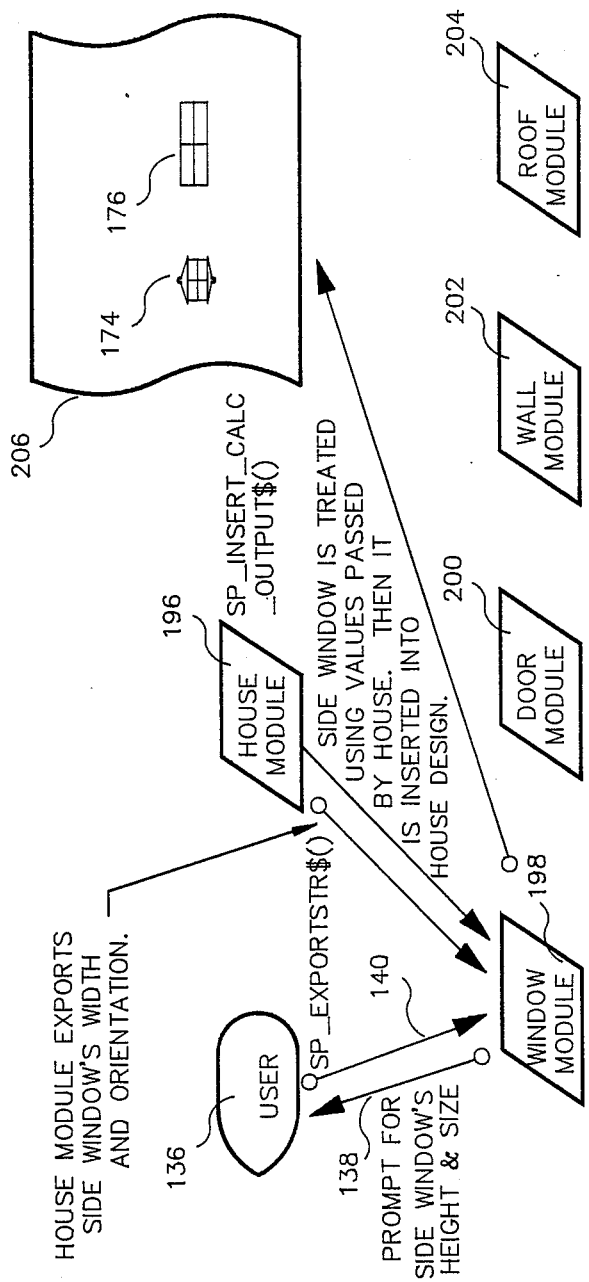
FIGS. 40-43 are illustrations similar to FIG. 40 showing the steps employed by the user in respectively designing the side window, wall, door, and roof of the house.
Figure 41:
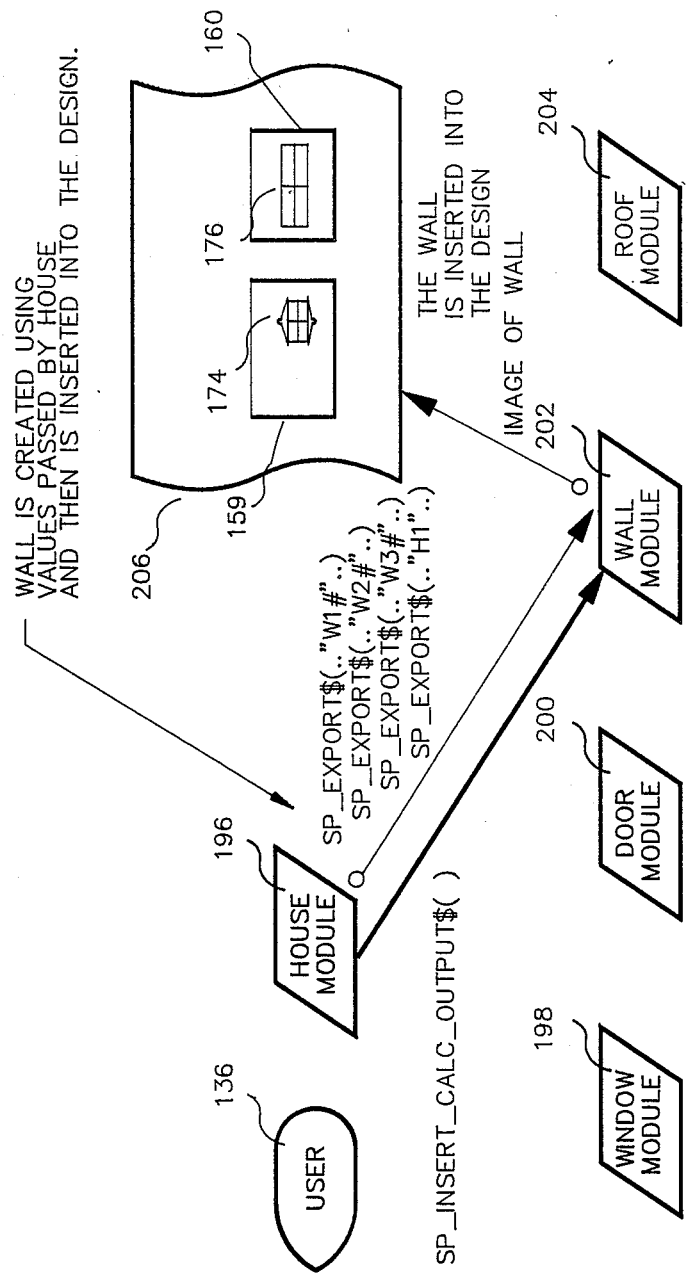
Figure 42:
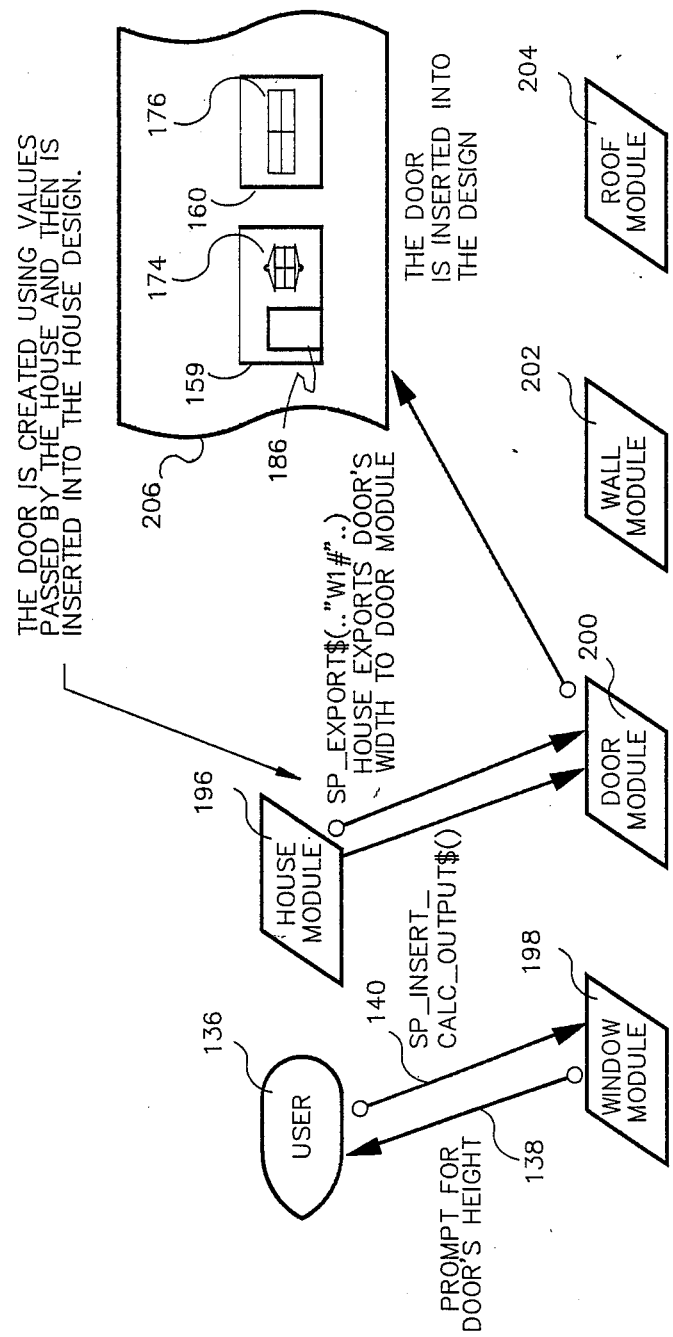
Figure 43:
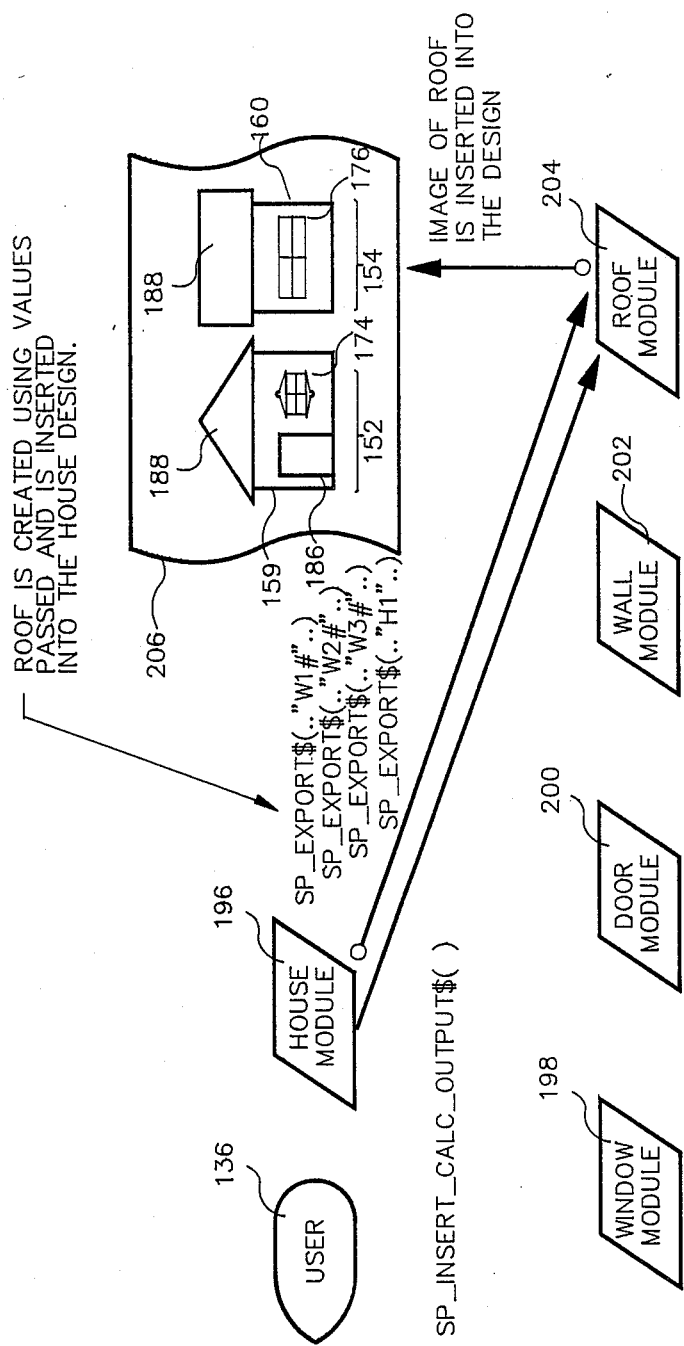

The complete modular process of designing the house 162 is summarized by the schematic diagrams given in FIGS. 38–43. FIG. 38 shows the use of the prompt functions. FIG. 39 shows the process involved in designing and incorporating the front window 174. FIG. 40 shows the process involved in incorporating the side window 176. FIGS. 41–43 respectively show the procedures invoked in designing the front and side walls 159 and 160, door 186, and roof 188.

Reference has been made on several occasions in discussing the process of designing the house 162, and in FIGS. 38–43, to modules employed in designing the house and its subordinate elements—front and side windows 174 and 176, front and side walls 159 and 160, door 186, and roof 188.

It was also pointed out above that each of these design modules is composed of a specsheet (or design plan) and one or more master drawings. The design modules employed in the design of house 162 and the components of those modules are shown below in TABLE 5.

TABLE 5

DESIGN MODULES FOR HOUSE 162.

| DESIGN MODULE | REFERENCE CHARACTER (FIGS. 38–43) | EDITED SPECSHEET REFERENCE. CHARACTER/ FIGURE | MASTER (or FINAL) DRAWING REFERENCE. CHARACTER/ FIGURE |
|---|---|---|---|
| House | 196 | 150,36 | 162/37 |
| Window | 198 | 54a,b/34,35 | 48,50/13c |
| Door | 200 | 168/32 | 170/33 |
| Wall | 202 | 156/29 | Not Shown |
| Roof | 204 | 164/30 | 166/31 |

The user is again identified in the figures depicting the design of house 162 by reference character 136, and the prompts to and responses by that user are again identified by reference characters 138 and 140.

§2.2b The governor file

The governor file is used primarily for two things. It can orchestrate the batch processing of specsheets. And it can pass design information from a customized external design program to direct the execution of a specsheet. The governor file thus provides an analysis program access to graphical representation.

I. How it works with respect to modular parametric design

The governor file (with .GOV file extension) contains one or more governing segments separated by a blank line. Each governing segment consists of a command line followed by zero or one or more lines of replacement parameters. The command line contains the name of a specsheet, a semicolon, and the name of the output drawing generated by the design module in which the specsheet is incorporated 209, Eq. [2.2-4]. If there are no replacement parameters in a governing segment, the specsheet executes all its usual prompts and formulas and creates the output drawing named in the command line. If the governing segment includes replacement parameters, these parameters override the normal contents of the specified cells, leaving the other cells unaffected.

A replacement parameter 211 (defined by each line beneath the command line) has three fields separated by semicolons; these correspond to the Variable, Measurement, and Text columns 64, 106, and 108 of the specsheet. Cells in the master region 58 (FIG. 25) of the specsheet can also be replaced. For numerical master cells (suffixed with #), the value is placed in the second field 213. For text master cells (suffixed with $), the value is placed in the third field 215. If no value is to be replaced in the measurement cell, a semicolon is placed there, 211.

II. Example

Figure 44:
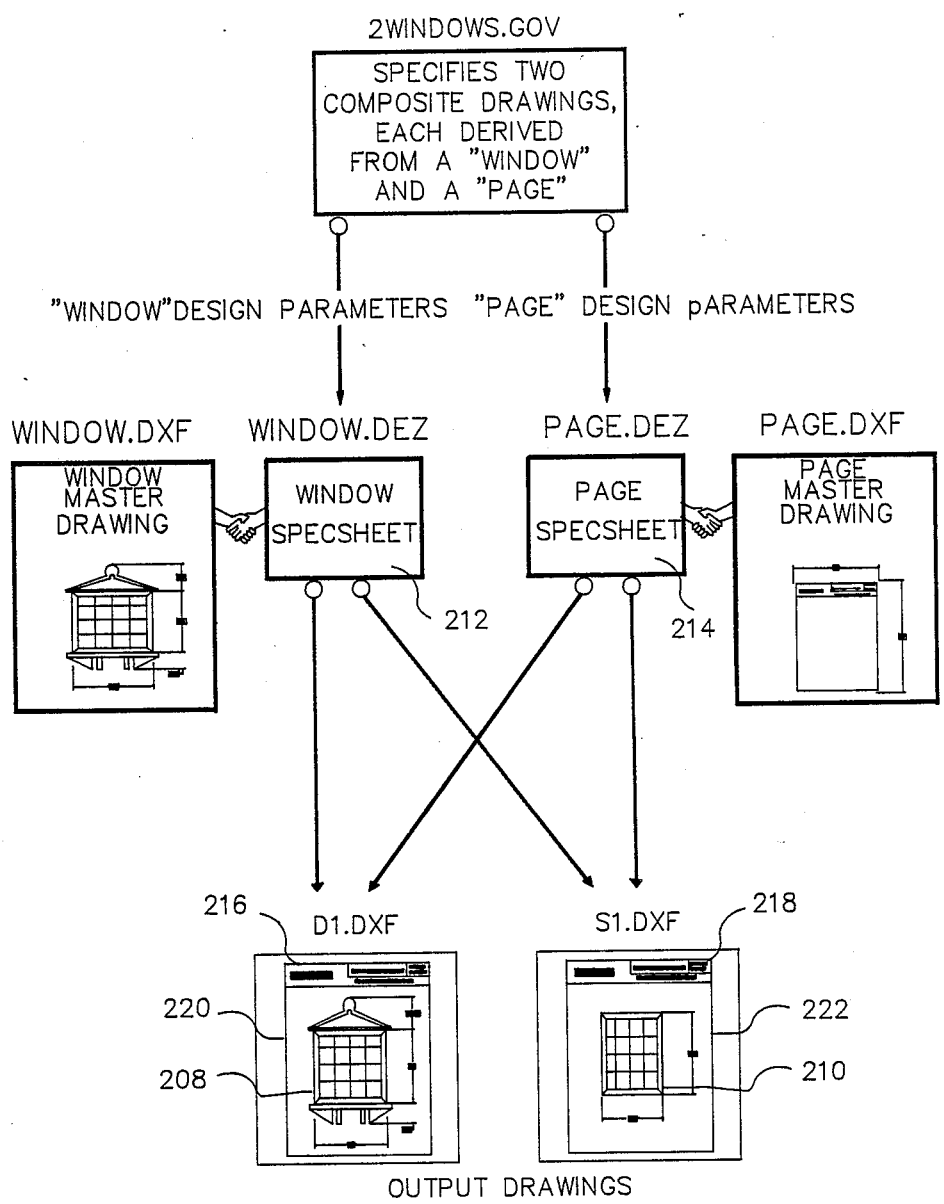
FIG. 44 is a schematic diagram, showing how a governor file can be employed to generate parametric designs in accord with the principles of the present invention.

An example of how a governor file works is given by the file 2WINDOWS.GOV (see FIG. 44). That file produces two drawings of windows 208 or 210 where each drawing is a composite image formed by two specsheets 212 and 214. One, the PAGE specsheet 214, generates the header block 216 or 218 for the output sheet 220 or 222; and the other, the WINDOW specsheet 212, designs the actual window 208 or 210. There are four governing segments to this governing file:

```
209——>window;Front_Window          [2.2-4]
       STYLE_NUMBER;;2
       W1;;45"
       H2;;45"                        } 208
       XINSERT;4.0000;
       YINSERT;5.0000;

PAGE;Front_Window
211——>ITEM1;;Saxton & Assoc.
       ITEM2;;Front_Window
       ITEM3;;15
       SCALE;;15;

window;Side_Window
       STYLE_NUMBER;;4
217——>W1;;30"
       H2;;60"                        } 210
       XINSERT;3.0000;
       YINSERT;4.000;
       SCALE;13;
                                 ——213 page:Side_Window
       ITEM1;;Saxton & Assoc.<——215
       ITEM2;;Side_Window
       ITEM3;;13
       SCALE;;15;
```

FIG. 44 depicts the design process directed by the 2WINDOWS.GOV file. In particular, referring to the edited window specsheet 54b in FIG. 35, note that certain values have been supplanted by the governor file and that others remain unaffected. For example, W1∓" of the Window specsheet 54b for the side window design will be replaced with the value 30" 217 from [2.2-4]. In both the front and side window designs, the ROTATE# value remains the same.

§3. How SYNTHESIS designs

SYNTHESIS has approximately 50,000 lines of code. The algorithms it uses to handle parametric design are shown in FIGS. 45–55. Blocks in the diagram represent blocks of code used to accomplish a specific task.

A user/designer 136/137 (FIG. 45) is presented with a tablet overlay 224 with which to establish a parametric design 226, execute a stand-alone design 68, execute a multiple-specsheet design 230, or exit the routine as shown by reference character 232. (Arrows starting with a circle represent the passing of information or commands while arrows without circles represent the transfer of control). In establishing a parametric design, the designer can draw with the drawing processor 234 to establish the master drawing 22, set up the specsheet 236, or edit the specsheet 238.

Figure 46:
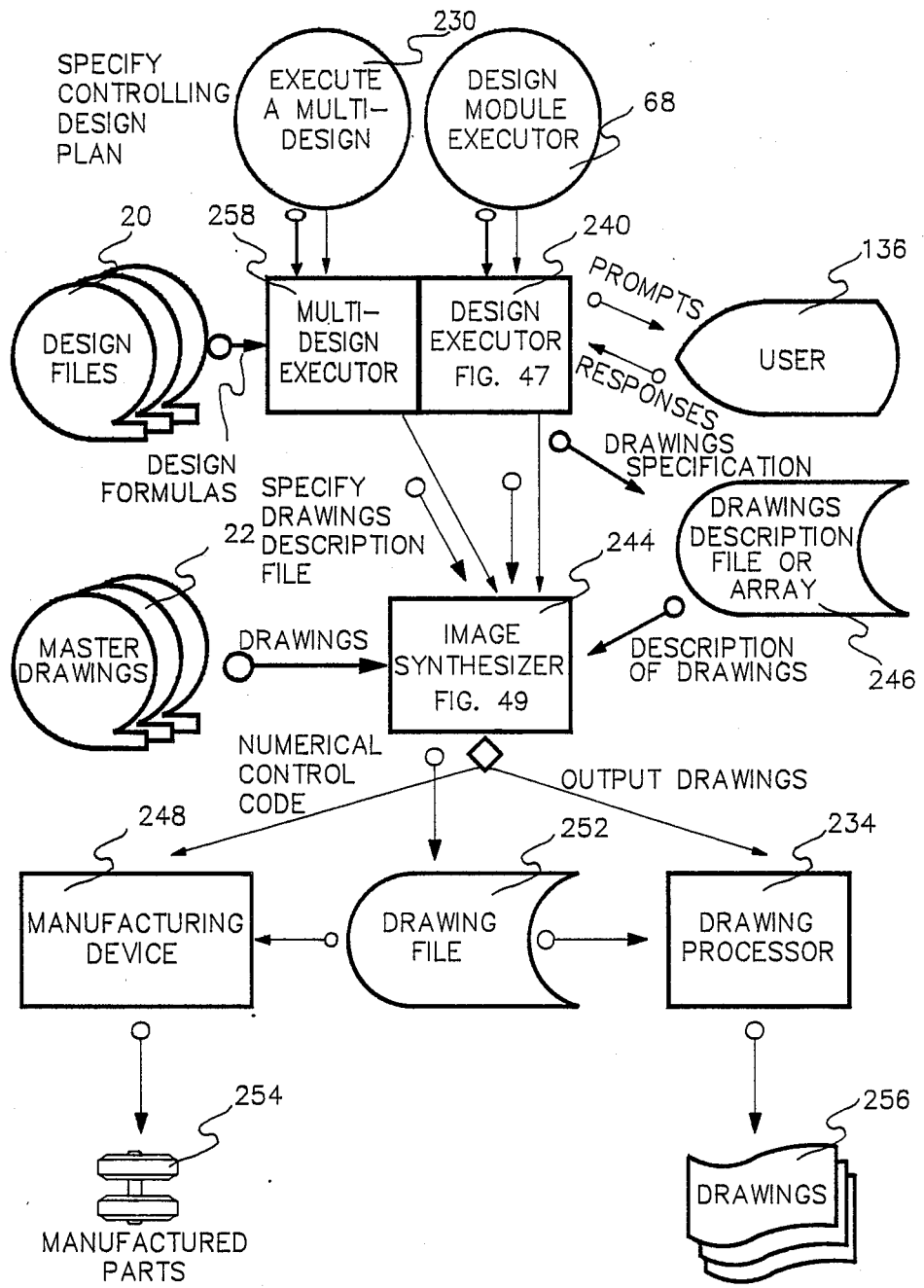
FIG. 46 is a block diagram showing the operations involved in executing a parametric design and synthesizing the image created by executing that design.

FIG. 46 is an overview showing how SYNTHESIS establishes and executes a parametric design. A design module executor 68 specifies which controlling specsheet is to be used by the design executor 240. The design executor 240 receives information from specific design files 20 (such as the Window or Door design file) and information from the user 136. The design executor 240 then passes: (a) information to both the image synthesizer 244 and the drawings description file or array 246 (also known as the .SPC file, and (b) control to the image synthesizer 244. The image synthesizer 244 collects information from the master drawings 22 and the drawings description file 246. Control is then passed either to a manufacturing device 248 or a drawing processor 234 while values are passed to a drawing file 252 from which information is gleaned:

by a manufacturing device 248 to manufacture parts 254, or by a drawing processor 234 to output drawings 256.

Figure 47:
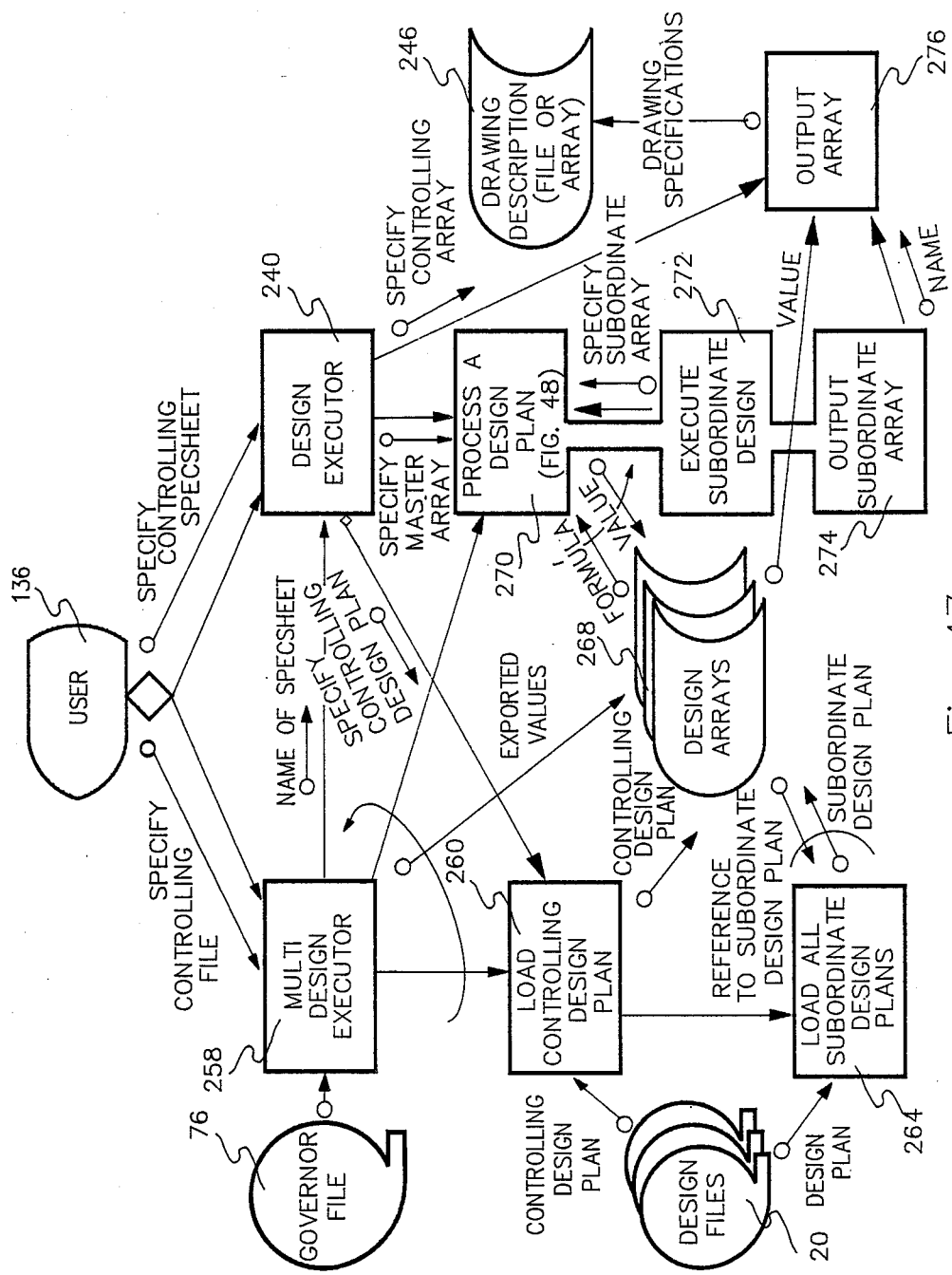
FIG. 47 is a block diagram showing the operations involved in executing a parametric design in greater detail than those operations shown in FIG. 45; it shows the execution of a design plan.

FIG. 47 is a block diagram explaining the function of the design executor 240 in more detail. The user chooses to either execute single stand-alone designs 240 or multiple-specsheet designs 258. The multi-design executor 258 is passed information from the specified governor file 76. It then proceeds according to its instructions and loads the controlling specsheet 260 and all subordinate specsheets 264. Information is passed to and from the design files 266 and the design arrays 268 for each controlling specsheet. This is done repetitively (shown by the curved arrow) for each subordinate module according to how many specsheets are specified. And the design executor 240 is called and passed the name of the controlling specsheet.

For each subordinate module, control is passed back from the multi-design executor 258 to the design executor 240 which then processes the design by:

loading the specsheets 260
loading the subordinate specsheets 264
processing the specsheet 270
executing the subordinate design 272
outputting the subordinate array 274

Control can be passed to the array outputter 276 directly from the design executor 240 or by the sjubordinate array outputter 274. Information is passed from:

the design executor 240 specifying the controlling array
the design array 268 specifying the formulas and values
the output subordinate array 274 specifying the name to the array outputter 276. Drawing specifications are then passed to a drawing description file or array 246.

Figure 48:
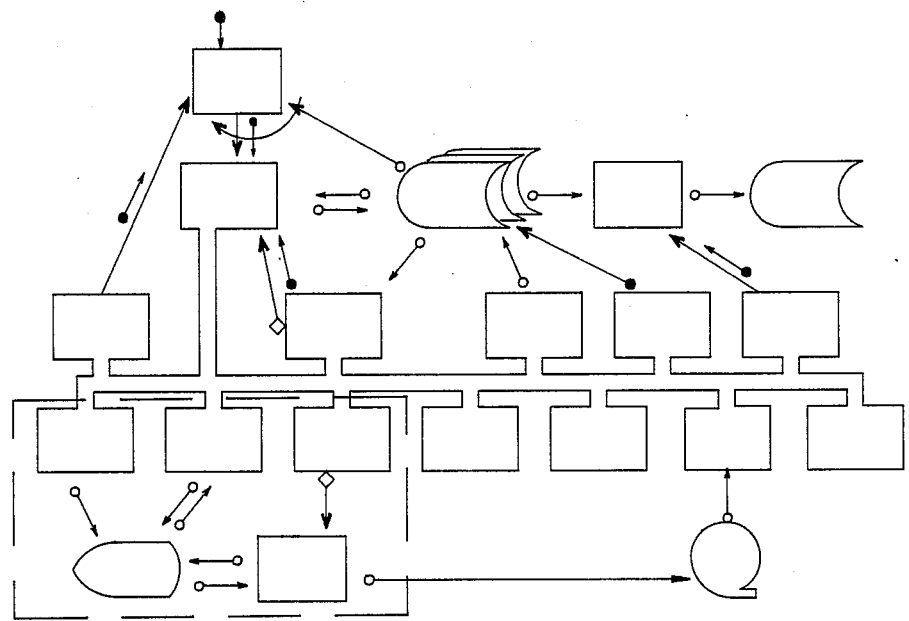
FIG. 48 is a block diagram which shows the configuration of capabilities possessed by our novel process and employed in processing a design plan.

FIG. 48 depicts the processing of a specsheet or design plan 270. The processing is done by the cell evaluator 278, and it involves:

obtaining a value from another cell 280
exporting a value to another cell 282
removing protection from the subordinate array for recalculation 284
outputting a subordinate array 286
determining the order of operation 288
accessing external files 290
performing text and math manipulation 292
deciding which portion of a formula to execute 294
executing the design program and/or reading the output 296
prompting the designer for input 300
displaying procedural information 302
executing a subordinate array 304.

Obtaining a value from another cell 280 occurs recrusively. That is, in obtaining the value of a cell which is referenced in the current cell, and if that cell is uncomputed, then the process invokes itself (i.e., the cell evaluator 278 is called). Control can be passed from the subordinate array outputter 286 to the output array 276 which receives values from the design arrays 268 and passes values to the drawing description file 246.

The interface 306 with the user 136 is composed of the procedural display information 302, user prompt for input 300, execute design program and/or rread output 296, user's design program 308.

From step 296, an external user's computer program 308 can be executed. The external program prompts for responses from the user 136 and passes information to a database or textfile 126 from which in turn it can be read by the external file accessor 290.

Figure 49:
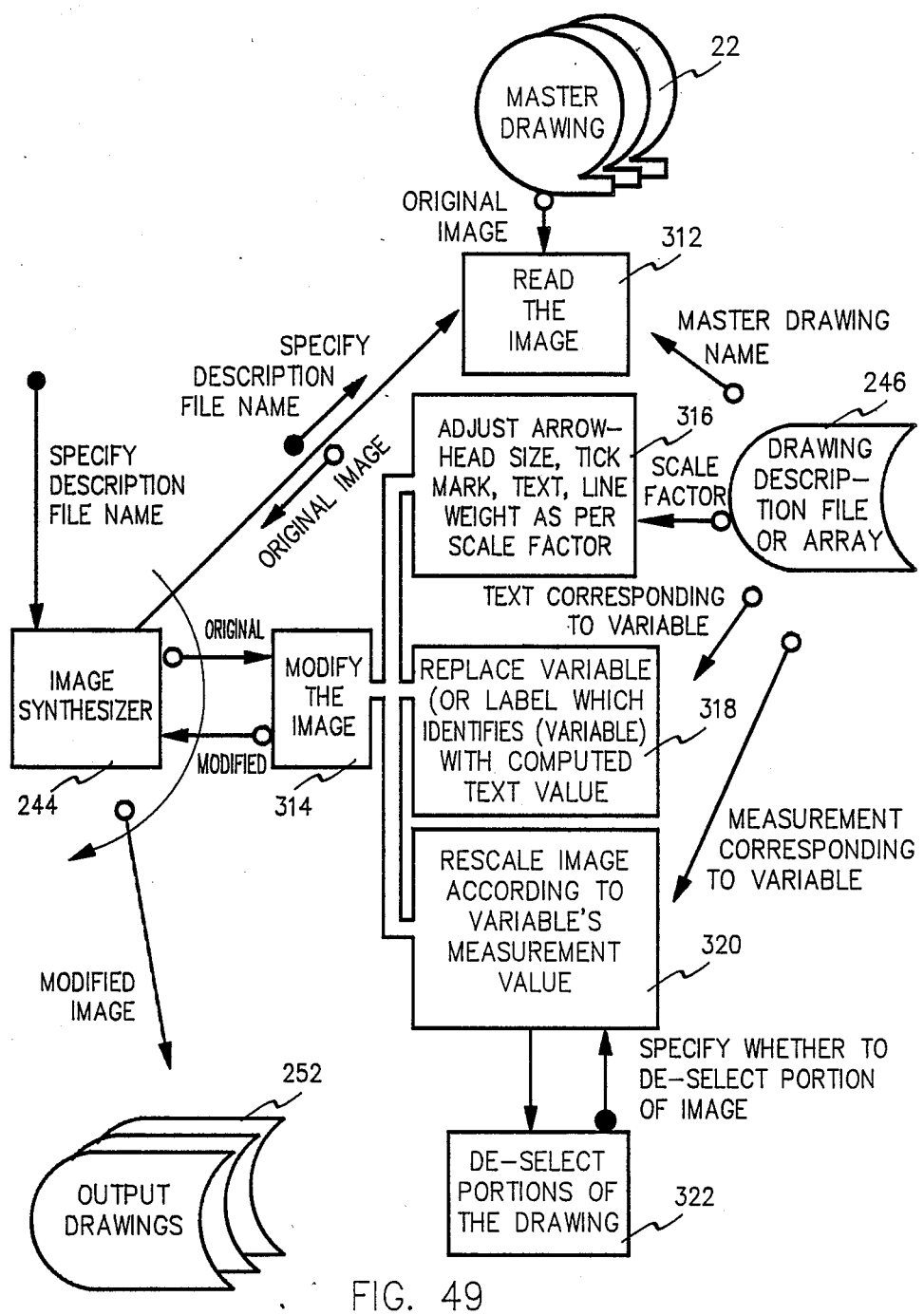
FIG. 49 is a block diagram showing the operations involved in synthesizing an image involving design specifications and a master drawing.

FIG. 49 shows the operations involved in synthesizing an image. The image synthesizer 244 reads an image 312 passed to it by the master drawing 22. Next, control is passed to block 314 to modify or rectify the image; capabilities of block 244 include:

adjusting the arrowhead size, tick mark size, the length of each dimension's extension line, text, and line weight, all according to the scale factor 316
replacing the variable (or the label which identifies the variable) with a computed text value 318
rescaling the image according to the variable's measurement value 320, [portions of the drawing can be deselected (parametrically deleted) as indicated by block 322]

Values passed include:

File description name to the image synthesizer 244
File description name from the image synthesizer 244 to the image reader 312
Original image from the image reader 312 to the image synthesizer 244
Original image from the master drawing 22 to the image reader 312
Master drawing name from the drawing description file 246 to the image reader 312
Scale factor from the drawing description file 246 to an image adjuster 316
Text corresponding to variable from the drawing description file 246 to the replacer 318
Measurement corresponding to value from the drawing description file 246 to the rescaler 320
Specification of whether to deselect portion of image from the deselector 322 to the rescaler 320
Modified image from the image synthesizer 244 to the output drawing 324 -

Figure 50:
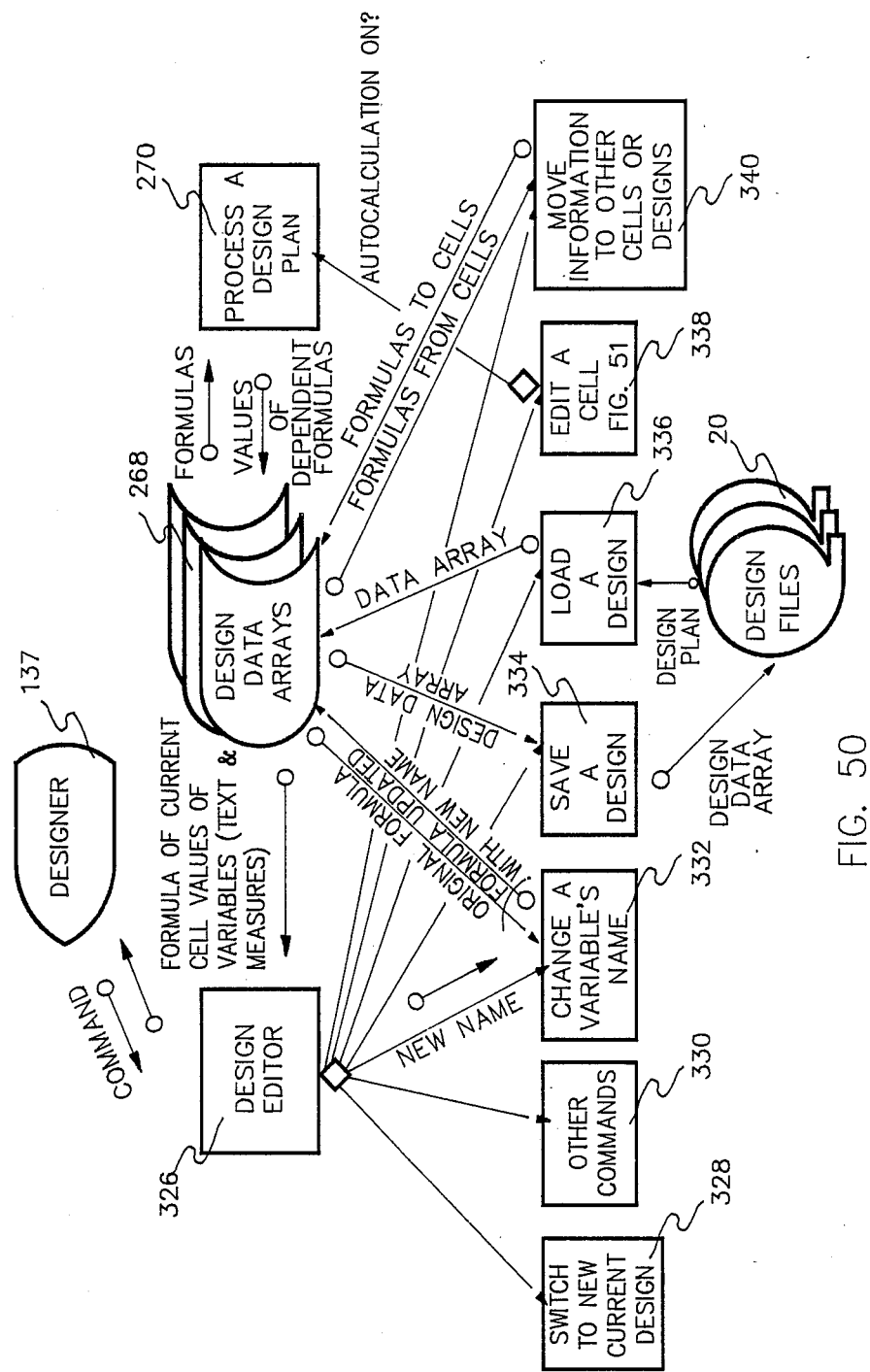
FIG. 50 is a block diagram showing the process of editing a design plan.
Figure 51:
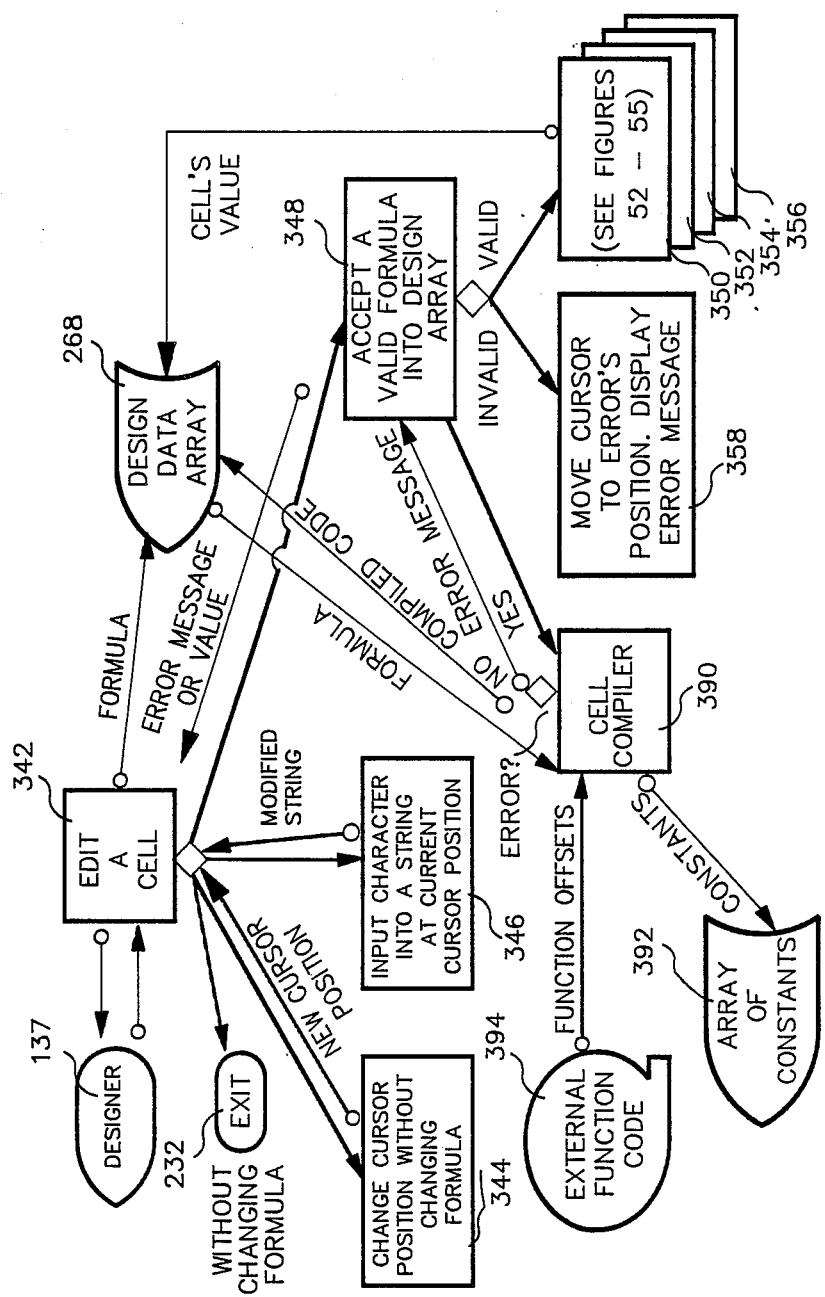
FIG. 51 is a block diagram detailing the process of editing a cell in a design plan.

FIG. 50 details the process involved in editing a specsheet (design plan). From the design editor 326, control can be passed to:

switch to a new design 328
other commands 330
change a variable's name 332
save a design 334
load a design 336
edit a cell 338
move information to other cells or designs 340

(This is representative of the capabilities; others will be apparent to those readers to whom this specification is addressed from Appendix F, the SYNTHESIS manual, and the aforementioned discussions of SYNTHESIS's capabilities.)

Values passed are:

new name between the design editor 326 and the variable name changer 332
original formula between the design data arrays 268 and the variable name changer 332
formula updated with new name between the variable name changer 332 and the design data arrays 268 design data array from 268 to the design saver 334 data array from the design loader 336 to the design data arrays 268 formulas from cells from the design data arrays 268 to the information mover 340 formulas to cells from the information mover 340 to the design data arrays 268 formulas from the design data arrays 268 to the design plan processor 270 values of the dependent formulas from the design plan processor 270 to the design data arrays 268 design data array from the design saver 334 to the design files 242 design plan from the design files 242 to the design loader 336 command from the designer 137 to the design editor 326 formula of current cell and values of variables (Text and Measurement) from the design editor 326 to the designer 137 formula of current cell and values of variables (Text and Measurement) from the design data arrays 268 to the design editor 326.

FIGS. 51–55 show how a cell is edited with SYN-THESIS's CAD-spreadsheet. Editing a cell is done from the formula line represented by 342, FIG. 51. The designer 137 is prompted and returns information to establish a formula that is stored in the design data array 268. While editing the cell, the designer can:

exit as indicated by reference mark 232 change the cursor position without changing the formula (the arrow keys on the keyboard) 344 input a character into a string at the current cursor position 346 terminate editing a cell whereupon the present invention accepts a valid formula into the design array shown by block 348

The formula is either deemed valid or invalid by a formula acceptor 348. If it is invalid, an error message is displayed as indicated by 358. If it is a valid formula, it is saved in the Measurement cell as a numerical value and the design is to be updated 350 (FIG. 51) and passed to the design data array 268. The formula acceptor 348 also passes control to the cell compiler 390. If the cell can be compiled, its compiled value is returned to the design data array 268, from which it received the formula to compile. If not, an error message is passed to the formula acceptor 348 and thence to the cell editor 342.

The cell compiler 390 passes constants to the array of constants 392 and receives from the external function code 394 the function offsets.

Figure 52:
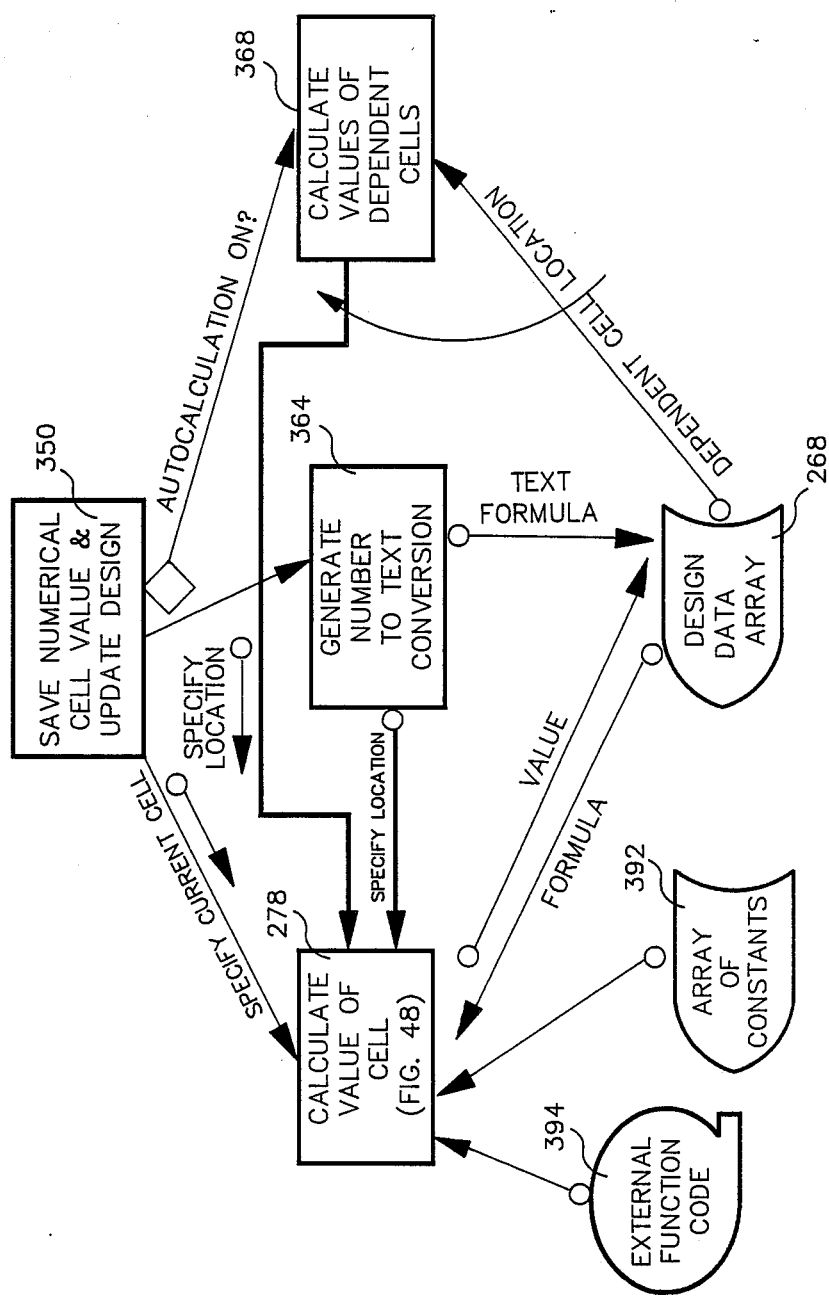
FIG. 52 is a block diagram detailing the editing of a number cell and is an expansion of the diagram in FIG. 51.

FIG. 52 shows what happens in the numerical value saver 350, which calculates and saves the measurement cell value and generates the number-to-text conversion for the design. The current cell is specified and the value of the cell is calculated as discussed above in conjuction with FIG. 48 and shown by block 278 in FIG. 52. If the corresponding cell for the same variable has not yet been edited, then a default formula is automatically placed in its cell, depending upon how the specsheet is configured. Other cells that reference its computed value for evaluating their formulas are calculated. Calculation is automatic when AutoCALC is toggled on. Otherwise, the dependent cell is not re-evaluated. If the AutoCALC is on, then the locations of the dependent cells are determined and then passed to the cell evaluator 278. This is repeated. Formulas and values are passed between cell evaluator 278 and design data arrays 268.

The external function code 394 and array of constants 392 pass data to the cell evaluator 278 for the calculation of the cell contents.

Figure 53:
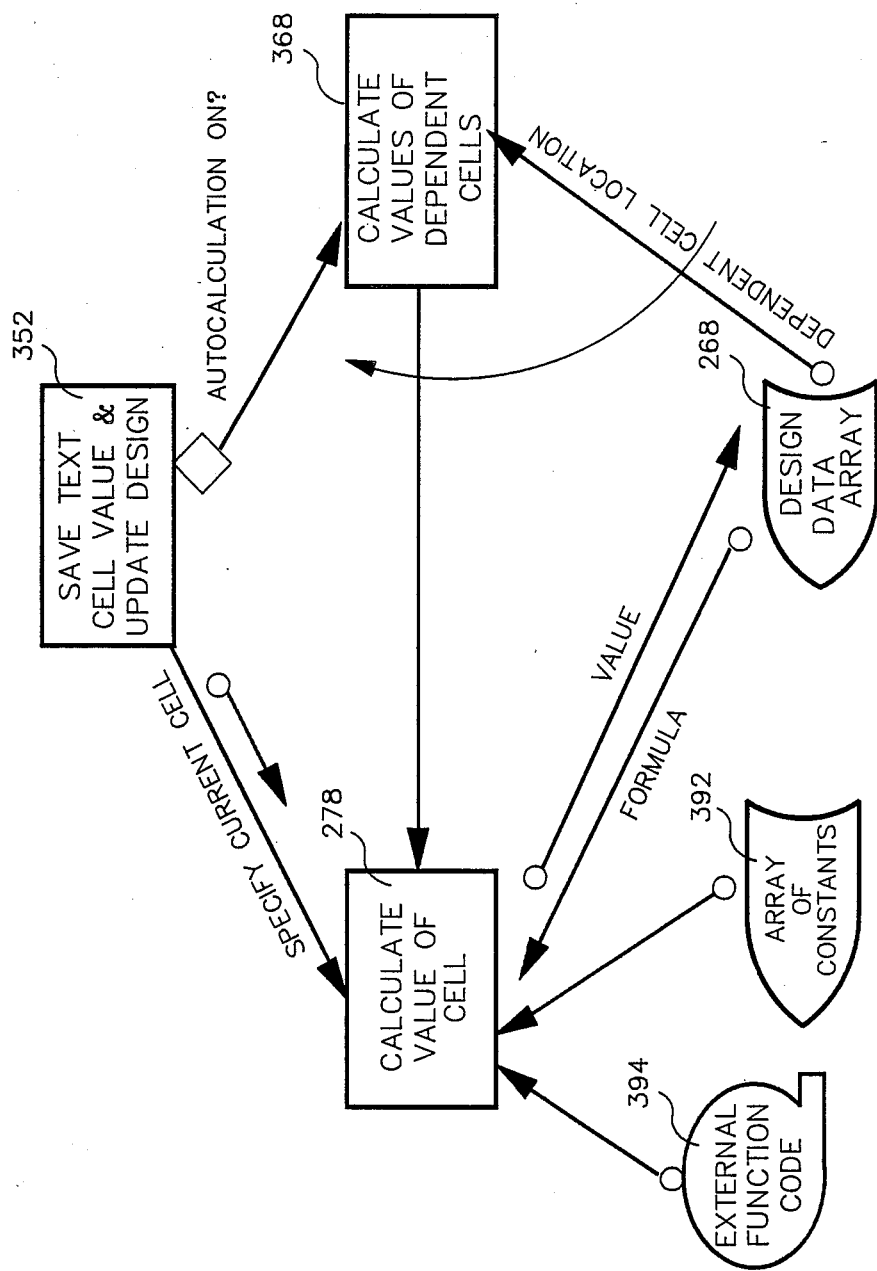
FIG. 53 is a block diagram detailing the editing of a text cell and is an expansion of the diagram in FIG. 51.

FIG. 53 shows the case where the text cell values are saved and the design is updated 352.

Figure 54:
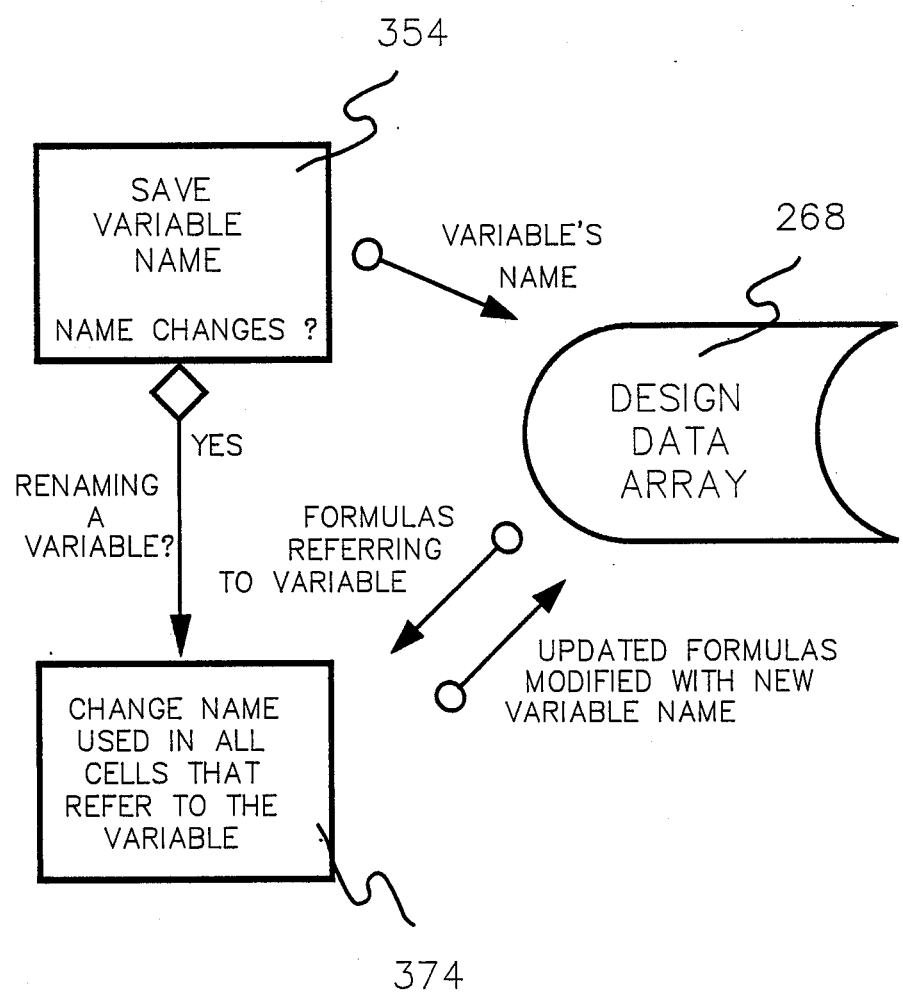
FIG. 54 is a block diagram detailing the editing of a name cell and is an expansion of the editing process illustrated in FIG. 51.

FIG. 54 depicts the handling of the variable name. The condition 354 for changing the variable name leads either to the design data array 268 if no change is needed or to 374 if a change is needed (i.e., the variable was not used in any cell formula where the text of the formula would need to be substituted). From block 374, the new name is passed to the design data arrays 268, updating the old variable name in formulas in which they are found.

Figure 55:
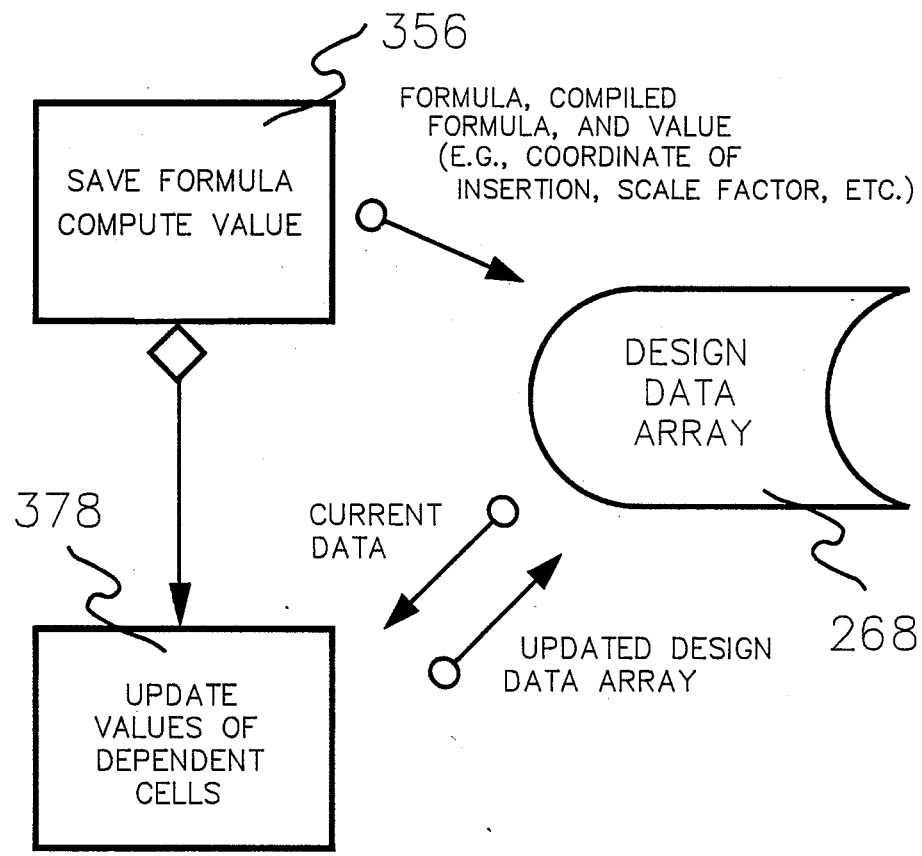
FIG. 55 is a block diagram detailing the editing of the cell which specifies either the master drawing's name, its coordinates of insertion, the scale factor to which its image is to be adjusted, or the angle to which it is to be rotated upon insertion; this figure depicts an expansion of the editing process illustrated in FIG. 51.

In FIG. 55, the formula has been saved and a value is computed in the formula saver 356. This formula and value is passed to the design data array 268. Also, the formula saver 356 makes sure that values are updated in the dependent cell updater 378. The heretofore current data is passed from the design data arrays 268 to the dependent cell updater 378 and is updated therein and passed back to the design data array 268.

In summary, FIGS. 51–55 depict the editing of a specsheet cell. They show: the processes involved in inputting formulas into the Formula line, how those formulas are calculated, and what happens to the values of those formlas in the editing session.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

APPENDIX F

Drawing a quadrilateral with a macro

The menu commands, concatenated with +'s into one long line, are:

```
(prin1 "This LISP program draws a quadrilateral.");+
(progn (setq start-point (getpoint "Start point of quadrilateral and first line:"));+
(terpri);+
(setq leftheight (getdist "Left height of quadrilateral: "));+
(setq width (getdist "Width of quadrilateral: "));+
(setq rightheight (getdist "Right height of quadrilateral: "));+
(command "SCRIPT" "quad"));
```

The script file that instructs AutoCAD how to draw the quadrilateral is listed below:

```
;                    QUAD.SCR (defun dtr (a) (* pi (/ a 180.0)))
(setq rightbottom-point (polar start-point 0 width) a t)
(setq lefttop-point (polar start-point (dtr 90) leftheight) a t)
(setq righttop-point (polar rightbottom-point (dtr 90) rightheight) a t)
(command "pline" lefttop-point start-point rightbottom-point righttop-point "close")
(setq xr (+ width 1 (car start-point)) a t)
(setq yr (+ (/ rightheight 2) (cadr start-point))a t)
(setq text-position (list xr yr)a t)
(command "dim" "ver" rightbottom-point righttop-point text-position "")
(setq xb (+ (car start-point) (/ width 2)) a t)
(setq yb (- (cadr start-point) 1) a t)
(setq text-position (list xb yb) a t)
(command "hor" start-point rightbottom-point text-position "")
(setq xl (- (car start-point) 1) a t)
(setq yl (+ (cadr start-point) (/ leftheight 2)) a t)
(setq text-position (list xl yl) a t)
(command "ver" start-point lefttop-point text-position "")
(setq minheight (min leftheight rightheight) a t)
(setq heightdiff1 (- leftheight rightheight) a t)
(setq heightdiff (abs heightdiff1) a t)
(setq xt (+ (/ width 2) (car start-point)) a t)
(setq yt (+ (+ minheight (/ heightdiff 2)) (cadr start-point) 1) a t)
(setq text-position (list xt yt) a t)
(command "aligned" lefttop-point righttop-point text-position "")
(command "exit")
(prin1 "The area of the quadrilateral is: ")
(setq area (* 0.5 (* width (+ leftheight rightheight))) a t)
(setq ax (+ (/ width 2) (car start-point)) a t)
(setq ay (- (cadr start-point) 3) a t)
(setq text-position (list ax ay) a t)
(command "text" "middle" text-position "" "" (strcat "Area of quadrilateral = " (rtos area 2 4)))
```

RUN IT!

Access the Macro Run command with the digitizer. The prompts and user-supplied information (underlined) will appear as below:

Start point of quadrilateral and first line: 5,5

Left height of quadrilateral: 7

Width of quadrilateral: 10

Right height of quadrilateral: 12

The completed drawing is the same as Figure E1.

Appendix G

Drawing a quadrilateral with a spreadsheet-format database

In the case of our quadrilateral the first four parameters--start point, left height, width, and right height--would be contained in cells A1, A2, A3, and A4, respectively (Figure G1). Each point is defined by the three cartesian coordinates, (x, y, z). Each length such as left height, width, and right height is given as the magnitude of a vector. Subsequent points defined from these lengths are derived from the addition of ordered pairs with the directions given by the placement of the lengths of the vectors in the x, y, or z-coordinate position. For example, cell A5 defines the left top point of the quadrilateral. Its value (5, 10, 0) comes from the addition of the contents of cell A1= 5,5,0 with (0,A2,0), where A2=5 is the left height oriented in the y-direction.

After each point of the quadrilateral is defined, the line command is used to sequentially draw the lines from the left topmost point counterclockwise to the right topmost point. Then the quadrilateral is closed.

The definition of each cell is:

A1 = start point
A2 = left height
A3 = width
A4 = right height
A5 = left top point
A6 = right bottom point
A7 = right top point
B1 = line command
B2 = from left top point
B3 = to start point
B4 = line command
B5 = from start point
B6 = to right bottom point
B7 = line command
C1 = from right bottom point
C2 = to right top point
C3 = close the quadrilateral

|   | A | B | C | D | E | F | G |
|---|---|---|---|---|---|---|---|
| 1 | 5,5,0 | line | A6 | | | | |
| 2 | 5 | A5 | A7 | | | | |
| 3 | 10 | A6 | close | | | | |
| 4 | 9 | line | | | | | |
| 5 | A1 +(0,A2,0) | A1 | | | | | |
| 6 | A1 +(A3,0,0) | A6 | | | | | |
| 7 | A1 +(0,A2,0) | line | | | | | |

Figure G1

What is claimed is:

1. A system for generating a parametric design of an item which is a composite of design elements, said system comprising:
   a. a subordinate design module for each of said design elements, each of said design modules comprising: a master drawing which is modifiable to produce an image of a corresponding design element of said item and a design plan;
   b. means for inputting user-originated information to the design plans;
   c. means for thereafter employing each said design plan to modify the associated master drawing as specified by said design plan and produce an image of a design element as aforesaid; and
   d. means for causing one of said subordinate design modules to output the element-representing image generated in said module to different positions in the parametric design.

2. A system for generating a parametric design of an item which is a composite of design elements, said system comprising:
   a. a subordinate design module for each of said design elements, each of said design modules comprising: a master drawing which is modifiable to produce an image of a corresponding design element of said item and a design plan with multiple cells;
   b. means for inputting user-originated information to the design plans;
   c. means for thereafter employing each said design plan to modify the associated master drawing as specified by said design plan and produce an image of a design element as aforesaid;
   d. means for exporting values from the design plan in one of said modules to the design plan in another of said modules;
   e. means for subsequently reinstating in a cell of a design plan to which a value has been exported the original contents of that cell;
   f. means for effecting one of the following:
      (i) causing said other design plan to compute a value in accord with a formula located in a cell of that design plan,
      (ii) causing another of said design modules to output an image to said parametric design; and g. means for causing plural ones of the foregoing means to be sequentially activated in response to a single composite command to said design plan.

3. A system for generating a parametric design as defined in claim 2 which has means for effecting the insertion of an image generated from the master drawing of a design module from which values are outputted in the master drawing of another of the design modules.

4. A system for generating a parametric design as defined in claim 3 wherein said one design plan has means for controlling the coordinates at which said image is inserted and the rotation of said image, all relative to positions and an angle of rotation specified by said one design plan.

5. A system for generating a parametric design as defined in claim 3 wherein said one design plan has means for controlling the absolute coordinates of the position at which said image is inserted into said master drawing, the absolute angle of rotation at which said image is inserted into said master drawing, and the scale of said image.

6. A system for generating a parametric design of an item which is a composite of design elements, said system comprising:
   a. a subordinate design module for each of said design elements, each of said design modules comprising: a master drawing which is modifiable to produce an image of a corresponding design element of said item and a design plan with multiple cells;
   b. means for inputting user-originated information to the design plans;
   c. means for thereafter employing each said design plan to modify the associated master drawing as specified by said design plan and produce an image of a design element as aforesaid;
   d. means for exporting values from the design plan in one of said modules to the design plan in another of said modules;
   e. means for subsequently reinstating in a cell of a design plan to which a value has been exported the original contents of that cell;
   f. means for effecting one of the following functions:
      (i) causing said other design plan to execute a supervisory command,
      (ii) causing another of said design modules to output an image to said parametric design,
      (ii) causing another of said design modules to output an image to said parametric design; and
   g. means for causing plural ones of the foregoing means to be sequentially activated in response to a single composite command to said design plan.

7. A system for generating a parametric design as defined in claim 6 which has means for effecting the insertion of an image generated from the master drawing of a design module from which values are outputted in the master drawing of another of the design modules.

8. A system for generating a parametric design as defined in claim 7 wherein said one design plan has means operative in the course of outputting values to the design plan in another of said modules to effect the insertion of an image generated from the master drawing of that module in the master drawing of another of the design modules.

9. A system for generating a parametric design as defined in claim 7 wherein said one design plan has means for controlling the coordinates at which said image is inserted and the rotation of said image, all relative to positions and an angle of rotation specified by said one design plan.

10. A system for generating a parametric design of an item which is a composite of design elements, said system comprising:
    a. a subordinate design module for each of said design elements, each of said design modules comprising: a master drawing which is modifiable to produce an image of a corresponding design element of said item and a design plan with multiple cells;
    b. means for inputting user-originated information to the design plans;
    c. means for thereafter employing each said design plan to modify the associated master drawing as specified by said design plan and produce an image of a design element as aforesaid; and
    d. means operable, upon command, to:
       (i) cause an image generated by another of the design elements to be inserted in said parametric design, and
       (ii) control the coordinates at which said image, all relative to positions and an angle of rotation specified by said design plan, is inserted in said parametric design.

11. A system for generating a parametric design of an item which is a composite of design elements, said system comprising:
    a. a subordinate design module for each of said design elements, each of said design modules comprising: a master drawing which is modifiable to produce an image of a corresponding design element of said item and a design plan with multiple cells;
    b. means for inputting user-originated information to the design plans;
    c. means for thereafter employing each said design plan to modify the associated master drawing as specified by said design plan and produce an image of a design element as aforesaid; and
    d. means operable, upon command, to:
       (i) cause an image generated by another of the design elements to be inserted in said parametric design, and
       (ii) designate the absolute coordinates at which said image is inserted in said parametric design and the absolute angle of rotation at which said image is inserted in said parametric design.

12. A system for generating a parametric design of an item, said system including:
    a. a design module with a master drawing which is modifiable to produce said parametric design and a design plan;
    b. means for inputting user-originated information to said design plan;
    c. means for thereafter employing said design plan to modify the master drawing as specified by the design plan and produce an image representing said parametric design; and
    d. means which can be accessed by a user to obtain design information that can be inputted to said design plan to effect a modification of said master drawing an aforesaid.

13. A system for generating a parametric design as defined in claim 12 wherein said user-accessible means provide graphics that can be employed by the user to obtain further design information for modifying said master plan.

14. A system for generating a parametric design as defined in claim 12 wherein said user-accessible means provides text that can be employed by the user to obtain further design information for modifying said master plan.

15. A system for generating a parametric design as defined in claim 12 wherein said user-accessible means provides at least one menu that can be employed by the user to obtain further design information for modifying said master plan.

16. A system for generating a parametric design of an item, said system including:
   a. a design module with a master drawing which is modifiable to produce said parametric design and a design plan;
   b. means for inputting user-originated information to said design plan;
   c. means for thereafter employing said design plan to modify the master drawing as specified by the design plan and produce an image representing said parametric design; and
   d. means for causing said design module to repetitively output the image generated by the modification of said master drawing and form an array of said images in which each of said images is placed at a different location to thereby produce said parametric design.

17. A system for generating a parametric design of an item, said system including:
   a. a design module comprising a master drawing which is modifiable to produce said parametric design and a design plan with mutliple cells;
   b. means for inputting user-originated information to said design plan;
   c. means for thereafter employing said design plan to modify the master drawing as specified by the design plan and produce an image representing said parametric design;
   d. means for electronically storing data defining said image.
   e. memory means in which instructions for inputting data to said design plan, instructions for executing an algorithms in the cells of said design plan, instructions for modifying said master drawing as specified by said design plan, and instructions for storing data defining that image representing the parametric design can be stored; and
   f. a compiler for translating data stored in said memorymeans into machine language.

18. A system for generating a parametric design of an item, said system including:
   a. a design module with a master plan which is modifiable to produce said parametric design and a design plan having a selected number of cells in which parameters of specified character can be placed;
   b. means for editing said design plan to embed a variable, formula, function, or command in one of said cells;
   c. means for executing said parametric design by providing information specific to the item being designed to said design plan; and
   d. means which so isolates a user from said design plan as to keep the user from editing the design plan while said plan is being executed.

19. A system for generating a parametric design of an item, said system including:
   a. means for writing source code that defines a function;
   b. a design module comprising;
      (i) a master drawing which is modifiable to provide said parametric design, and
      (ii) a design plan composed of cells, at least one of which displays a text value which is defined by a statement that refers to said function;
   c. means utilizing said function to compute the value for said cell; and
   d. means for so modifying said master drawing according to information from said design plan so as to produce said parametric design.

20. A system for generating a parametric design of an item, said system including:
   a. means for writing source code that defines a function;
   b. means for compiling said function into virtual machine code;
   c. a design module comprising:
      (i) a master drawing which is modifiable to provide said parametric design, and
      (ii) a design plan composed of cells, at least one of which displays a text value which is defined by a statement that refers to said function;
   d. means for utilizing said function to compute the value for said cell; and
   e. means for so modifying said master drawing according to information from said design plan so as to produce said parametric design.

21. A system for generating a parametric design of an item, said system including:
   a. means for writing source code that defines a function;
   b. a design module comprising:
      (i) a master drawing which is modifiable to provide said parametric design, and
      (ii) a design plan composed of cells, at least one of which displays a numeric value which is defined by a statement that refers to said function;
   c. means for utilizing said function to compute the value for said cell; and
   d. means for so modifying said master drawing according to information from said design plan so as to produce said parametric design.

22. A system for generating a parametric design of an item, said system including:
   a. means for writing source code that defines a function;
   b. means for compiling said function into virtual machine code;
   c. a design module comprising:
      (i) a master drawing which is modifiable to provide said parametric design, and
      (ii) a design plan composed of cells, at least one of which displays a numeric value which is defined by a statement that refers to said function;
   d. means for utilizing said function to compute the value for said cell; and
   e. means for so modifying said master drawing according to information from said design plan so as to produce said parametric design.

* * * * *